(12) United States Patent
Park et al.

(10) Patent No.: US 12,513,992 B2
(45) Date of Patent: Dec. 30, 2025

(54) DISPLAY DEVICE

(71) Applicant: Samsung Display Co., LTD., Yongin-si (KR)

(72) Inventors: Heejean Park, Yongin-si (KR); Hyeongseok Kim, Yongin-si (KR); Sunhwa Lee, Yongin-si (KR); Mukyung Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/891,300

(22) Filed: Sep. 20, 2024

(65) Prior Publication Data

US 2025/0107238 A1    Mar. 27, 2025

(30) Foreign Application Priority Data

Sep. 27, 2023 (KR) .................. 10-2023-0131158

(51) Int. Cl.
*H10D 86/60* (2025.01)
*H01L 25/075* (2006.01)
*H01L 25/16* (2023.01)
*H10D 86/40* (2025.01)
*H10H 20/857* (2025.01)

(52) U.S. Cl.
CPC .......... *H10D 86/60* (2025.01); *H01L 25/0753* (2013.01); *H01L 25/167* (2013.01); *H10D 86/441* (2025.01); *H10H 20/857* (2025.01)

(58) Field of Classification Search
CPC ... H01L 25/0753; H01L 25/167; H10D 86/60; H10D 86/441; H10H 20/857
See application file for complete search history.

(56) References Cited

U.S. PATENT DOCUMENTS

| | | | |
|---|---|---|---|
| 2,106,689 A | 1/1938 | Braselton | |
| 7,659,872 B2 | 2/2010 | Yamashita et al. | |
| 9,490,308 B2 | 11/2016 | Jeong et al. | |
| 10,431,604 B2 * | 10/2019 | Cho ..................... | H10H 29/142 |

(Continued)

FOREIGN PATENT DOCUMENTS

| | | |
|---|---|---|
| CN | 112767868 A | 5/2021 |
| KR | 101264386 B1 | 5/2013 |

(Continued)

*Primary Examiner* — Vinh T Lam
(74) *Attorney, Agent, or Firm* — CANTOR COLBURN LLP

(57) ABSTRACT

A display device includes a substrate including an island portion, a first bridge portion extending from the island portion in a first direction, and a second bridge portion extending from the island portion in a second direction crossing the first direction, a first conductive layer disposed on the substrate and including a first voltage line extending from the island portion to the first bridge portion and the second bridge portion, a second conductive layer disposed on the first conductive layer and including signal lines extending from the island portion to the first bridge portion and a data line extending from the island portion to the second bridge portion, and a third conductive layer disposed on the second conductive layer and including a second voltage line and a third voltage line, which extend from the island portion to the first bridge portion and the second bridge portion, respectively.

22 Claims, 41 Drawing Sheets

(56) References Cited

U.S. PATENT DOCUMENTS

| | | | | |
|---|---|---|---|---|
| 10,522,431 B2* | 12/2019 | Kim | | H10D 86/60 |
| 10,622,385 B2* | 4/2020 | Chuang | | H10D 86/60 |
| 10,693,091 B2* | 6/2020 | Kim | | H10K 77/111 |
| 11,056,472 B2* | 7/2021 | Kim | | H10D 86/60 |
| 11,158,826 B2* | 10/2021 | Kim | | H10K 77/111 |
| 11,271,017 B2* | 3/2022 | Cho | | H10K 59/126 |
| 11,271,179 B2 | 3/2022 | Kim et al. | | |
| 11,341,921 B2* | 5/2022 | Shin | | G09G 3/3266 |
| 11,380,752 B2* | 7/2022 | Zhao | | H10K 59/131 |
| 11,664,284 B2* | 5/2023 | Kim | | H10D 86/481 |
| | | | | 257/48 |
| 11,683,976 B2* | 6/2023 | Kim | | H10D 86/451 |
| | | | | 257/400 |
| 11,715,423 B2* | 8/2023 | Hsu | | H01L 25/0753 |
| | | | | 345/30 |
| 11,737,320 B2* | 8/2023 | Park | | H10D 86/451 |
| | | | | 257/40 |
| 11,765,937 B2* | 9/2023 | Lim | | H10K 59/1213 |
| | | | | 257/40 |
| 11,776,971 B2* | 10/2023 | Sui | | H10D 86/60 |
| | | | | 257/79 |
| 11,830,883 B2* | 11/2023 | Son | | G02F 1/136286 |
| 11,832,493 B2 | 11/2023 | Yoon et al. | | |
| 11,935,993 B2* | 3/2024 | Eom | | H10D 86/443 |
| 11,961,951 B2* | 4/2024 | Lin | | H10H 20/814 |
| 11,985,867 B2* | 5/2024 | Cao | | H10K 59/131 |
| 11,989,481 B2* | 5/2024 | Lee | | H10K 77/111 |
| 12,020,995 B2* | 6/2024 | Kim | | H01L 22/34 |
| 12,089,456 B2* | 9/2024 | Hong | | H10K 59/352 |
| 12,100,691 B2* | 9/2024 | Herrmann | | H10H 20/856 |
| 12,106,689 B2 | 10/2024 | Ju | | |
| 12,114,548 B2* | 10/2024 | Kim | | H10K 77/111 |
| 12,125,870 B2* | 10/2024 | Jiang | | G09F 9/301 |
| 12,137,602 B2* | 11/2024 | Kim | | H10K 59/8731 |
| 12,191,425 B2* | 1/2025 | Yang | | H01L 25/0753 |
| 12,238,987 B2* | 2/2025 | Bang | | H10D 86/441 |
| 12,310,160 B2* | 5/2025 | Lee | | H10H 29/142 |
| 2019/0326329 A1* | 10/2019 | Fan | | H10H 20/812 |
| 2021/0005700 A1 | 1/2021 | Park et al. | | |
| 2021/0057398 A1* | 2/2021 | Chen | | H10H 20/854 |
| 2021/0134197 A1* | 5/2021 | Ju | | H10K 59/1213 |
| 2022/0093578 A1* | 3/2022 | Lin | | H01L 25/162 |
| 2022/0223761 A1* | 7/2022 | Park | | H01L 25/0753 |
| 2022/0328604 A1 | 10/2022 | Yang et al. | | |
| 2023/0014374 A1* | 1/2023 | Lee | | H01L 25/0753 |
| 2023/0019182 A1 | 1/2023 | Lee et al. | | |
| 2023/0038587 A1 | 2/2023 | Lou et al. | | |
| 2023/0070973 A1* | 3/2023 | Lin | | H10H 20/8506 |
| 2023/0091070 A1 | 3/2023 | Choi et al. | | |
| 2023/0110048 A1 | 4/2023 | Won et al. | | |
| 2023/0187451 A1* | 6/2023 | Ham | | H10H 20/857 |
| | | | | 257/72 |
| 2023/0232678 A1* | 7/2023 | Cho | | H10K 59/131 |
| 2023/0247879 A1* | 8/2023 | Cho | | H10K 59/1213 |
| | | | | 257/40 |
| 2023/0275114 A1* | 8/2023 | Jang | | H10D 86/60 |
| 2023/0282650 A1* | 9/2023 | Jang | | H10D 86/0231 |
| 2023/0307462 A1* | 9/2023 | Kwon | | H10D 86/441 |
| 2023/0317903 A1* | 10/2023 | Kwon | | H01L 25/0753 |
| | | | | 257/79 |
| 2023/0411576 A1* | 12/2023 | Song | | G09F 9/3026 |
| 2024/0047444 A1* | 2/2024 | Lee | | H10H 29/142 |
| 2025/0107300 A1* | 3/2025 | Kim | | H10D 86/60 |

FOREIGN PATENT DOCUMENTS

| | | |
|---|---|---|
| KR | 1020200009899 A | 1/2020 |
| KR | 1020200115772 A | 10/2020 |
| KR | 1020210005452 A | 1/2021 |
| KR | 102224743 B1 | 3/2021 |
| KR | 1020210052723 A | 5/2021 |
| KR | 1020220100762 A | 7/2022 |
| KR | 102488393 B1 | 1/2023 |
| KR | 102528403 B1 | 4/2023 |
| KR | 1020230044047 A | 4/2023 |
| KR | 1020230111703 A | 7/2023 |
| KR | 1020230117011 A | 8/2023 |

* cited by examiner

DISPLAY DEVICE

This application claims priority to Korean Patent Application No. 10-2023-0131158, filed on Sep. 27, 2023, and all the benefits accruing therefrom under 35 U.S.C. § 119, the content of which in its entirety is herein incorporated by reference.

BACKGROUND

1. Field

One or more embodiments relate to a flexible display device, and more particularly to a display device which may prevent damage.

2. Description of the Related Art

With the development of display devices that visually display electrical signals, various display devices having excellent characteristics, such as thinness, weight reduction, and low power consumption, have been introduced. For example, flexible display devices that can be folded or rolled into a roll shape have been introduced. Recently, research and development of display devices that can change into various forms are actively underway.

SUMMARY

One or more embodiments include a flexible display device.

Additional embodiments will be set forth in part in the description which follows and, in part, will be apparent from the description, or may be learned by practice of the presented embodiments of the invention.

According to one or more embodiments, a display device includes a substrate including an island portion, a first bridge portion extending from the island portion in a first direction, and a second bridge portion extending from the island portion in a second direction crossing the first direction, a first conductive layer disposed on the substrate and including a first voltage line extending from the island portion to the first bridge portion and the second bridge portion, a second conductive layer disposed on the first conductive layer and including signal lines extending from the island portion to the first bridge portion and a data line extending from the island portion to the second bridge portion, and a third conductive layer disposed on the second conductive layer and including a second voltage line and a third voltage line, wherein the second voltage line extends from the island portion to the first bridge portion and wherein the third voltage line extends from the island portion to the second bridge portion, respectively.

In an embodiment, the first voltage line may include a 1st-1 voltage line extending from the island portion to the first bridge portion and a 1st-2 voltage line extending from the island portion to the second bridge portion, wherein the first conductive layer may further include an initialization voltage line extending from the island portion to the first bridge portion.

In an embodiment, the display device may further include a semiconductor layer disposed on the substrate, a fourth conductive layer disposed on the semiconductor layer, and a fifth conductive layer disposed between the fourth conductive layer and the first conductive layer and including a connection electrode, wherein the connection electrode may overlap the 1st-2 voltage line in a plan view, and wherein the initialization voltage line may be electrically connected to the connection electrode.

In an embodiment, the first conductive layer may further include a first scan line extending from the island portion to the first bridge portion, wherein the fourth conductive layer may include a first gate line electrically connected to the first scan line.

In an embodiment, the 1st-1 voltage line may have a first width directed in a direction perpendicular to an extension direction of the 1st-1 voltage line, and the 1st-2 voltage line may have a second width, which is greater than the first width, in a direction perpendicular to an extension direction of the 1st-2 voltage line.

In an embodiment, the signal lines may include a second scan line, a third scan line, and an emission control line, which are arranged to be disposed apart from each other on the first bridge portion.

In an embodiment, the display device may further include a semiconductor layer disposed on the substrate, and a fourth conductive layer disposed between the semiconductor layer and the first conductive layer and including a second gate line, a third gate line, and a fourth gate line, wherein the second scan line may be electrically connected to the second gate line, the third scan line may be electrically connected to the third gate line, and the emission control line may be electrically connected to the fourth gate line.

In an embodiment, the island portion may have a first boundary and a second boundary, which extend in the second direction, and a third boundary and a fourth boundary, which extend in the first direction and which connect the first boundary to the second boundary, wherein the data line may extend from the third boundary to the fourth boundary.

In an embodiment, the second voltage line may include a 2nd-1 voltage line extending from the island portion to the first bridge portion and a 2nd-2 voltage line extending from the island portion to the second bridge portion, and wherein the third voltage line may include a 3rd-1 voltage line extending from the island portion to the first bridge portion and a 3rd-2 voltage line extending from the island portion to the second bridge portion.

In an embodiment, the 3rd-1 voltage line and the 3rd-2 voltage line may be connected to each other on the island portion.

In an embodiment, the 2nd-1 voltage line and the 2nd-2 voltage line may each have a third width directed in a direction perpendicular to a respective extension directions thereof, and wherein the 3rd-1 voltage line and the 3rd-2 voltage line may each have a fourth width, which is less than the third width, directed in a direction perpendicular to a respective extension directions thereof.

In an embodiment, the display device may further include a sixth conductive layer disposed on the third conductive layer and including a first electrode pad electrically connected to a first electrode of a light-emitting element and a second electrode pad electrically connected to a second electrode of the light-emitting element, wherein the third voltage line may be electrically connected to the second electrode pad.

In an embodiment, the first bridge portion and the second bridge portion may each have two curved portions and a straight portion connecting the curved portions to each other, and wherein each of the curved portions may have an inner boundary and an outer boundary, which have different radii, and wherein a first distance between the inner boundary and a wiring line disposed closest to the inner boundary may be greater than a second distance between the outer boundary and a wiring line disposed closest to the outer boundary.

In an embodiment, the display device may further include a pixel driving circuit disposed on the island portion and a light-emitting element electrically connected to the pixel driving circuit, wherein the pixel driving circuit may include a driving transistor having a gate, and a first terminal and a second terminal electrically connected to a first node, a data write transistor electrically connected to the first node and the data line, a first compensation transistor electrically connected to the gate of the driving transistor and the second terminal of the driving transistor, a first emission control transistor electrically connected to the first node and a second node, a second emission control transistor electrically connected to a first electrode of the light-emitting element and the second terminal of the driving transistor, a first initialization transistor electrically connected to a first initialization voltage line and the gate of the driving transistor, a second initialization transistor electrically connected to a second initialization voltage line and the first electrode of the light-emitting element, a third emission control transistor electrically connected to the second node and the second voltage line, a second compensation transistor electrically connected to the second node and the first voltage line, a storage capacitor electrically connected to the second node and the gate of the driving transistor, and an auxiliary capacitor electrically connected to the first voltage line and the first electrode of the light-emitting element.

In an embodiment, a second electrode of the light-emitting element may be electrically connected to the third voltage line.

According to one or more embodiments, a display device includes a substrate including an island portion, a first bridge portion extending from the island portion in a first direction, and a second bridge portion extending from the island portion in a second direction crossing the first direction, a first conductive layer disposed on the substrate and including first wiring lines extending from the island portion to the first bridge portion and the second bridge portion, a second conductive layer disposed on the first conductive layer and including second wiring lines extending from the island portion to the first bridge portion and the second bridge portion, and a first insulating layer disposed between the first conductive layer and the second conductive layer, wherein the first insulating layer has a first thickness at the first bridge portion and the second bridge portion and has a second thickness, which is smaller than the first thickness, at the island portion.

In an embodiment, the first wiring lines may include a first voltage line extending from the island portion to the first bridge portion and a second voltage line extending from the island portion to the second bridge portion, and wherein the second wiring lines may include a data line extending from the island portion to the second bridge portion, wherein a distance in a thickness direction between the first voltage line and the data line in the second bridge portion may be greater than a distance in the thickness direction between the first voltage line and the data line in the island portion.

In an embodiment, the first insulating layer may include an organic insulating material.

In an embodiment, the display device may further include an organic layer disposed between the first insulating layer and the substrate, wherein the organic layer may be spaced apart from the island portion.

In an embodiment, the display device may further include a third conductive layer disposed on the second conductive layer and including third wiring lines extending from the island portion to the first bridge portion and the second bridge portion, and a second insulating layer disposed between the second conductive layer and the third conductive layer, wherein the second insulating layer may have a third thickness at the first bridge portion and the second bridge portion and may have a fourth thickness, which is smaller than the third thickness, at the island portion.

In an embodiment, the second wiring lines may include a data line extending from the island portion to the second bridge portion, and wherein the third wiring lines may include a third voltage line extending from the island portion to the second bridge portion, wherein a distance in a thickness direction between the third voltage line and the data line in the second bridge portion may be greater than a distance in the thickness direction between the third voltage line and the data line in the island portion.

In an embodiment, the second insulating layer includes an organic insulating material.

Other aspects, features, and advantages than those described above will become apparent from the following drawings, claims, and detailed description of the invention.

BRIEF DESCRIPTION OF THE DRAWINGS

The above and other aspects, features, and advantages of the invention will be more apparent from the following description taken in conjunction with the accompanying drawings, in which.

DETAILED DESCRIPTION

Figure 1:
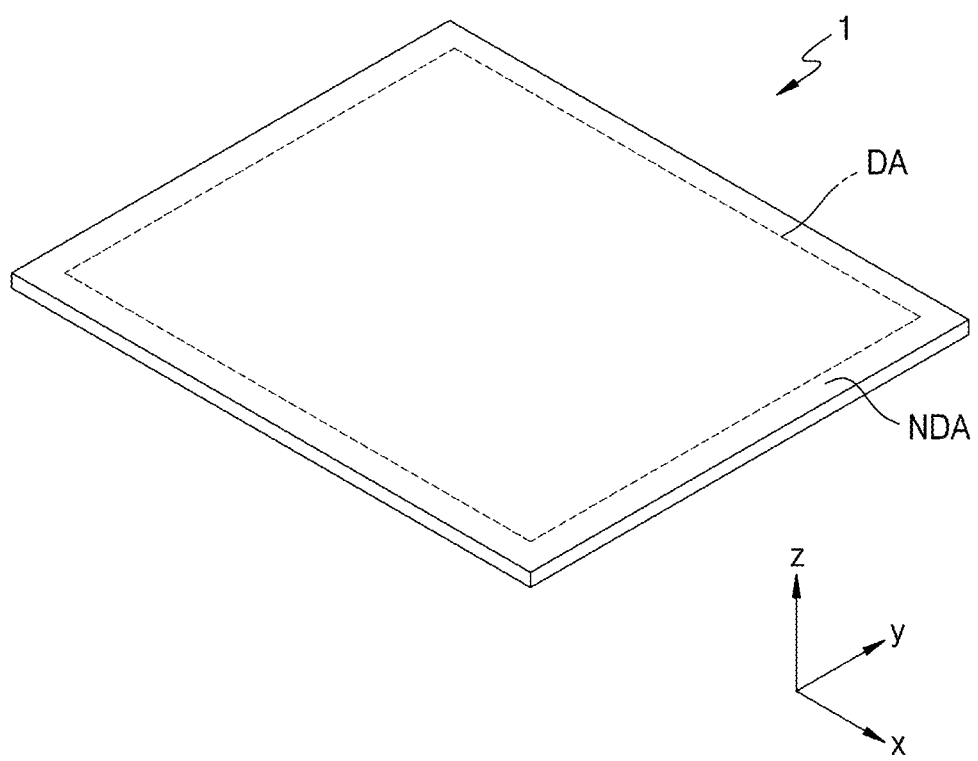
FIG. 1 is a perspective view schematically showing a display device, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the invention. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure is subject to various modifications and may have many embodiments, certain of which are illustrated in the drawings and further described in the detailed description. The effects and features of the disclosure, and methods of achieving them will become clear with reference to the embodiments described below in detail together with the drawings. However, the invention is not limited to the embodiments described herein and may be implemented in various forms.

Hereinafter, embodiments will be described in detail with reference to the accompanying drawings, and when being described with reference to the drawings, the same or corresponding components are given the same reference numerals, and duplicate descriptions thereof will be omitted.

In the present specification, the terms first, second, etc. are not intended to be limiting, however are used to distinguish one component from another.

In the present specification, terms, such as horizontal, vertical, up, down, left, right, etc., do not have a limiting meaning but are for convenience of explanation and do not indicate absolute orientation. Accordingly, these terms may vary depending on the location of the observer or the arrangement of the display device.

In the present specification, the singular expression includes the plural unless the context clearly indicates otherwise.

It will be further understood that the terms "include" and/or "have" used herein specify the presence of stated features or components, but do not preclude the presence or addition of one or more other features or components.

In the present specification, when a portion of a film, area, component, etc. is the to be over or on top of another portion, this includes not only when it is directly on top of the other portion, but also when there are other films, areas, components, etc. arranged therebetween.

In the present specification, when layers, regions, or components are connected to each other, the layers, the regions, or the components may be directly connected to each other, or another layer, another region, or another component may be interposed between the layers, the regions, or the components and thus the layers, the regions, or the components may be indirectly connected to each other. For example, in the present specification, when layers, regions, or components are electrically connected to each other, the layers, the regions, or the components may be directly electrically connected to each other, or another layer, another region, or another component may be interposed between the layers, the regions, or the components and thus the layers, the regions, or the components may be indirectly electrically connected to each other.

In the present specification, the expression such as "A and/or B" may include A, B, or A and B. Furthermore, the expression such as "at least one of A and B" may include A, B, or A and B.

In the present specification, the terms x-axis, y-axis, and z-axis are not limited to, however may be interpreted in a broad sense to include, three axes in a Cartesian coordinate system. For example, the x-axis, y-axis, and z-axis may be orthogonal to each other, however may also refer to different directions that are not orthogonal to each other.

In the present specification, a particular sequence of processes may be performed in a different order than that described. For example, two processes described in succession may be performed substantially simultaneously, or may be performed in the opposite order from the order described.

In the drawings, components may be exaggerated or reduced in size for ease of illustration. For example, the size and thickness of each configuration shown in the drawings are arbitrary for purposes of illustration and the disclosure is not necessarily limited to those shown.

Figure 2A:
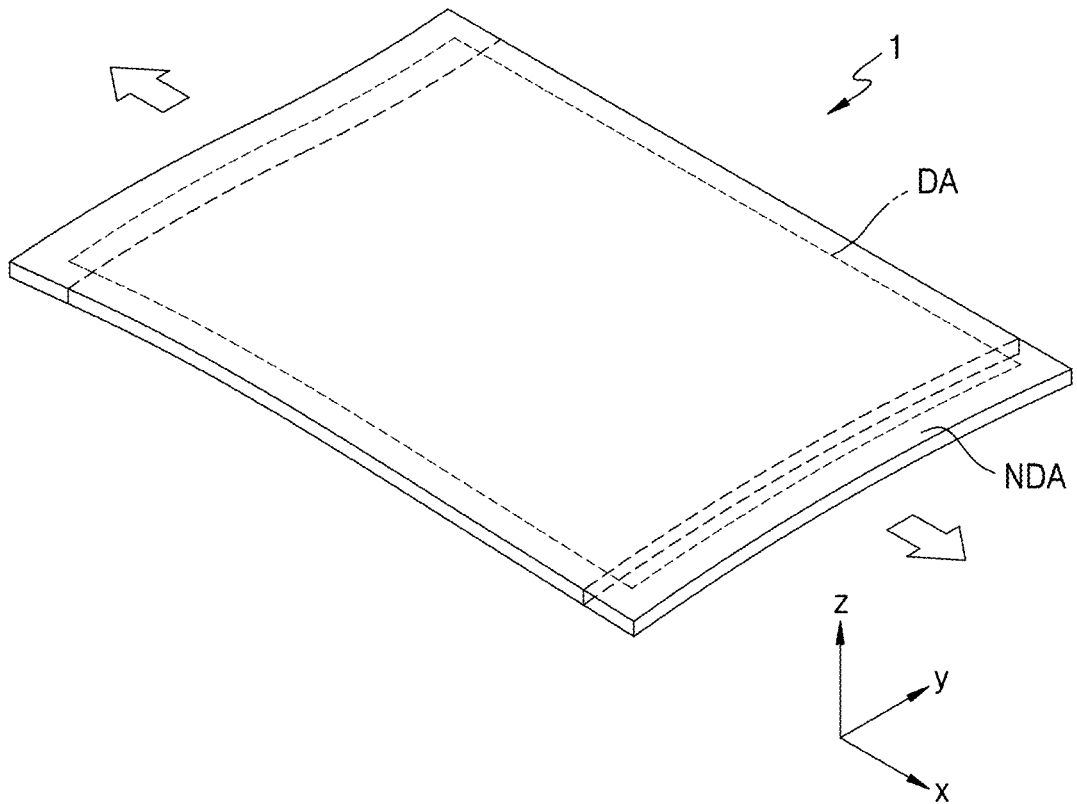
FIG. 2A is a perspective view showing the display device of FIG. 1 stretched in a first direction, according to an embodiment.
Figure 2B:
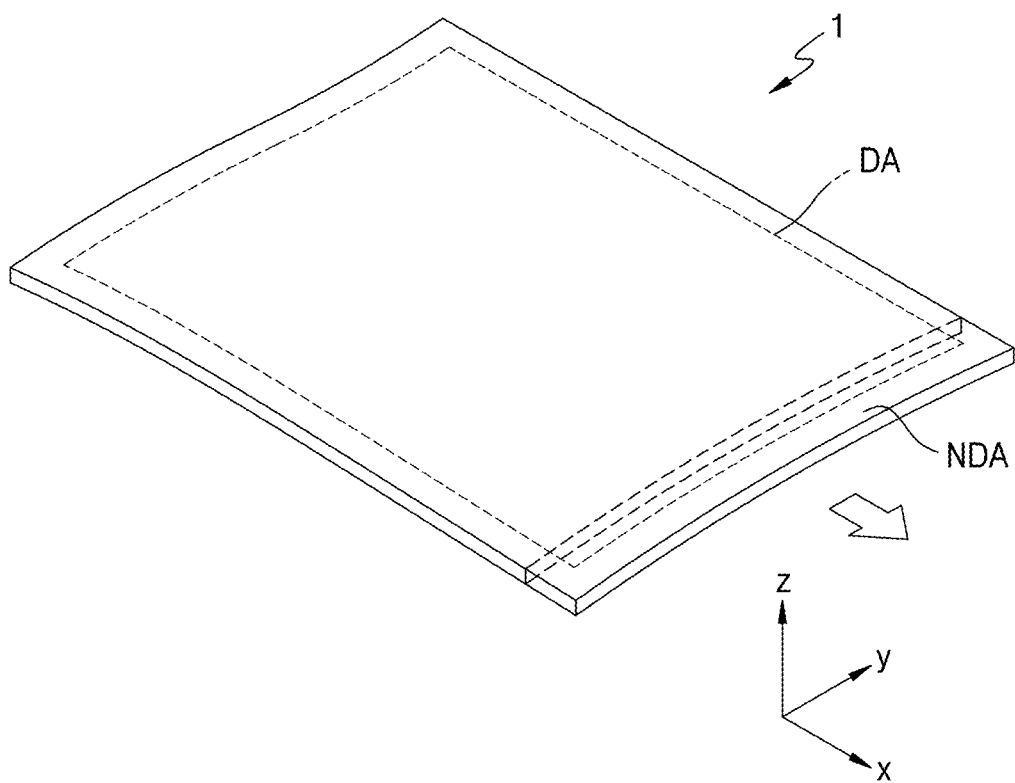
FIG. 2B is a perspective view showing the display device of FIG. 1 stretched in a first direction, according to an embodiment.
Figure 2C:
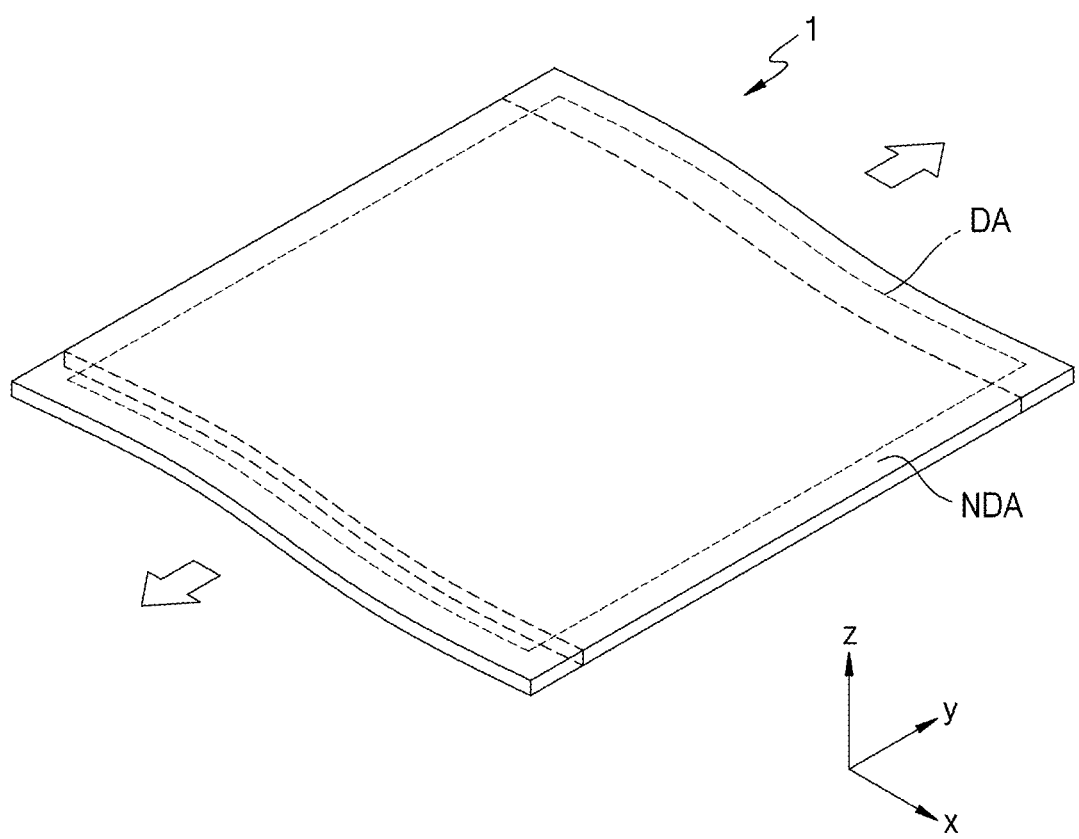
FIG. 2C is a perspective view showing the display device of FIG. 1 stretched in a second direction, according to an embodiment.
Figure 2D:
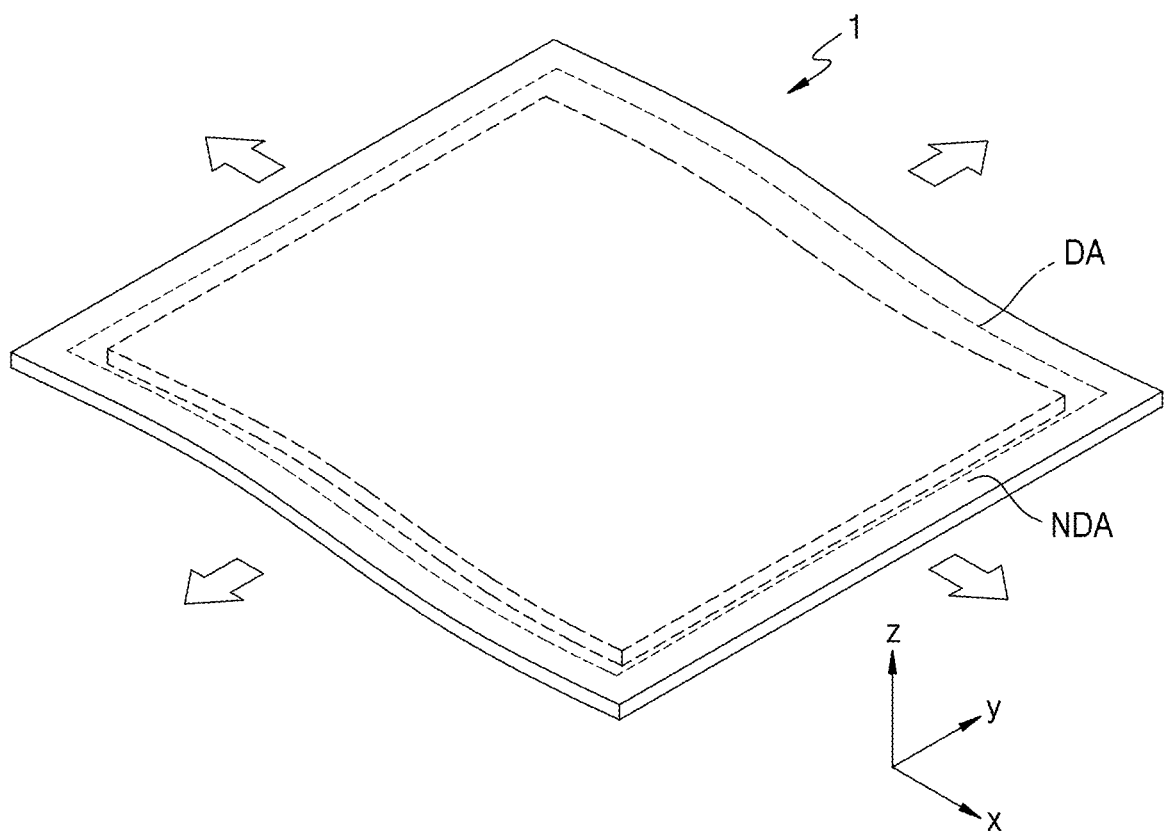
FIG. 2D is a perspective view showing the display device of FIG. 1 stretched in the first and second directions, according to an embodiment.
Figure 2E:
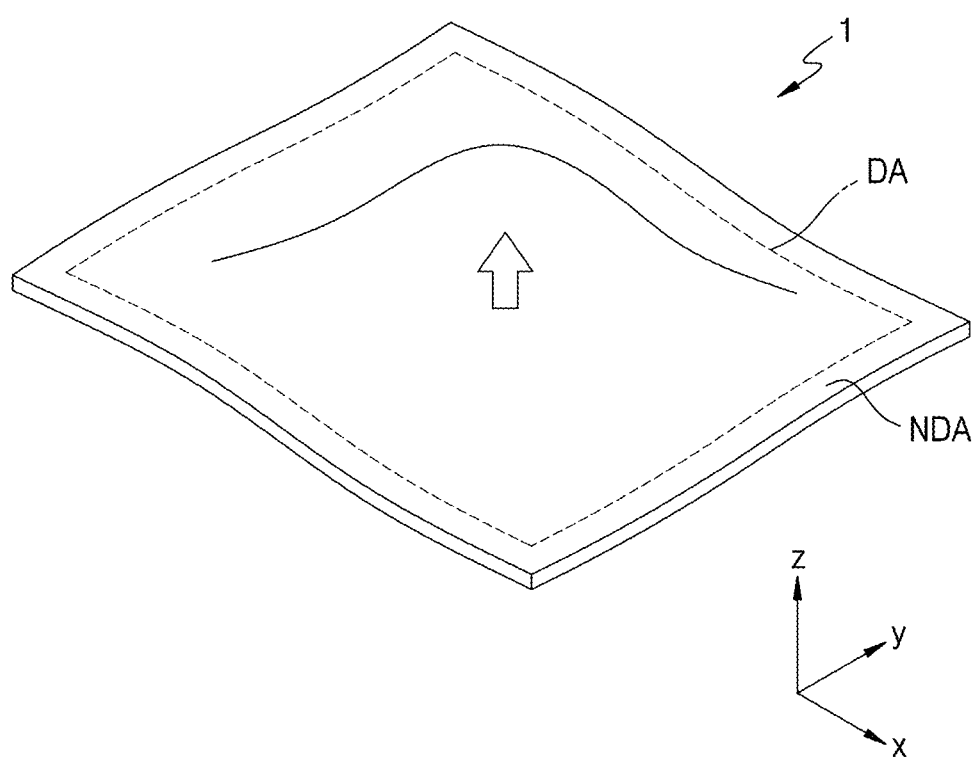
FIG. 2E is a perspective view showing the display device of FIG. 1 stretched in a third direction, according to an embodiment.

FIG. 1 is a perspective view schematically showing a display device 1, according to an embodiment. FIGS. 2A and 2B are perspective views showing the display device 1 of FIG. 1 stretched in a first direction, according to an embodiment. FIG. 2C is a perspective view showing the display device 1 of FIG. 1 stretched in a second direction, according to an embodiment. FIG. 2D is a perspective view showing the display device of FIG. 1 stretched in the first and second directions, according to an embodiment. FIG. 2E is a perspective view showing the display device 1 of FIG. 1 stretched in a third direction, according to an embodiment.

In an embodiment and referring to FIG. 1, the display device 1 may include a display area DA and a non-display area NDA. The display area DA may include a plurality of pixels. The display device 1 may provide a certain image by using light emitted from the plurality of pixels. The non-display area NDA may be placed outside the display area DA. The non-display area NDA may entirely surround the display area DA.

In an embodiment, the display device 1 may be stretched or shrunk in various directions. The display device 1 may be stretched in a first direction (e.g., x direction and/or −x direction) by an external force applied by an external object or a user. In an embodiment, as shown in FIGS. 2A and 2B, the display area DA and/or the non-display area NDA of the display device 1 may be stretched in the first direction (e.g., x direction and/or −x direction). For example, as shown in FIG. 2A, the display area DA and/or the non-display area NDA of the display device 1 may be stretched in the x direction and −x direction. In another embodiment, as shown in FIG. 2B, the display area DA and/or the non-display area NDA of the display device 1 may be stretched in the x direction while one side of the display device 1 is fixed.

In an embodiment, the display device 1 may be stretched in the second direction (e.g., y direction and/or −y direction) by an external force applied by an external object or a user. In an embodiment, as shown in FIG. 2C, the display area DA and/or the non-display area NDA of the display device 1 may be stretched in the y direction and −y direction. In another embodiment, the display area DA and/or the non-display area NDA of the display device 1 may be stretched in the y direction or −y direction while one side of the display device 1 is fixed.

In an embodiment, the display device 1 may be stretched in a plurality of directions, for example, in the first direction (e.g., x direction and/or −x direction) and the second direction (e.g., y direction and/or −y direction), by an external force applied by an external object or a portion of a person's body. As shown in FIG. 2D, the display area DA and/or the non-display area NDA of the display device 1 may be stretched in the +x direction and the ty direction.

In an embodiment, the display device 1 may be stretched in a third direction (e.g., z direction or −z direction) by an external force applied by an external object or a portion of a person's body. In an embodiment, FIG. 2E shows that a portion of the display device 1, for example, a portion of the display area DA protrudes in the z direction. In another embodiment, a portion of the display device 1, for example, a portion of the display area DA may protrude in the z direction (or be dented in the −z direction).

In an embodiment, although FIGS. 2A to 2E show that the display device 1 is stretched in the first direction, the second direction, and/or the third direction, the invention is not limited thereto. In another embodiment, the display device 1 may be deformed into various irregular shapes, such as being bent or twisted along two or more axes.

Figure 3:
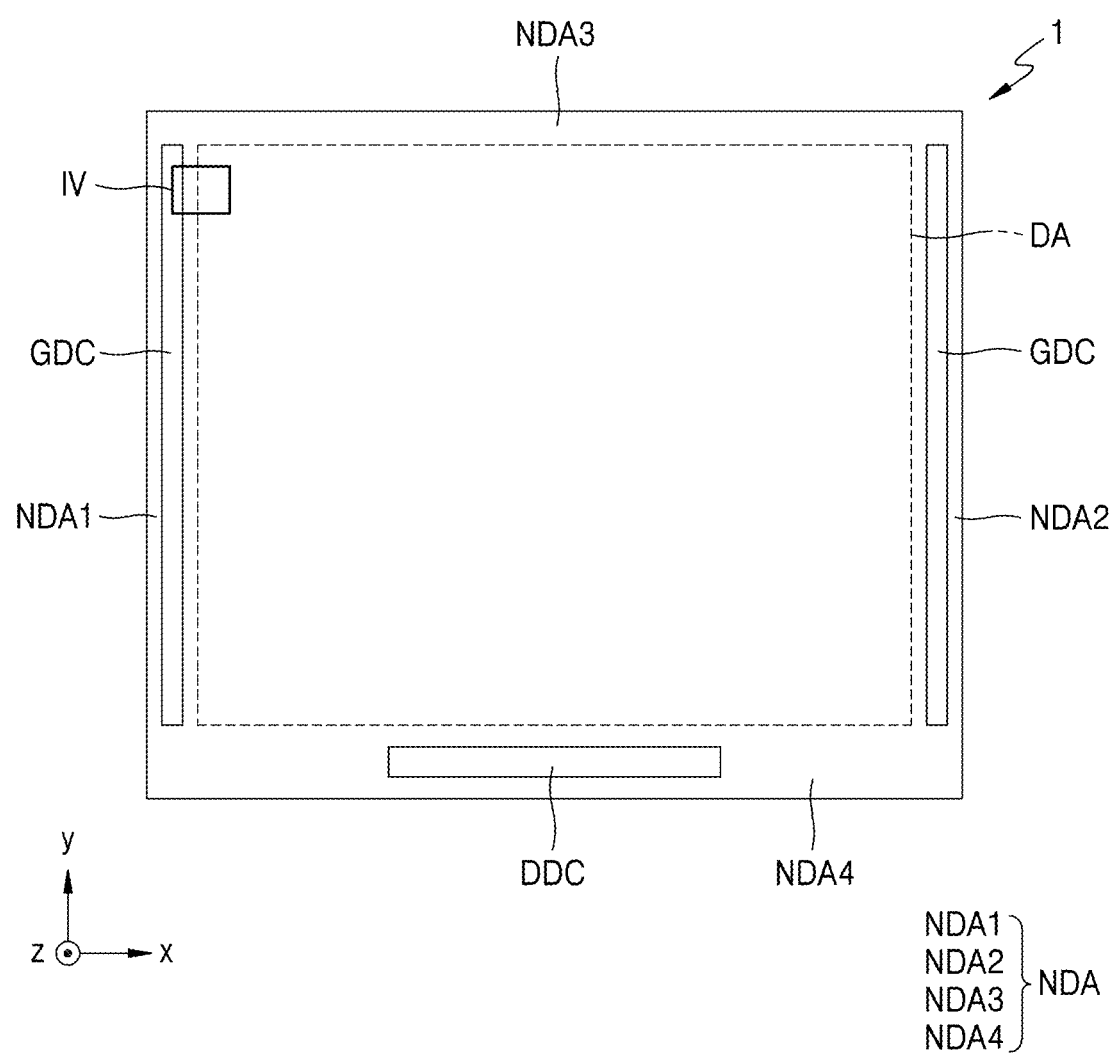
FIG. 3 is a plan view schematically showing a display device, according to an embodiment.

FIG. 3 is a plan view schematically showing a display device 1, according to an embodiment.

In an embodiment, a plurality of pixels may be arranged in a display area DA of the display device 1. Each pixel may include sub-pixels that emit light of different colors. A light-emitting element corresponding to each sub-pixel may be arranged in the display area DA. A circuit for providing electrical signals to light-emitting elements arranged in the display area DA and transistors electrically connected to the light-emitting elements may be located in a non-display area NDA surrounding the display area DA. A gate driving circuit GDC may be arranged in each of a first non-display area NDA1 and a second non-display area NDA2 on both sides of the display area DA. The gate driving circuit GDC may include drivers for providing electrical signals to gate electrodes of the transistors electrically connected to the light-emitting elements. Although FIG. 3 shows that the gate driving circuit GDC is arranged in each of the first non-display area NDA1 and the second non-display area NDA2, the disclosure is not limited thereto. In another embodiment, the gate driving circuit GDC may be arranged in either the first non-display area NDA1 or the second non-display area NDA2.

In an embodiment, a data driving circuit DDC may be arranged in a third non-display area NDA3 and/or a fourth non-display area NDA4, which connect the first non-display area NDA1 and the second non-display area NDA2 to each other. In an embodiment, FIG. 3 shows that the data driving circuit DDC is arranged in the fourth non-display area NDA4. In another embodiment, the data driving circuit DDC may be arranged in each of the third non-display area NDA3 and the fourth non-display area NDA4.

In an embodiment, although FIG. 3 shows that the data driving circuit DDC is arranged in the fourth non-display area NDA4 of the display device 1, the invention is not limited thereto. In another embodiment, the display device 1 may further include a flexible circuit board (not shown) electrically connected through a terminal portion (not shown) arranged in the fourth non-display area NDA4, and the data driving circuit DDC may be disposed on the flexible circuit board.

In some embodiments, the elongation rate of the non-display area NDA may be equal to or less than the elongation rate of the display area DA. In an embodiment, the elongation rate of the non-display area NDA may be different for each area. For example, the first non-display area NDA1, the second non-display area NDA2, and the third non-display area NDA3 may have substantially the same elongation rate, but the elongation rate of the fourth non-display area NDA4 may be less than the elongation rate of each of the first non-display area NDA1, the second non-display area NDA2, and the third non-display area NDA3.

Figure 4A:
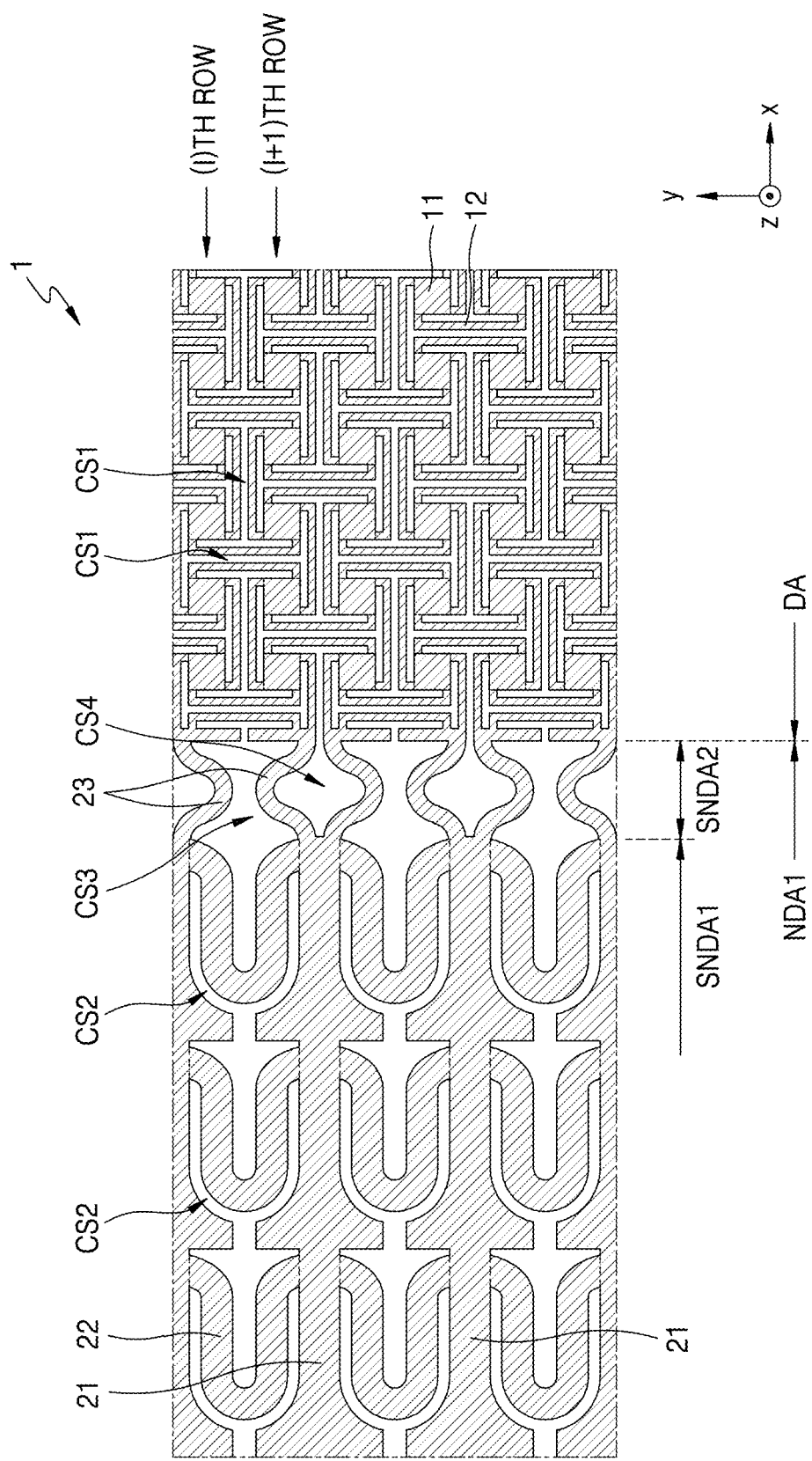
FIG. 4A is an enlarged plan view of an area IV of FIG. 3 as part of a display device, according to an embodiment.

FIG. 4A is an enlarged plan view of an area IV of FIG. 3 as part of a display device 1, according to an embodiment.

In an embodiment and referring to FIG. 4A, the display device 1 may include main island portions 11 spaced apart from each other in a first direction (e.g., x direction or −x direction) and a second direction (e.g., y direction or −y direction) in the display area DA, and main bridge portions 12 connecting adjacent main island portions 11 to each other.

In an embodiment, each of the main island portions 11 may be connected to a plurality of main bridge portions 12. For example, each of the main island portions 11 may be connected to four main bridge portions 12. Two main bridge portions 12 may be disposed on both sides of the main island portion 11 in the first direction (e.g., x direction or −x direction), and the remaining two main bridge portions 12 may be disposed on both sides of the main island portion 11 in the second direction (e.g., y direction or −y direction). In an embodiment, the four main bridge portions 12 may be respectively connected to the four sides of the main island portion 11. Each of the four main bridge portions 12 may be adjacent to each corner of the main island portion 11.

In an embodiment, the main bridge portions 12 may be apart from each other by a first opening CS1 located between the main bridge portions 12. In an embodiment, a first opening CS1 having an approximate H shape and a first opening CS1 having an approximate I shape obtained by rotating the H shape by about 90 degrees may be alternately and repeatedly arranged in the first direction (e.g., x direction or −x direction) and the second direction (e.g., y direction or −y direction). Both ends of each main bridge portion 12 may be connected to each of the adjacent main island portions 11, and one side of each main bridge portion 12 may be apart from one side of an adjacent main island portion 11 and/or one side of another main bridge portion 12 by the first opening CS1.

In an embodiment, the display device 1 may include peripheral island portions 21 spaced apart from each other in a non-display area, for example, the first non-display area NDA1 shown in FIG. 4A, and peripheral bridge portions 22 connecting adjacent peripheral island portions 21 to each other.

In an embodiment, each of the peripheral island portions 21 may extend in the first direction (e.g., x direction or −x direction). The peripheral island portions 21 may be spaced apart from each other in the second direction (e.g., y direction or −y direction) that crosses the first direction (e.g., x direction or −x direction). Each peripheral island portion 21 may include drivers of the gate driving circuit GDC (see FIG. 2) described with reference to FIG. 3.

In an embodiment, the peripheral bridge portion 22 may have a serpentine shape. The length of the peripheral bridge portion 22 may be greater than the shortest distance between adjacent peripheral island portions 21 in the second direction (e.g., y direction or −y direction). In an embodiment, the peripheral bridge portion 22 may have an approximately omega (Ω) shape that is convex toward the first direction (e.g., x direction or −x direction). The peripheral bridge portions 22 may be arranged between adjacent peripheral island portions 21 and may be apart from each other.

In an embodiment, the peripheral bridge portions 22 between adjacent peripheral island portions 21 may be apart from each other by second openings CS2. Between the adjacent peripheral island portions 21, the second openings CS2 and the peripheral bridge portions 22 may be alternately arranged in the first direction (e.g., x direction or −x direction). The second openings CS2 may have the same shape. Both ends of each peripheral bridge portion 22 may be connected to each of the adjacent peripheral island portions 21, and one side of each peripheral bridge portion 22 may be apart from one side of an adjacent peripheral island portion 21 and/or one side of another peripheral bridge portion 22 by the second opening CS2.

In an embodiment, one of the peripheral island portions 21 arranged in the first non-display area NDA1 may correspond to a plurality of rows of main island portions 11 arranged in the display area DA1. For example, one of the peripheral island portions 21 arranged in the first non-display area NDA1 may correspond to main island portions 11 arranged in the (i)th row and main island portions 11 arranged in the (i+1)th row in the display area DA (where I is a positive number greater than 0). Although FIG. 4A shows that one peripheral island portion 21 corresponds to two rows of main island portions 11, but the invention is not limited thereto. In another embodiment, one peripheral island portion 21 arranged in the first non-display area NDA1 may correspond to n rows of main island portions 11 arranged in the display area DA1 (where n is a positive number that is equal to or greater than 3).

In an embodiment, the non-display area, for example, the first non-display area NDA1, may include a first sub-non-display area SNDA1 in which the peripheral island portions 21 and the peripheral bridge portions 22, described above, are arranged, and a second sub-non-display area SNDA2 between the first sub-non-display area SNDA1 and the display area DA. Connection bridge portions 23 may be arranged in the second sub-non-display area SNDA2 to connect the display area DA with the first sub-non-display area SNDA1. One end of the connection bridge portion 23 may be connected to the peripheral island portion 21 and/or the peripheral bridge portion 22, and the other end of the connection bridge portion 23 may be connected to the main island portion 11 and/or the main bridge portion 12.

In an embodiment, the connection bridge portion 23 may have a serpentine shape. In an embodiment, the shape of the connection bridge portion 23 may be different from the shape of each of the main bridge portion 12 and the peripheral bridge portion 22. In an embodiment, as shown in FIG. 4A, the connection bridge portion 23 may have an approximate Q shape that is convex toward the second direction (e.g., y direction or −y direction). The connection bridge portions 23 may have a symmetrical structure, in which one of the adjacent connection bridge portions 23 arranged in the second direction (e.g., y direction or −y direction) is convex in the y direction and the other is convex in the −y direction. Between the connection bridge portions 23, third openings CS3 and fourth openings CS4 of different shapes may have a repeated structure. The width of the connection bridge portion 23 may be different from the width of the main bridge portion 12 and the width of the peripheral bridge portion 22. In an embodiment, the width of the connection bridge portion 23 may be greater than the width of the main bridge portion 12 and may be less than the width of the peripheral bridge portion 22.

In an embodiment, FIG. 4A shows that the peripheral island portion 21 and the peripheral bridge portion 22 in the non-display area, for example, the first non-display area NDA1, have different shapes from the main island portion 11 and the main bridge portion 12, respectively, in the display area DA. In another embodiment, the peripheral island portion 21 and the peripheral bridge portion 22 in the non-display area may have the same shape as the main island portion 11 and the main bridge portion 12, respectively, in the display area DA.

Figure 4B:
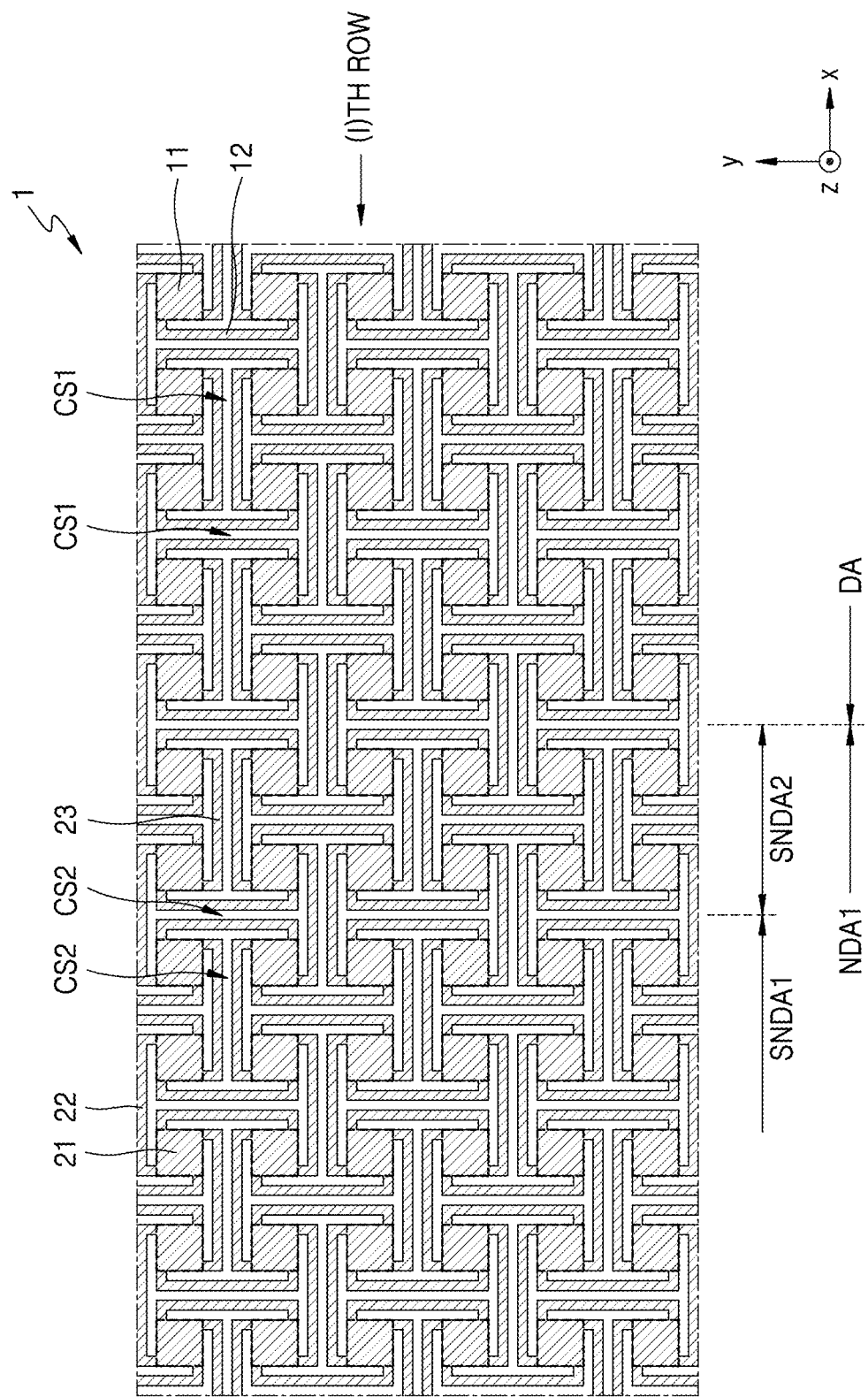
FIG. 4B is an enlarged plan view of the area IV of FIG. 3 as part of a display device, according to an embodiment.

FIG. 4B is an enlarged plan view of the area IV of FIG. 3 as part of a display device 1, according to an embodiment.

In an embodiment and referring to FIG. 4B, the display device 1 may include main island portions 11 apart from each other in a display area DA and main bridge portions 12 apart from each other by a first opening CS1 and connecting adjacent main island portions 11 to each other. The structure of the display area DA in FIG. 4B may be the same as the structure of the display area DA previously described with reference to FIG. 4A.

In an embodiment, the display device 1 may include peripheral island portions 21 and peripheral bridge portions 22, arranged in a non-display area, for example, a first non-display area NDA1. In an embodiment, the peripheral island portions 21 and the peripheral bridge portions 22 may have substantially the same shape as the main island portions 11 and the main bridge portions 12, respectively.

In an embodiment, the peripheral island portions 21 may be spaced apart from each other in a first direction (e.g., x direction or −x direction) and a second direction (e.g., y direction or −y direction) in the non-display area, for example, the first non-display area NDA1. Each of the peripheral bridge portions 22 may connect adjacent peripheral island portions 21 to each other. The peripheral bridge portions 22 may be apart from each other by a second opening CS2 located between the peripheral bridge portions 22.

In an embodiment, the second opening CS2 may have substantially the same shape as the first opening CS1. For example, a second opening CS2 having and approximate H shape and a second opening CS2 having an approximate I shape may be alternately and repeatedly arranged in the non-display area, for example, the first non-display area NDA1. Both ends of each peripheral bridge portion 22 may be connected to each of the adjacent peripheral island portions 21, and one side of each peripheral bridge portion 22 may be apart from one side of an adjacent peripheral island portion 21 and/or one side of another peripheral bridge portion 22 by the second opening CS2.

In an embodiment, each peripheral island portion 21 may be connected to four peripheral bridge portions 22. Each peripheral island portion 21 may include drivers of the gate driving circuit GDC (see FIG. 2) described with reference to FIG. 3.

In an embodiment, peripheral island portions 21 in one row arranged in the first non-display area NDA1 may correspond to main island portions 11 in one row arranged in the display area DA1. For example, peripheral island portions 21 arranged in the (i)th row in the first direction (e.g., x direction or −x direction) in the first non-display area NDA1 may correspond to main island portions 11 arranged in the same row, for example, the (i)th row, in the display area DA (where i is a positive number greater than 0).

In an embodiment, the display device 1 may include connection bridge portions 23 arranged in the second sub-non-display area SNDA2 for connecting the display area DA to the first sub-non-display area SNDA1. A non-display area, for example, the first non-display area NDA1, may include a first sub-non-display area SNDA1 in which the peripheral island portions 21 and the peripheral bridge portions 22 are arranged, and a second sub-non-display area SNDA2 including connection bridge portions 23 and located between the first sub-non-display area SNDA1 and the display area DA. The connection bridge portion 23 may be substantially the same as the main bridge portion 12 and the peripheral bridge portion 22. For example, the width of the connection bridge portion 23 may be the same as the width of the main bridge portion 12 and the width of the peripheral bridge portion 22.

Figure 4C:
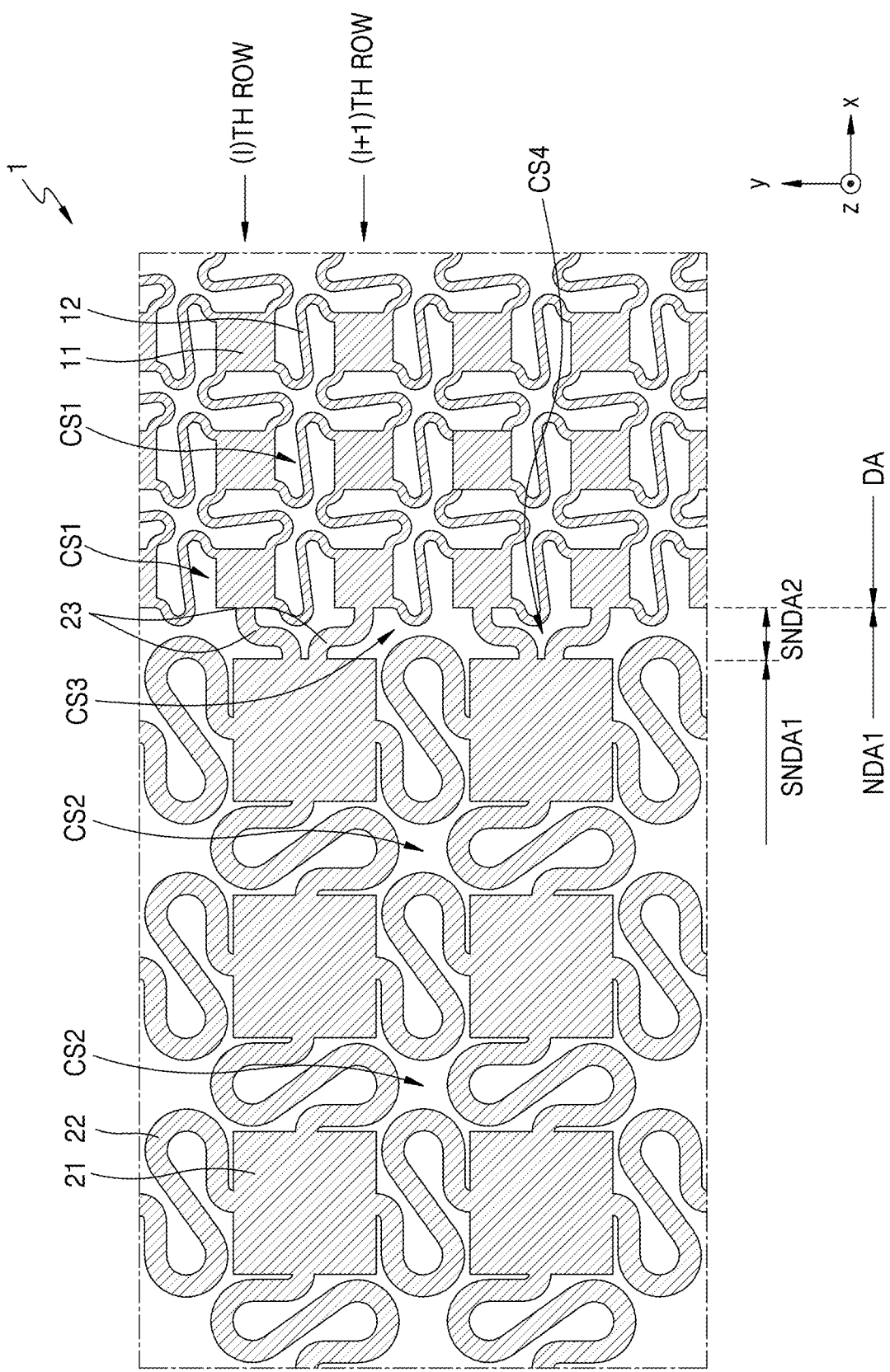
FIG. 4C is an enlarged plan view of the area IV of FIG. 3 as part of a display device, according to an embodiment.

FIG. 4C is an enlarged plan view of the area IV of FIG. 3 as part of a display device, according to an embodiment.

In an embodiment and referring to FIG. 4C, the display device 1 may include main island portions 11 apart from each other in a first direction (e.g., x direction or −x direction) and a second direction (e.g., y direction or −y direction) in the display area DA, and main bridge portions 12 connecting adjacent main island portions 11 to each other.

In an embodiment, the main bridge portions 12 may be arranged to be apart from each other by the first opening CS1 located between the main bridge portions 12. The main bridge portion 12 may have a serpentine shape. For example, as shown in FIG. 4C, the main bridge portion 12 may have the shape of approximately 'alphabet S'.

In an embodiment, each of the main island portions 11 may be connected to a plurality of main bridge portions 12. For example, each of the main island portions 11 may be connected to four main bridge portions 12. Two main bridge portions 12 may be disposed on both sides of the main island portion 11 in the first direction (e.g., x direction or −x direction), and the remaining two main bridge portions 12 may be disposed on both sides of the main island portion 11 in the second direction (e.g., y direction or −y direction). The four main bridge portions 12 may be respectively connected to the four sides of the main island portion 11. Each of the four main bridge portions 12 may be disposed adjacent to each corner of the main island portion 11.

In an embodiment, the display device 1 may include peripheral island portions 21 apart from each other in a first direction (e.g., x direction or −x direction) and a second direction (e.g., y direction or −y direction) in a non-display area, for example, in the first non-display area NDA1 shown in FIG. 4C, and peripheral bridge portions 22 connecting adjacent peripheral island portions 21 to each other.

In an embodiment, the peripheral bridge portions 22 may be arranged to be apart from each other by the second opening CS2 located between the peripheral bridge portions 22. The peripheral bridge portion 22 may have a serpentine shape. For example, as shown in FIG. 4C, the peripheral bridge portion 22 may have the shape of approximately 'alphabet S'. The size and/or width of the peripheral bridge portion 22 may be different from the size and/or width of the main bridge portion 12. For example, the size and/or width of the peripheral bridge portion 22 may be greater than the size and/or width of the main bridge portion 12. The radius of curvature of a round portion of the peripheral bridge portion 22 may be different from the radius of curvature of a round portion of the main bridge portion 12. For example, the radius of curvature of the round portion of the peripheral bridge portion 22 may be greater than the radius of curvature of the round portion of the main bridge portion 12.

In an embodiment, each of the peripheral island portions 21 may be connected to a plurality of peripheral bridge portions 22. Each of the peripheral island portions 21 may be connected to four peripheral bridge portions 22. Two peripheral bridge portions 22 may be disposed on both sides of the peripheral island portion 21 in the first direction (e.g., x direction or −x direction), and the remaining two peripheral bridge portions 22 may be disposed on both sides of the peripheral island portion 21 in the second direction (e.g., y direction or −y direction). In an embodiment, the four peripheral bridge portions 22 may be respectively connected to the four sides of the peripheral island portion 21. Each peripheral bridge portion 22 may be connected to a central portion of each side of the peripheral island portion 21.

In an embodiment, peripheral island portions 21 in one row arranged in the first non-display area NDA1 may correspond to main island portions 11 in a plurality of rows arranged in the display area DA. For example, the peripheral island portions 21 in one row arranged in the first non-display area NDA1 may correspond to main island portions 11 arranged in the (i)th row of the display area DA and main island portions 11 arranged in the (i+1)th row (where i is a positive number greater than 0). In another embodiment, one row of peripheral island portions 21 may correspond to n rows of main island portions 11 (where n is a positive number that is equal to or greater than 3).

In an embodiment, the non-display area, for example, the first non-display area NDA1, may include a first sub-non-display area SNDA1 in which the peripheral island portions 21 and the peripheral bridge portions 22, described above, are arranged, and a second sub-non-display area SNDA2 between the first sub-non-display area SNDA1 and the display area DA. Connection bridge portions 23 may be arranged in the second sub-non-display area SNDA2 to connect the display area DA with the first sub-non-display area SNDA1. One end of the connection bridge portion 23 may be connected to the peripheral island portion 21 and the other end of the connection bridge portion 23 may be connected to the main island portion 11. For example, one end of the connection bridge portion 23 may be connected to a central portion of one side of the peripheral island portion 21, and the other end of the connection bridge portion 23 may be connected to a central portion of one side of the main island portion 11.

In an embodiment, the connection bridge portion 23 may have a serpentine shape. In an embodiment, the shape of the connection bridge portion 23 may be different from the shape of each of the main bridge portion 12 and the peripheral bridge portion 22. The width of the connection bridge portion 23 may be different from the width of the main bridge portion 12 and the width of the peripheral bridge portion 22. The width of the connection bridge portion 23 may be greater than the width of the main bridge portion 12 and may be less than the width of the peripheral bridge portion 22. Third openings CS3 and fourth openings CS4 of different shapes may be alternately arranged between the connection bridge portions 23 in the second direction (e.g., y direction or −y direction).

Figure 5:
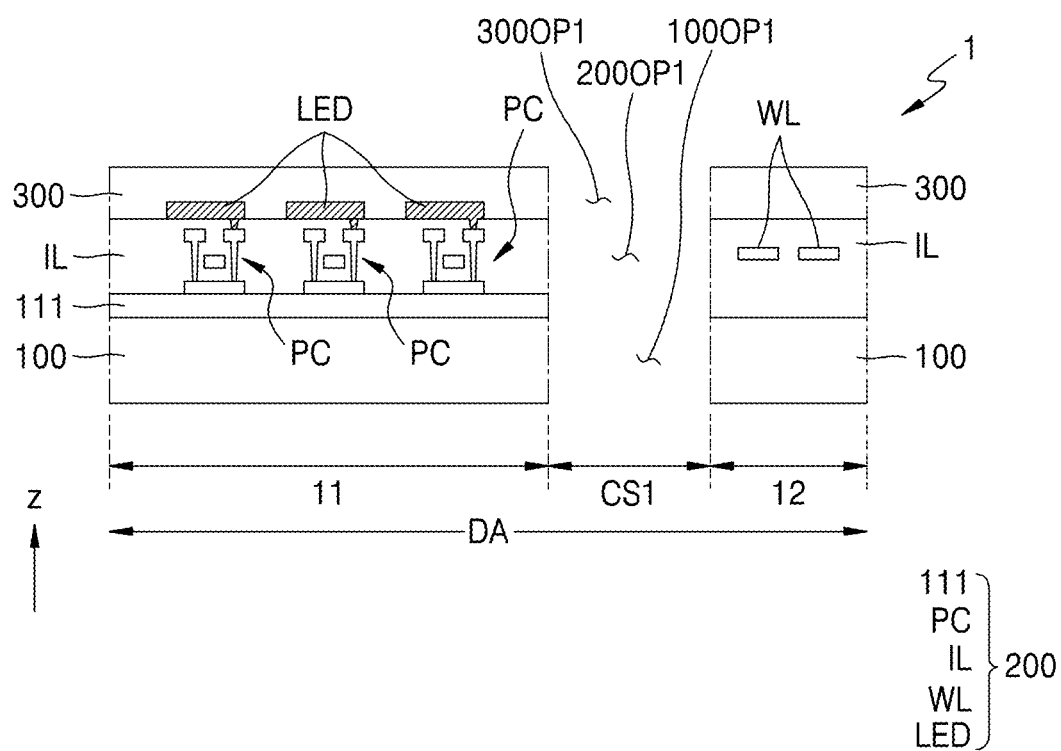
FIG. 5 is a cross-sectional view schematically showing a first island portion and a first bridge portion arranged in a display area of a display device, according to an embodiment.

FIG. 5 is a cross-sectional view schematically showing a main island portion 11 and a main bridge portion 12 arranged in a display area DA of a display device 1, according to an embodiment.

In an embodiment and referring to FIG. 5, the main island portion 11 and the main bridge portion 12 arranged in the display area DA may be spaced apart from each other with a first opening CS1 therebetween. The main island portion 11 may include light-emitting elements LED and a circuit (e.g., pixel driving circuit PC) for driving the light-emitting elements LED electrically connected thereto, and the main bridge portion 12 may include wiring lines WL electrically connected to pixel driving circuits PC arranged in each of the adjacent main island portions 11.

In an embodiment, in the main island portion 11, a buffer layer 111 including an inorganic insulating material may be disposed on a substrate 100, and a pixel driving circuit PC may be disposed on the buffer layer 111. An insulating layer IL including an inorganic insulating material and/or an organic insulating material may be disposed between the pixel driving circuit PC and the light-emitting element LED. The light-emitting element LED may be disposed on the insulating layer IL and may be electrically connected to a corresponding pixel driving circuit PC. Light-emitting elements LED may emit light of different colors or the same color. In an embodiment, each of the light-emitting elements LED may emit red light, green light, or blue light. In some embodiments, the light-emitting elements LED may emit white light. In another embodiment, each of the light-emitting elements LED may emit red light, green light, blue light, or white light.

In an embodiment, the substrate 100 may include a polymer resin, such as polyethersulfone, polyarylate, polyether imide, polyethylene naphthalate, polyethylene terephthalate, polyphenylene sulfide, polyimide, polycarbonate, cellulose triacetate, or cellulose acetate propionate. In an embodiment, the substrate 100 may include a single layer including the aforementioned resin. In another embodiment, the substrate 100 may have a multi-layered structure including a base layer including the aforementioned polymer resin and a barrier layer including an inorganic insulating material. The substrate 100 including a polymer resin may be flexible, rollable, bendable or stretchable.

In an embodiment, FIG. 5 shows that three pixel driving circuits PC are arranged in each of the main island portions 11 and three light-emitting elements LED are connected to each of the pixel driving circuits PC. However, the invention is not limited thereto. In another embodiment, the number of pixel driving circuits PC and light-emitting elements LED arranged in the main island portion 11 may be one, two, or four or more.

In an embodiment, an encapsulation layer 300 may be disposed on the light-emitting elements LED and may protect the light-emitting elements LED from external force and/or moisture penetration. The encapsulation layer 300 may include an inorganic encapsulation layer and/or an organic encapsulation layer. In some embodiments, the encapsulation layer 300 may have a structure in which an inorganic encapsulation layer including an inorganic insulating material, an organic encapsulation layer including an organic insulating material, and an inorganic encapsulation layer including an inorganic insulating material are stacked. In another embodiment, the encapsulation layer 300 may include an organic material, such as resin. In some embodiments, the encapsulation layer 300 may include urethane epoxy acrylate. The encapsulation layer 300 may include a photosensitive material, such as photoresist.

In an embodiment, in the main bridge portion 12, an insulating layer IL including an organic insulating material may be disposed on the substrate 100. When the display device 1 is stretched, unlike the main island portion 11, there may not be a layer including an inorganic insulating material, which is prone to cracks, in the main bridge portion 12, which is relatively deformed.

In an embodiment, a first portion of the substrate 100 corresponding to the main bridge portion 12 may have the same stacked structure as a second portion of the substrate 100 corresponding to the main island portion 11. In an embodiment, the first portion of the substrate 100 and the second portion of the substrate 100 may be polymer resin layers formed together in the same process. In another embodiment, the first portion of the substrate 100 corresponding to the main bridge portion 12 may have a different stack structure from the second portion of the substrate 100 corresponding to the main island portion 11. In some embodiments, the first portion of the substrate 100 may have a multi-layered structure including a base layer including a polymer resin and a barrier layer including an inorganic insulating material, and the second portion of the substrate 100 may have a structure of a polymer resin layer without a layer including an inorganic insulating material.

In an embodiment and as described above, wiring lines WL of the main bridge portion 12 may be signal lines (e.g., gate lines and data lines) for providing electrical signals to transistors included in the pixel driving circuit PC of the main island portion 11, or voltage lines (e.g., driving voltage lines and initialization voltage lines) for providing voltages. The encapsulation layer 300 may also be arranged in the main bridge portion 12. In another embodiment, the encapsulation layer 300 may not be present in the main bridge portion 12.

Referring to FIGS. 4A to 4C and FIG. 5, the first portion of the substrate 100 corresponding to the main island portion 11 and the second portion of the substrate 100 corresponding to the main bridge portion 12 may be connected to each other. In other words, the plan views shown in FIGS. 4A to 4C may be substantially the same as the plan view of the substrate 100 in FIG. 5. In other words, the substrate 100 may include the first portion corresponding to the main island portion 11, the second portion corresponding to the main bridge portion 12, and an opening 100OP1 having the same shape as the first opening CS1. In the present specification, the fact that a component is disposed on the main island portion 11 may mean that the component is disposed on the first portion, which corresponds to the main island portion 11, of the substrate 100. Likewise, the fact that a component is disposed on the main bridge portion 12 may mean that the component is disposed on the second portion, which corresponds to the main bridge portion 12, of the substrate 100.

In an embodiment, the encapsulation layer 300 corresponding to the main island portion 11 and the encapsulation layer 300 corresponding to the main bridge portion 12 may be connected to each other. For example, the plan views shown in FIGS. 4A to 4C may be substantially the same as the plan view of the encapsulation layer 300. In other words, the encapsulation layer 300 may include an area corresponding to the main island portion 11, an area corresponding to the main bridge portion 12, and an opening 300OP1 having the same shape as the first opening CS1.

In an embodiment, a circuit-light-emitting element layer 200 between the substrate 100 and the encapsulation layer 300 may include a buffer layer 111, a pixel driving circuit PC, a wiring line WL, an insulating layer IL, and a light-emitting element LED. Similar to the substrate 100, the plan view shown in FIGS. 4A to 4C may be substantially the same as the plan view of the circuit-light-emitting element layer 200. In other words, the circuit-light-emitting element layer 200 may include an opening 200OP1 having the same shape as the first opening CS1.

Figure 6A:
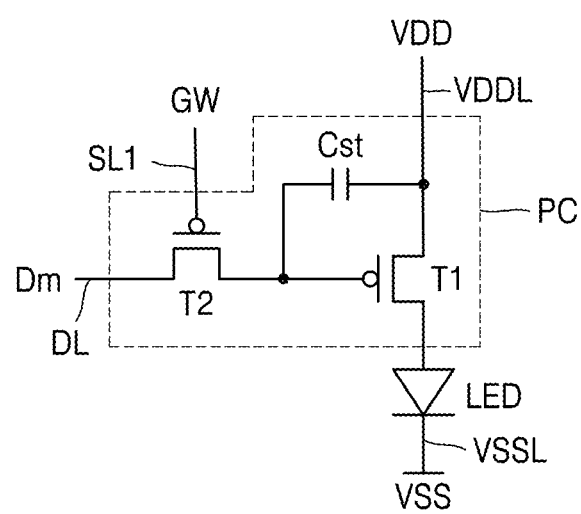
FIG. 6A is an equivalent circuit diagram of a sub-pixel of a display device, according to an embodiment.
Figure 6B:
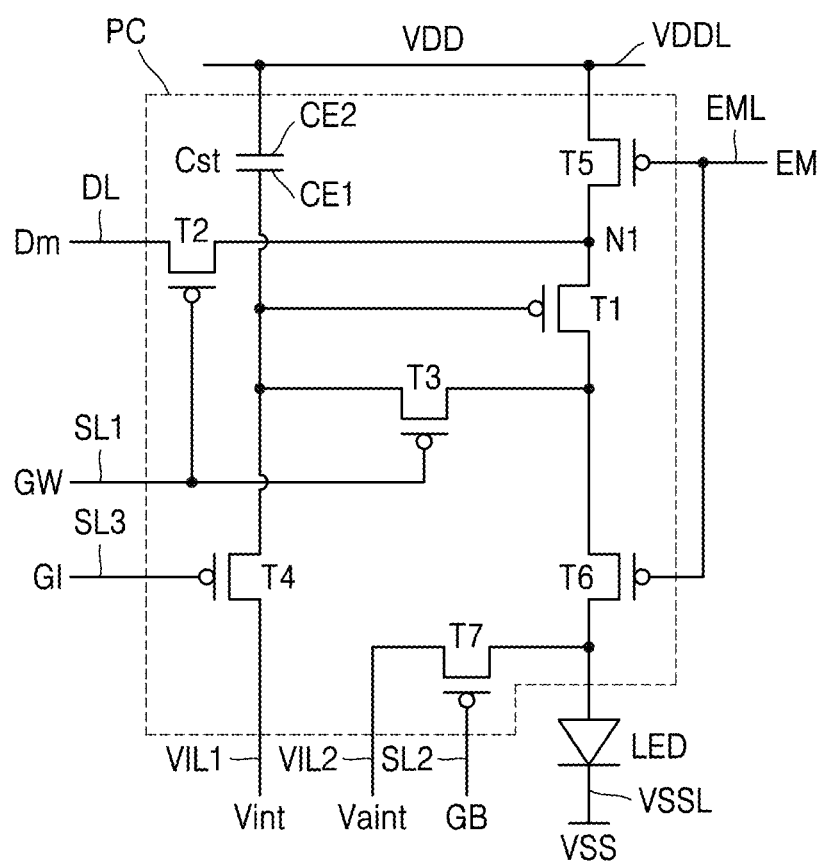
FIG. 6B is an equivalent circuit diagram of a sub-pixel of a display device, according to an embodiment.
Figure 6C:
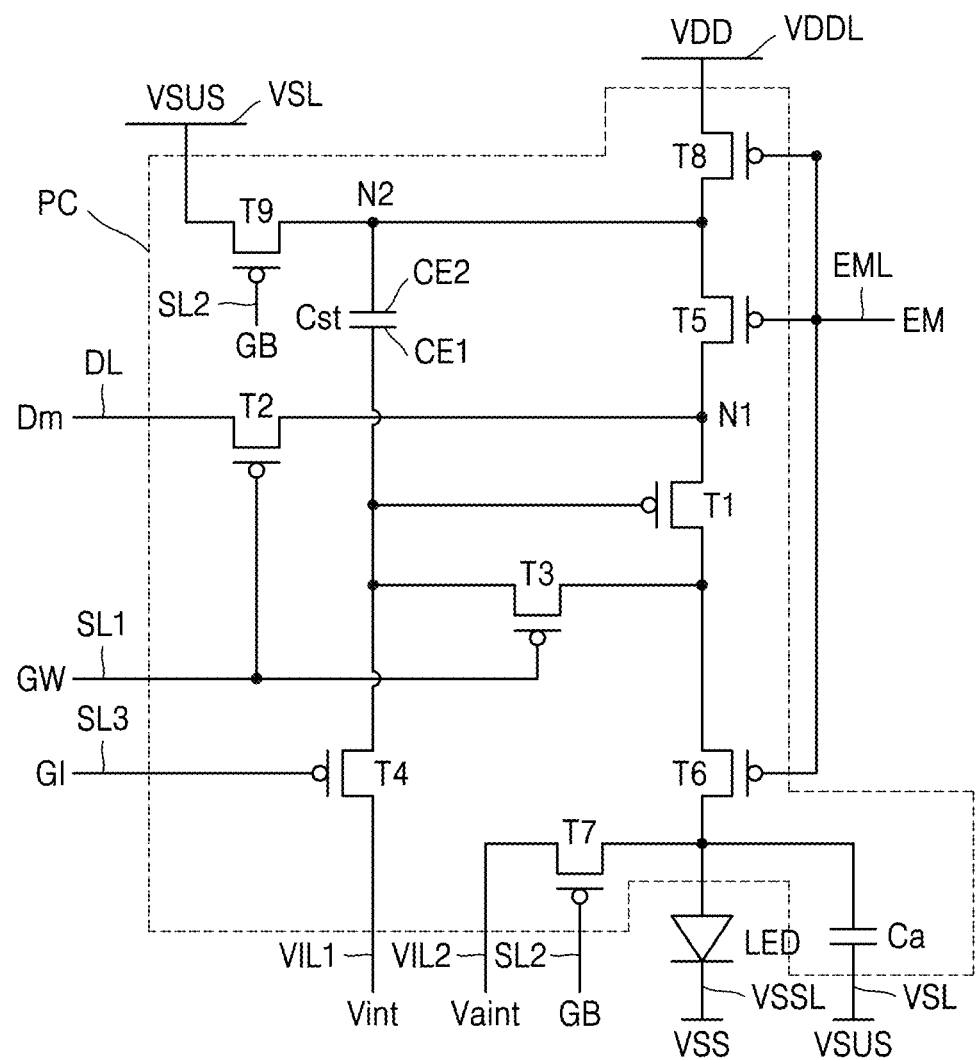
FIG. 6C is an equivalent circuit diagram of a sub-pixel of a display device, according to an embodiment.

FIGS. 6A to 6C are equivalent circuit diagrams of a sub-pixel of the display device 1, according to an embodiment.

In an embodiment and referring to FIG. 6A, a light-emitting element LED corresponding to the sub-pixel may be electrically connected to a pixel driving circuit PC, and the pixel driving circuit PC may include a first transistor T1, a second transistor T2, and a storage capacitor Cst. The pixel driving circuit PC may be electrically connected to a signal line and a voltage line. The signal line may include a gate line such as a first scan line SL1, and a data line DL, and the voltage line may include a driving voltage line VDDL.

In an embodiment, the second transistor T2 may be electrically connected to the first scan line SL1 and the data line DL. The first scan line SL1 may be configured to provide a first scan signal GW to a gate electrode of the second transistor T2. The second transistor T2 may be configured to transmit a data signal Dm input from the data line DL to the first transistor T1 according to the first scan signal GW input from the first scan line SL1.

In an embodiment, the storage capacitor Cst may be electrically connected to the second transistor T2 and the driving voltage line VDDL and may store a voltage corresponding to the difference between a voltage received from the second transistor T2 and a driving power voltage VDD supplied by the driving voltage line VDDL.

In an embodiment, the first transistor T1 may be a driving transistor and may be configured to control a driving current flowing through the light-emitting element LED. The first transistor T1 may be connected to the driving voltage line VDDL and the storage capacitor Cst. The first transistor T1 may be configured to control a driving current flowing from the driving voltage line VDDL to the light-emitting element LED in response to a voltage value stored in the storage capacitor Cst. The light-emitting element LED may emit light having a certain brightness by the driving current. A first electrode of the light-emitting element LED may be electrically connected to the first transistor T1, and a second electrode of the light-emitting element LED may be electrically connected to a common voltage line VSSL that supplies a common power voltage VSS.

FIG. 6A shows and an embodiment where the pixel driving circuit PC includes two transistors and one storage capacitor. However, in another embodiment, the pixel driving circuit PC may include three or more transistors.

In an embodiment and referring to FIG. 6B, a pixel driving circuit PC may include a first transistor T1, a second transistor T2, a third transistor T3, a fourth transistor T4, a fifth transistor T5, a sixth transistor T6, a seventh transistor T7, and a storage capacitor Cst.

In an embodiment, the pixel driving circuit PC is electrically connected to signal lines and voltage lines. The signal lines may include gate lines, such as a first scan line SL1, a second scan line SL2, a third scan line SL3, and an emission control line EML, and a data line DL. The voltage lines may include first and second initialization voltage lines VIL1 and VIL2 and a driving voltage line VDDL.

In an embodiment, the driving voltage line VDDL may be configured to transmit a driving power voltage VDD to the first transistor T1. The first initialization voltage line VIL1 may be configured to transmit a first initialization voltage Vint, which initializes the first transistor T1, to the pixel driving circuit PC. The second initialization voltage line VIL2 may be configured to transmit a second initialization voltage Vaint, which initializes a first electrode of a light-emitting element LED, to the pixel driving circuit PC.

In an embodiment, the first transistor T1 may be electrically connected to the driving voltage line VDDL via the fifth transistor T5 and may be electrically connected to the light-emitting element LED via the sixth transistor T6. The first transistor T1 may function as a driving transistor and may be configured to receive a data signal Dm according to a switching operation of the second transistor T2 and supply a driving current to the light-emitting element LED.

In an embodiment, the second transistor T2 may be a data writing transistor and may be electrically connected to the first scan line SL1 and the data line DL. The second transistor T2 may be electrically connected to the driving voltage line VDDL via the fifth transistor T5. The second transistor T2 may be configured to be turned on according to a first scan signal GW received through the first scan line SL1 and transmit the data signal Dm transmitted to the data line DL to a first node N1. That is, the second transistor T2 may be configured to perform a switching operation.

In an embodiment, the third transistor T3 may be electrically connected to the first scan line SL1 and to the light-emitting element LED via the sixth transistor T6. The third transistor T3 may be configured to be turned on according to a first scan signal GW received through the first scan line SL1 and diode-connect the first transistor T1.

In an embodiment, the fourth transistor T4 may be a first initialization transistor and may be electrically connected to the third scan line SL3 and the first initialization voltage line VIL1. The fourth transistor T4 may be configured to be turned on according to a third scan signal GI received through the third scan line SL3 and transmit the first initialization voltage Vint from the first initialization voltage line VIL1 to a gate electrode of the first transistor T1 to initialize the voltage of the gate electrode of the first transistor T1. The third scan signal GI may correspond to the first scan signal of another pixel driving circuit arranged in the previous row of a corresponding pixel driving circuit PC.

In an embodiment, the fifth transistor T5 may be an operation control transistor, and the sixth transistor T6 may be an emission control transistor. The fifth transistor T5 and the sixth transistor T6 may be electrically connected to the emission control line EML and may be configured to be simultaneously turned on according to an emission control signal EM received through the emission control line EML and form a current path so that a driving current may flow from the driving voltage line VDDL to the light-emitting element LED.

In an embodiment, the seventh transistor T7 may be a second initialization transistor and may be electrically connected to the second scan line SL2, the second initialization voltage line VIL2, and the sixth transistor T6. The seventh transistor T7 may be configured to be turned on according to a second scan signal GB received through the second scan line SL2 and transmit the second initialization voltage Vaint from the second initialization voltage line VIL2 to the first electrode of the light-emitting element LED to initialize the first electrode of the light-emitting element LED.

In an embodiment, the storage capacitor Cst may include a first electrode CE1 and a second electrode CE2. The first electrode CE1 may be electrically connected to the gate electrode of the first transistor T1, and the second electrode CE2 may be electrically connected to the driving voltage line VDDL. The storage capacitor Cst may store and maintains a voltage corresponding to the voltage difference between the driving voltage line VDDL and the gate electrode of the first transistor T1, thereby maintain the voltage applied to the gate electrode of the first transistor T1.

In an embodiment and referring to FIG. 6C, a pixel driving circuit PC may include a first transistor (driving transistor) T1, a second transistor (data writing transistor) T2, a third transistor (first compensation transistor) T3, a fourth transistor (first initialization transistor) T4, a fifth transistor (first emission control transistor) T5, a sixth transistor (second emission control transistor) T6, a seventh transistor (second initialization transistor) T7, an eighth transistor (third emission control transistor) T8, a ninth transistor (second compensation transistor) T9, a storage capacitor Cst, and an auxiliary capacitor Ca.

In an embodiment, the pixel driving circuit PC may be electrically connected to signal lines and voltage lines. The signal lines may include gate lines, such as a first scan line SL1, a second scan line SL2, a third scan line SL3, and an emission control line EML, and a data line DL. The voltage lines may include first and second initialization voltage lines VIL1 and VIL2, a maintenance voltage line VSL, and a driving voltage line VDDL.

In an embodiment, the driving voltage line VDDL may be configured to transmit a driving power voltage VDD to the first transistor T1. The first initialization voltage line VIL1 may be configured to transmit a first initialization voltage Vint, which initializes the first transistor T1, to the pixel driving circuit PC. The second initialization voltage line VIL2 may be configured to transmit a second initialization voltage Vaint, which initializes a first electrode of a light-emitting element LED, to the pixel driving circuit PC. The maintenance voltage line VSL may be configured to provide a maintenance voltage VSUS to a second node N2, for example, a second electrode CE2 of the storage capacitor Cst, during an initialization period and a data writing period.

In an embodiment, the first transistor T1 may have a gate and first and second terminals electrically connected to the first node N1. The first terminal of the first transistor T1 may be electrically connected to the driving voltage line VDDL via the fifth transistor T5 and the eighth transistor T8, and the second terminal of the first transistor T1 may be electrically connected to the light-emitting element LED via the sixth transistor T6. The first transistor T1 may function as a driving transistor and may be configured to receive a data signal Dm according to a switching operation of the second transistor T2 and supply a driving current to the light-emitting element LED.

In an embodiment, the second transistor T2 may be electrically connected to the first scan line SL1, the data line DL, and the first node N1. The second transistor T2 may be electrically connected to the driving voltage line VDDL via the fifth transistor T5 and the eighth transistor T8 through the first node N1. The second transistor T2 may be configured to be turned on according to a first scan signal GW received through the first scan line SL1 and transmit the data signal Dm transmitted to the data line DL to a first node N1. That is, the second transistor T2 may be configured to perform a switching operation.

In an embodiment, the third transistor T3 may be electrically connected to the gate of the first transistor T1 and the second terminal of the first transistor T1. A gate of the third transistor T3 may be electrically connected to the first scan line SL1 and to the light-emitting element LED via the sixth transistor T6. The third transistor T3 may be configured to be turned on according to a first scan signal GW received through the first scan line SL1 and diode-connect the first transistor T1, thereby compensating for the threshold voltage of the first transistor T1.

In an embodiment, the fourth transistor T4 may be electrically connected to the third scan line SL3 and the first initialization voltage line VIL1 and may be configured to be turned on according to a third scan signal GI received through the third scan line SL3 and transmit the first initialization voltage Vint from the first initialization voltage line VIL1 to a gate electrode of the first transistor T1 to initialize the voltage of the gate electrode of the first transistor T1. The third scan signal GI may correspond to the first scan signal of another pixel driving circuit arranged in the previous row of a corresponding pixel driving circuit PC.

In an embodiment, the fifth transistor T5 may be electrically connected to the first node N1 and the second node N2, the sixth transistor T6 may be electrically connected to the second terminal of the first transistor T1 and the light-emitting element LED, and the eighth transistor T8 may be electrically connected to the second node N2 and the driving voltage line VDDL. The fifth transistor T5, the sixth transistor T6, and the eighth transistor T8 may be electrically connected to the emission control line EML and may be configured to be simultaneously turned on according to an emission control signal EM received through the emission control line EML and form a current path so that a driving current may flow from the driving voltage line VDDL to the light-emitting element LED.

In an embodiment, the seventh transistor T7 may be a second initialization transistor and may be electrically connected to the second scan line SL2, the second initialization voltage line VIL2, and the sixth transistor T6. The seventh transistor T7 may be configured to be turned on according to a second scan signal GB received through the second scan line SL2 and transmit the second initialization voltage Vaint from the second initialization voltage line VIL2 to the first electrode of the light-emitting element LED to initialize the first electrode of the light-emitting element LED.

In an embodiment, the ninth transistor T9 may be electrically connected to the second scan line SL2, the second node N2, and the maintenance voltage line VSL. The ninth transistor T9 may be electrically connected to the second electrode CE2 of the storage capacitor Cst through the second node N2. The ninth transistor T9 may be configured to be turned on according to a second scan signal GB received through the second scan line SL2 and transmit a maintenance voltage VSUS to a second node N2, for example, the second electrode CE2 of the storage capacitor Cst, during an initialization period and a data writing period.

In an embodiment, the eighth transistor T8 and the ninth transistor T9 may each be electrically connected to the second node N2, for example, the second electrode CE2 of the storage capacitor Cst. In some embodiments, in the initialization period and the data writing period, the eighth transistor T8 may be turned off and the ninth transistor T9 may be turned on, and in an emission period, the eighth transistor T8 may be turned on and the ninth transistor T9 may be turned off. Because the maintenance voltage VSUS is transmitted to the second node N2 in the initialization period and the data writing period, the uniformity (e.g., long range uniformity (LRU)) of luminance of the display device according to the voltage drop of the driving voltage line VDDL may be improved.

In an embodiment, the storage capacitor Cst may include a first electrode CE1 and a second electrode CE2. The first electrode CE1 may be electrically connected to the gate electrode of the first transistor T1, and the second electrode CE2 may be electrically connected to the eighth transistor T8 and the ninth transistor T9.

In an embodiment, the auxiliary capacitor Ca may be electrically connected to the sixth transistor T6, the maintenance voltage line VSL, and the first electrode of the light-emitting element LED. The auxiliary capacitor Ca may store and maintain a voltage corresponding to the voltage difference between the first electrode of the light-emitting element LED and the maintenance voltage line VSL while the seventh transistor T7 and the ninth transistor T9 are turned on, and thus may prevent black luminance from increasing when the sixth transistor T6 is turned off.

Figure 7A:
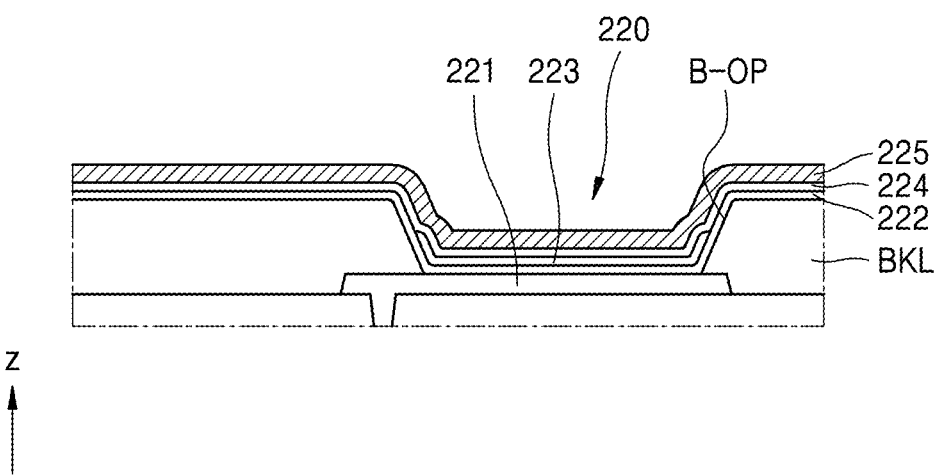
FIG. 7A is a cross-sectional view schematically showing a light-emitting element of a display device, according to an embodiment.

FIG. 7A is a cross-sectional view schematically showing a light-emitting element of a display device, according to an embodiment.

In an embodiment and referring to FIG. 7A, a light-emitting element may include an organic light-emitting diode 220 including an organic material. The organic light-emitting diode 220 may include a first electrode 221 disposed on an insulating layer, a second electrode 225 facing the first electrode 221, and an emission layer 223 disposed between the first electrode 221 and the second electrode 225. A first functional layer 222 may be disposed between the first electrode 221 and the emission layer 223, and a second functional layer 224 may be disposed between the emission layer 223 and the second electrode 225.

In an embodiment, the edge of the first electrode 221 may be covered with a bank layer BKL including an insulating material. The bank layer BKL may include an opening B-OP overlapping a center portion of the first electrode 221.

In an embodiment, the first electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the first electrode 221 may further include a layer formed of ITO, IZO, ZnO, or $In_2O_3$, above/below the reflective layer described above.

In an embodiment, the emission layer 223 may include a polymeric or low-molecular-weight organic material that emits a certain color of light. The first functional layer 222 may include a hole transport layer (HTL) and/or a hole injection layer (HIL). The second functional layer 224 may include an electron transport layer (ETL) and/or an electron injection layer (EIL).

In an embodiment, the second electrode 225 may include a conductive material with a low work function. For example, the second electrode 225 may include a (semi-)transparent layer including Ag, Mg, Al, Pt, Pd, Au, Ni, Nd, Ir, Cr, lithium (Li), calcium (Ca), an alloy thereof, or the like. In another embodiment, the second electrode 225 may further include a layer including ITO, IZO, ZnO, AZO, or $In_2O_3$ on the (semi-) transparent layer including the materials described above.

Figure 7B:
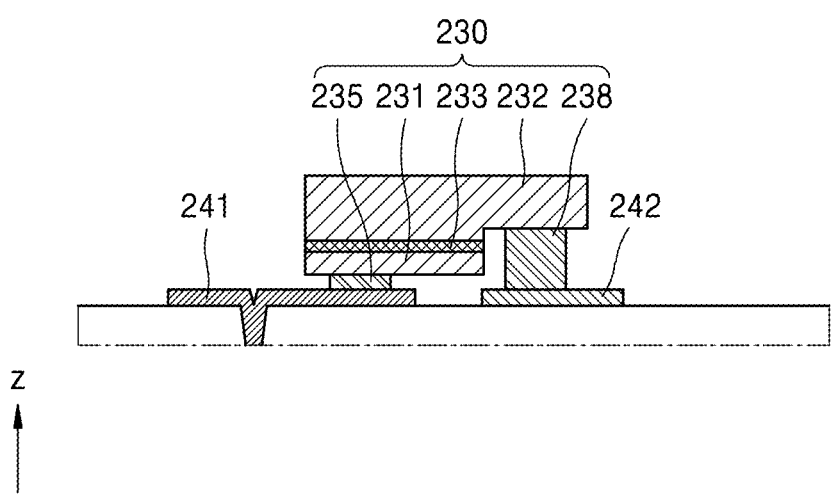
FIG. 7B is a cross-sectional view schematically showing a light-emitting element of a display device, according to an embodiment.

FIG. 7B is a cross-sectional view schematically showing a light-emitting element of a display device, according to an embodiment.

In an embodiment and referring to FIG. 7B, a light-emitting element may include an inorganic light-emitting diode 230 including an inorganic material. The inorganic light-emitting diode 230 may include a first semiconductor layer 231, a second semiconductor layer 232, an intermediate layer 233 between the first semiconductor layer 231 and the second semiconductor layer 232, a first electrode 235 electrically connected to the first semiconductor layer 231, and a second electrode 238 electrically connected to the second semiconductor layer 232. The first electrode 235 and the second electrode 238 of the inorganic light-emitting diode 230 may be electrically connected to a first electrode pad 241 and a second electrode pad 242, respectively, disposed on the same layer.

In some embodiments, the first semiconductor layer 231 may include a p-type semiconductor layer. The p-type semiconductor layer may include a semiconductor material having a composition formula of $In_xAl_yGa_{1-x-y}N$ ($0 \leq x \leq 1$, 0≤y≤1, and 0≤x+y≤1), such as GaN, AlN, AlGaN, InGaN, InN, InAlGaN, or AlInN, and may be doped with a p-type dopant, such as Mg, Zn, Ca, Sr, or Ba.

In an embodiment, the second semiconductor layer 232 may include, for example, an n-type semiconductor layer. The n-type semiconductor layer may include a semiconductor material having a composition formula of $In_xAl_yGa_{1-x-y}N$ (0≤x≤1, 0≤y≤1, and 0≤x+y≤1), such as GaN, AlN, AlGaN, InGaN, InN, InAlGaN, or AlInN, and may be doped with an n-type dopant, such as Si, Ge, and Sn.

In an embodiment, the intermediate layer 233 is a region where electrons and holes recombine. As the electrons and the holes recombine, the intermediate layer 233 may transition to a lower energy level and may generate light with a wavelength corresponding thereto. For example, the intermediate layer 233 may include a semiconductor material having a composition formula of $In_xAl_yGa_{1-x-y}N$ (0≤x≤1, 0≤y≤1, and 0≤x+y≤1), and may be formed to have a single quantum well structure or a multi quantum well (MQW) structure. In addition, the intermediate layer 233 may include a quantum wire structure or a quantum dot structure.

In an embodiment, although FIG. 7B illustrates that the first semiconductor layer 231 includes a p-type semiconductor layer and the second semiconductor layer 232 includes an n-type semiconductor layer, the invention is not limited thereto. In another embodiment, the first semiconductor layer 231 may include an n-type semiconductor layer, and the second semiconductor layer 232 may include a p-type semiconductor layer.

FIGS. 8A to 8F are layer-by-layer layout diagrams schematically showing a main island portion of a display device, according to an embodiment.

In an embodiment and as described with reference to FIGS. 4A to 4C, the display device 1 may include a main island portion 11 arranged in the display area DA and a plurality of main bridge portions 12 connected to the main island portion 11. The main island portion 11 may include a plurality of sub-pixels, and the main bridge portion 12 may include wiring lines electrically connected to the sub-pixels.

In an embodiment, the main island portion 11 may have a first boundary E1 and a second boundary E2, which extend in a second direction (e.g., y direction and/or −y direction) and are disposed on both sides of the main island portion 11, and a third boundary E3 and a fourth boundary E4, which extend in a first direction (e.g., x direction and/or −x direction) and connect the first boundary E1 to the second boundary E2.

In an embodiment, a first sub-pixel, a second sub-pixel, and a third sub-pixel, which emit light of different colors, may be arranged in the main island portion 11. The first sub-pixel may include a first light-emitting element and a first pixel driving circuit connected to the first light-emitting element, the second sub-pixel may include a second light-emitting element and a second pixel driving circuit connected to the second light-emitting element, and the third sub-pixel may include a third light-emitting element and a third pixel driving circuit connected to the third light-emitting element. The invention is not limited thereto, and one sub-pixel, two sub-pixels, or four sub-pixels may be arraigned in the main island portion 11.

In an embodiment, the first pixel driving circuit may be arranged in a first circuit area PCA1, the second pixel driving circuit may be arranged in a second circuit area PCA2, and the third pixel driving circuit may be arranged in a third circuit area PCA3. The first circuit area PCA1, the second circuit area PCA2, and the third circuit area PCA3 may be arranged side by side in the first direction (e.g., x direction and/or −x direction). A first connection area CA1 may be arranged between the first boundary E1 of the main island portion 11 and the first circuit area PCA1, and a second connection area CA2 may be arranged between the second boundary E2 of the main island portion 11 and the third circuit area PCA3. In the first connection area CA1 and the second connection area CA2, wiring lines extending from the main bridge portions 12 to the main island portion 11 may be arranged.

In an embodiment, the first pixel driving circuit, the second pixel driving circuit, and the third pixel driving circuit may have substantially the same or similar structures. Hereinafter, elements will be described focusing on the first pixel driving circuit arranged in the first circuit area PCA1, and description of the same or similar elements arranged in the second circuit area PCA2 and the third circuit area PCA3 will be omitted.

In an embodiment, the main island portion 11 may include a semiconductor layer 1100, a first conductive layer 1200, a second conductive layer 1300, a third conductive layer 1400, a fourth conductive layer 1500, a fifth conductive layer 1600, and a sixth conductive layer 1700, which are sequentially stacked on the substrate 100 (see FIG. 5). The semiconductor layer 1100, the first conductive layer 1200, the second conductive layer 1300, the third conductive layer 1400, the fourth conductive layer 1500, the fifth conductive layer 1600, and the sixth conductive layer 1700 may form signal lines and voltage lines connected to the pixel driving circuits PC (see FIG. 6C) and transistors and capacitors connected to the pixel driving circuits PC (see FIG. 6C).

Figure 8A:
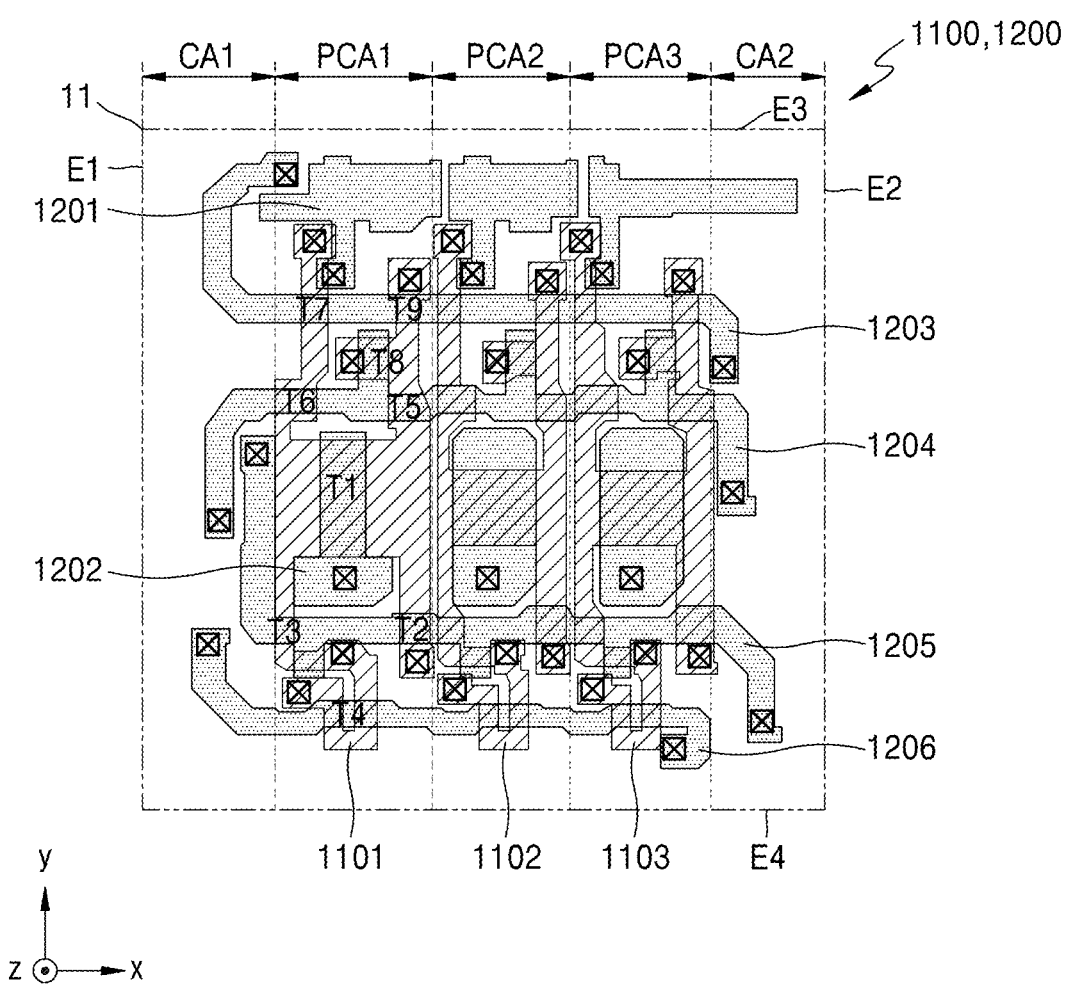
FIG. 8A is a layer-by-layer layout diagram schematically showing an island portion of a display device, according to an embodiment.

In an embodiment, FIG. 8A shows the semiconductor layer 1100 and the first conductive layer 1200 disposed on the semiconductor layer 1100. The semiconductor layer 1100 may be disposed on the substrate 100 (see FIG. 5), and a buffer layer 111 (see FIG. 5) may be disposed between the semiconductor layer 1100 and the substrate 100 (see FIG. 5). One or more insulating layers (e.g., first gate insulating layer) may be disposed between the semiconductor layer 1100 and the first conductive layer 1200.

In an embodiment and referring to FIG. 8A, the semiconductor layer 1100 may include a first semiconductor pattern 1101, a second semiconductor pattern 1102, and a third semiconductor pattern 1103. The first pixel driving circuit may include the first semiconductor pattern 1101, the second pixel driving circuit may include the second semiconductor pattern 1102, and the third pixel driving circuit may include the third semiconductor pattern 1103.

In an embodiment, the first semiconductor pattern 1101 may be arranged in the first circuit area PCA1, the second semiconductor pattern 1102 may be arranged in the second circuit area PCA2, and the third semiconductor pattern 1103 may be arranged in the third circuit area PCA3.

In an embodiment, the semiconductor layer 1100 may include a silicon-based semiconductor material, such as polysilicon. In another embodiment, the semiconductor layer 1100 may include an oxide-based semiconductor material, for example, oxide of at least one material selected from the group including indium (In), gallium (Ga), stanium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

In an embodiment, the first conductive layer 1200 may include first conductive patterns 1201, second conductive patterns 1202, a third conductive pattern 1203, a fourth conductive pattern 1204, a fifth conductive pattern 1205, and a sixth conductive pattern 1206. The first conductive layer 1200 may include a conductive material, such as molybdenum (Mo), aluminum (Al), copper (Cu), or titanium (Ti), and may be formed as a multilayer or single layer including the aforementioned material.

In an embodiment, the first conductive patterns 1201 may be arranged in the first circuit area PCA1, the second circuit area PCA2, and the third circuit area PCA3, respectively. The first conductive pattern 1201 arranged in the first circuit area PCA1 may extend to the first connection area CA1. The first conductive pattern 1201 arranged in the third circuit area PCA3 may extend to the second connection area CA2. The first conductive patterns 1201 may be arranged adjacent to the third boundary E3 of the main island portion 11. The first conductive patterns 1201 may function as the first electrode (lower electrode) of the auxiliary capacitor Ca (see FIG. 6C).

In an embodiment, the second conductive patterns 1202 may be arranged in the first circuit area PCA1, the second circuit area PCA2, and the third circuit area PCA3, respectively. The second conductive patterns 1202 may overlap the first semiconductor pattern 1101, the second semiconductor pattern 1102, and the third semiconductor pattern 1103, respectively, to form the first transistors T1. Each of the second conductive patterns 1202 may include the gate electrode of the first transistor T1. That is, a portion of the first semiconductor pattern 1101 that overlaps the second conductive pattern 1202 may be a channel region of the first transistor T1, and impurity regions that function as the first or second terminal thereof may extend to both sides of the channel region of the first transistor T1.

In an embodiment, the width of the first semiconductor pattern 1101, which functions as a channel region of the first transistor T1, in the second direction (e.g., y direction and/or −y direction) may be greater than the widths of the second semiconductor pattern 1102 and the third semiconductor pattern 1103, which function as the channel region of the first transistor T1, in the second direction (e.g., y direction and/or −y direction). In an embodiment, the width of the second conductive pattern 1202, which is arranged in the first circuit area PCA1, in the first direction (e.g., x direction and/or −x direction) may be less than the width of the second conductive pattern 1202, which is arranged in the second circuit area PCA2 and the third circuit area PCA3, in the first direction (e.g., x direction and/or −x direction).

In an embodiment, the third conductive pattern 1203 (second gate line) may extend from the first connection area CA1 to the second connection area CA2 across the first circuit area PCA1, the second circuit area PCA2, and the third circuit area PCA3. The third conductive pattern 1203 may overlap the first semiconductor pattern 1101, the second semiconductor pattern 1102, and the third semiconductor pattern 1103. The third conductive pattern 1203 may overlap the first semiconductor pattern 1101, the second semiconductor pattern 1102, and the third semiconductor pattern 1103 to form the seventh transistors T7 and the ninth transistors T9. The third conductive pattern 1203 may include the gate electrode of the seventh transistor T7 and the gate electrode of the ninth transistor T9.

In an embodiment, the fourth conductive pattern 1204 (fourth gate line) may extend from the first connection area CA1 to the second connection area CA2 across the first circuit area PCA1, the second circuit area PCA2, and the third circuit area PCA3. The fourth conductive pattern 1204 may overlap the first semiconductor pattern 1101, the second semiconductor pattern 1102, and the third semiconductor pattern 1103 to form the fifth transistors T5, the sixth transistors T6, and the eighth transistors T8. That is, the fourth conductive pattern 1204 may include the gate electrode of the fifth transistor T5, the gate electrode of the sixth transistor T6, and the gate electrode of the eighth transistor T8.

In an embodiment, the fifth conductive pattern 1205 (first gate line) may extend from the first connection area CA1 to the second connection area CA2 across the first circuit area PCA1, the second circuit area PCA2, and the third circuit area PCA3. The fifth conductive pattern 1205 may overlap the first semiconductor pattern 1101, the second semiconductor pattern 1102, and the third semiconductor pattern 1103 to form the second transistors T2 and the third transistors T3. The fifth conductive pattern 1205 may include the gate electrode of the second transistor T2 and the gate electrode of the third transistor T3.

In an embodiment, the sixth conductive pattern 1206 (third gate line) may extend from the first connection area CA1 to the third circuit area PCA3 across the first circuit area PCA1 and the second circuit area PCA2. The sixth conductive pattern 1206 may overlap the first semiconductor pattern 1101, the second semiconductor pattern 1102, and the third semiconductor pattern 1103 to form the fourth transistors T4. The sixth conductive pattern 1206 may include the gate electrode of the fourth transistor T4.

Figure 8B:
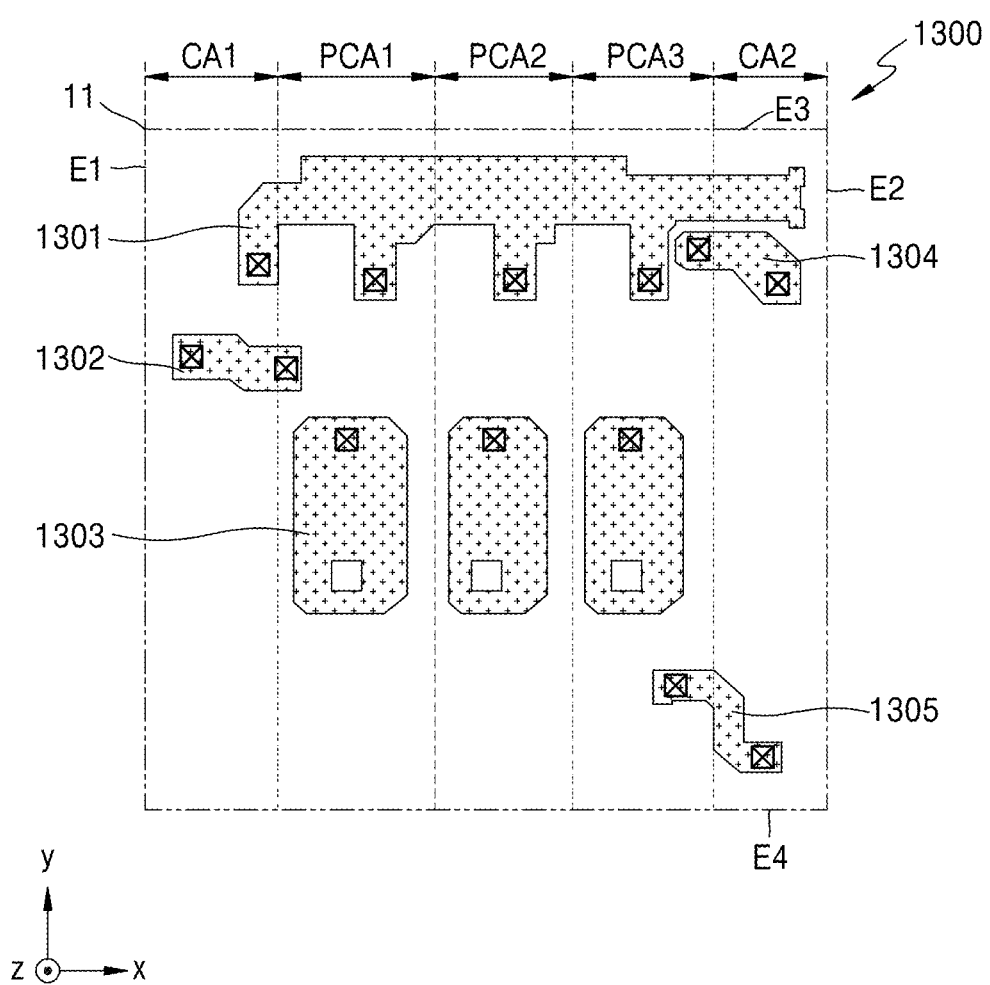
FIG. 8B is a layer-by-layer layout diagram schematically showing an island portion of a display device, according to an embodiment.

In an embodiment and referring to FIG. 8B, the second conductive layer 1300 may include a seventh conductive pattern 1301, an eighth conductive pattern 1302, a ninth conductive pattern 1303, a tenth conductive pattern 1304, and an eleventh conductive pattern. 1305. The second conductive layer 1300 may be disposed on the first conductive layer 1200, and one or more insulating layers (e.g., a second gate insulating layer) may be arranged between the first conductive layer 1200 and the second conductive layer 1300. The second conductive layer 1300 may include a conductive material, such as Mo, Al, Cu, or Ti, and may be formed as a multilayer or single layer including the aforementioned material.

In an embodiment, the seventh conductive pattern 1301 may extend from the first connection area CA1 to the second connection area CA2 across the first circuit area PCA1, the second circuit area PCA2, and the third circuit area PCA3. The seventh conductive pattern 1301 may be disposed to overlap the first conductive pattern 1201 and may function as the second electrode (upper electrode) of the auxiliary capacitor Ca (see FIG. 6C).

In an embodiment, the eighth conductive pattern 1302 may be arranged in the first connection area CA1 and the first circuit area PCA1. The eighth conductive pattern 1302 may be a connection electrode for connecting a maintenance voltage line VSL to the seventh conductive pattern 1301.

In an embodiment, the ninth conductive pattern 1303 may be arranged in each of the first circuit area PCA1, the second circuit area PCA2, and the third circuit area PCA3. The ninth conductive pattern 1303 may be disposed to overlap the second conductive pattern 1202 of the first conductive layer 1200, and may define an opening exposing a portion of the second conductive pattern 1202. The ninth conductive pattern 1303 may function as the second electrode CE2 (see FIG. 6C) of the storage capacitor Cst (see FIG. 6C), and the second conductive pattern 1202 overlapping the ninth conductive pattern 1303 may function as the first electrode CE1 (see FIG. 6C) of the storage capacitor (Cst).

In an embodiment, the tenth conductive pattern 1304 may be arranged in the third circuit area PCA3 and the second connection area CA2. The tenth conductive pattern 1304 may be a connection electrode for connecting a 2nd-1 initialization voltage line VIL2*a* to a 2nd-2 initialization voltage line VIL2*b*.

In an embodiment, the eleventh conductive pattern 1305 may be arranged in the third circuit area PCA3 and the second connection area CA2. The eleventh conductive pattern 1305 may be a connection electrode for connecting a 1st-1 initialization voltage line VIL1*a* to a 1st-2 initialization voltage line VIL1*b*.

Figure 8C:
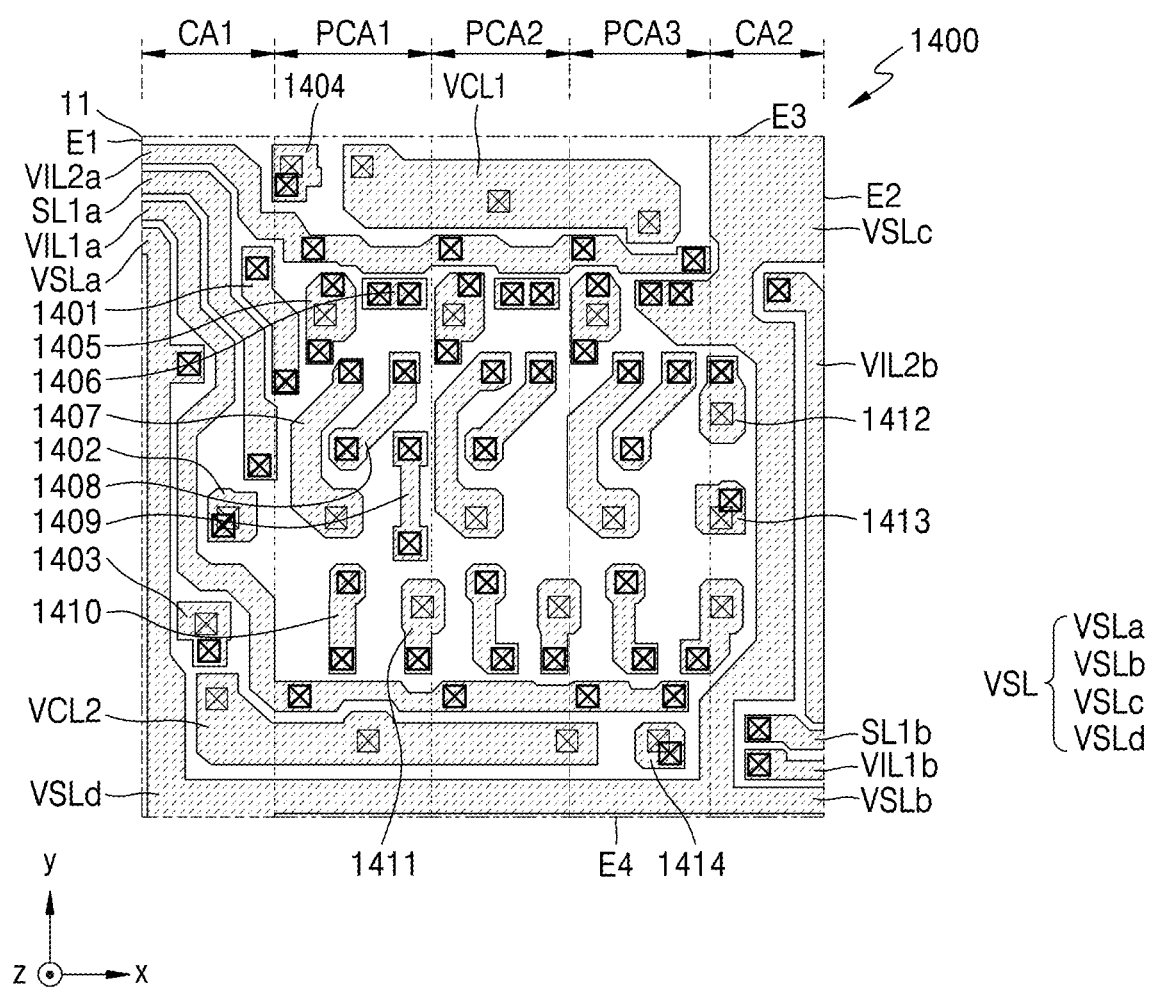
FIG. 8C is a layer-by-layer layout diagram schematically showing an island portion of a display device, according to an embodiment.

In an embodiment and referring to FIG. 8C, the third conductive layer 1400 may include a 12th conductive pattern 1401 to a 25th conductive pattern 1414, a first voltage connection line VCL1, and a second voltage connection line VCL2. The third conductive layer 1400 may further include wiring lines WL (see FIG. 5) extending from the main island portion 11 to main bridge portions. The third conductive layer 1400 may be disposed on the second conductive layer 1300, and one or more insulating layers (e.g., an interlayer insulating layer) may be disposed between the second conductive layer 1300 and the third conductive layer 1400.

In an embodiment, the third conductive layer 1400 may include a stretchable conductive material. The third conductive layer 1400 may include a conductive material, such as Mo, Al, Cu, or Ti, and may be formed as a multilayer or single layer including the aforementioned material. For example, the third conductive layer 1400 may be formed as a multilayer including Ti/Al/Ti layers.

In an embodiment, the 12th conductive pattern 1401 may be arranged in the first connection area CA1 and the first circuit area PCA1. The 12th conductive pattern 1401 may be connected to the seventh conductive pattern 1301 and the eighth conductive pattern 1302 of the second conductive layer 1300 through contact holes.

In an embodiment, the 13th conductive pattern 1402 may be arranged in the first connection area CA1, and the 24th conductive pattern 1413 may be arranged in the second connection area CA2. Each of the 13th conductive pattern 1402 and the 24th conductive pattern 1413 may be connected to the fourth conductive pattern 1204 of the first conductive layer 1200 through a contact hole. The 13th conductive pattern 1402 may be connected to a first emission control line EMLa of the fourth conductive layer 1500 through a contact hole, and the 24th conductive pattern 1413 may be connected to a second emission control line EMLb of the fourth conductive layer 1500 through a contact hole.

In an embodiment, the 14th conductive pattern 1403 may be arranged in the first connection area CA1, and the 25th conductive pattern 1414 may be arranged in the third circuit area PCA3. Each of the 14th conductive pattern 1403 and the 25th conductive pattern 1414 may be connected to the sixth conductive pattern 1206 of the first conductive layer 1200 through a contact hole. The 14th conductive pattern 1403 may be connected to a 3rd-1 scan line SL3*a* of the fourth conductive layer 1500 through a contact hole, and the 25th conductive pattern 1414 may be connected to a 3rd-2 scan line SL3*b* of the fourth conductive layer 1500 through a contact hole.

In an embodiment, the 15th conductive pattern 1404 may be arranged in the first circuit area PCA1, and the 23rd conductive pattern 1412 may be arranged in the second connection area CA2. Each of the 15th conductive pattern 1404 and the 23rd conductive pattern 1412 may be connected to the third conductive pattern 1203 of the first conductive layer 1200 through a contact hole. The 15th conductive pattern 1404 may be connected to a 2nd-1 scan line SL2*a* of the fourth conductive layer 1500 through a contact hole, and the 23rd conductive pattern 1412 may be connected to a 2nd-2 scan line SL2*b* of the fourth conductive layer 1500 through a contact hole.

In an embodiment, the 16th conductive patterns 1405 may be arranged in the first circuit area PCA1, the second circuit area PCA2, and the third circuit area PCA3, respectively. Each of the 16th conductive patterns 1405 may be connected to the first semiconductor pattern 1101, the second semiconductor pattern 1102, or the third semiconductor pattern 1103 of the semiconductor layer 1100 through a contact hole. Each of the 16th conductive patterns 1405 may be connected to the first conductive pattern 1201 of the first conductive layer 1200 and the 26th conductive pattern 1501 of the fourth conductive layer 1500 through contact holes. The 16th conductive pattern 1405 may connect the sixth transistor T6, the seventh transistor T7, the first electrode pad 241 of the light-emitting element LED (see FIG. 6C), and the first electrode of the auxiliary capacitor Ca (see FIG. 6C) to each other.

In an embodiment, the 17th conductive patterns 1406 may be arranged in the first circuit area PCA1, the second circuit area PCA2, and the third circuit area PCA3, respectively. Each of the 17th conductive patterns 1406 may be connected to the first semiconductor pattern 1101, the second semiconductor pattern 1102, or the third semiconductor pattern 1103 of the semiconductor layer 1100 through a contact hole. Each of the 17th conductive patterns 1406 may be connected to the seventh conductive pattern 1301 of the second conductive layer 1300 through a contact hole. The 17th conductive pattern 1406 may transmit the maintenance voltage VSUS (see FIG. 6C) to the ninth transistor T9.

In an embodiment, the 18th conductive patterns 1407 may be arranged in the first circuit area PCA1, the second circuit area PCA2, and the third circuit area PCA3, respectively. Each of the 18th conductive patterns 1407 may be connected to the first semiconductor pattern 1101, the second semiconductor pattern 1102, or the third semiconductor pattern 1103 of the semiconductor layer 1100 through a contact hole. Each of the 18th conductive patterns 1407 may be connected to the third voltage connection line VCL3 of the fourth conductive layer 1500 through a contact hole. The 18th conductive pattern 1407 may transmit the driving power voltage VDD (see FIG. 6C) to the eighth transistor T8.

In an embodiment, the 19th conductive patterns 1408 may be arranged in the first circuit area PCA1, the second circuit area PCA2, and the third circuit area PCA3, respectively. Each of the 19th conductive patterns 1408 may be connected to the first semiconductor pattern 1101, the second semiconductor pattern 1102, or the third semiconductor pattern 1103 of the semiconductor layer 1100 through a contact hole. Each of the 19th conductive patterns 1408 may be connected to the ninth conductive pattern 1303 of the second conductive layer 1300 through a contact hole. The 19th conductive pattern 1408 may connect the eighth transistor T8 and the second electrode CE2 (see FIG. 6C) of the storage capacitor Cst (see FIG. 6C) to each other.

In an embodiment, the 20th conductive pattern 1409 may be arranged in the first circuit area PCA1. The 20th conductive pattern 1409 may be connected to the first semiconductor pattern 1101 of the semiconductor layer 1100 through contact holes. The 20th conductive pattern 1409 may connect the second transistor T2 and the fifth transistor T5 of the first pixel driving circuit to each other.

In an embodiment, the 21st conductive patterns 1410 may be arranged in the first circuit area PCA1, the second circuit area PCA2, and the third circuit area PCA3. Each of the 21st conductive patterns 1410 may be connected to the first semiconductor pattern 1101, the second semiconductor pattern 1102, or the third semiconductor pattern 1103 of the semiconductor layer 1100 through a contact hole. Each of the 21st conductive patterns 1410 may be connected to the second conductive pattern 1202 of the first conductive layer 1200 through a contact hole. The 21st conductive pattern 1410 may connect the third transistor T3, the fourth transistor T4, and the first electrode CE1 (see FIG. 6C) of the storage capacitor Cst (see FIG. 6C) to each other.

In an embodiment, the 22nd conductive patterns 1411 may be arranged in the first circuit area PCA1, the second circuit area PCA2, and the third circuit area PCA3. For example, the 22nd conductive pattern 1411 arranged in the first circuit area PCA1 may be connected to the first semiconductor pattern 1101 of the semiconductor layer 1100 and the first data line DL1 of the fourth conductive layer 1500 through contact holes. Likewise, the 22nd conductive pattern 1411 arranged in the second circuit area PCA2 may be connected to the second semiconductor pattern 1102 of the semiconductor layer 1100 and the second data line DL2 of the fourth conductive layer 1500 through contact holes, and the 22nd conductive pattern 1411 arranged in the third circuit area PCA3 may be connected to the third semiconductor pattern 1103 of the semiconductor layer 1100 and the third data line DL3 of the fourth conductive layer 1500 through contact holes. The 22nd conductive pattern 1411 may connect the second transistor T2 and the data line DL to each other.

In an embodiment, the first voltage connection line VCL1 may extend from the first circuit area PCA1 to the third circuit area PCA3 across the second circuit area PCA2. The first voltage connection line VCL1 may be connected to the third voltage connection lines VCL3 of the fourth conductive layer 1500 through contact holes.

In an embodiment, he second voltage connection line VCL2 may extend from the first connection area CA1 to the third circuit area PCA3 across the first circuit area PCA1 and the second circuit area PCA2. The second voltage connection line VCL2 may be connected to the third voltage connection lines VCL3 of the fourth conductive layer 1500 through contact holes.

In an embodiment, the main bridge portions may include a first bridge portion extending from the first boundary E1 of the main island portion 11, a second bridge portion extending from the second boundary E2, a third bridge portion extending from the third boundary E3, and a fourth bridge portion extending from the fourth boundary E4.

In an embodiment, the third conductive layer 1400 may include a 1st-1 initialization voltage line VIL1a, a 2nd-1 initialization voltage line VIL2a, a 1st-1 scan line SL1a, and a first maintenance voltage line VSLa, which extend from the main island portion 11 to the first bridge portion. The third conductive layer 1400 may include a 1st-2 initialization voltage line VIL1b, a 2nd-2 initialization voltage line VIL2b, a 1st-2 scan line SL1b, and a second maintenance voltage line VSLb, which extend from the main island portion 11 to the second bridge portion. In addition, the third conductive layer 1400 may include a third maintenance voltage line VSLc extending from the main island portion 11 to the third bridge portion and a fourth maintenance voltage line VSLd extending from the main island portion 11 to the fourth bridge portion.

In an embodiment, the maintenance voltage line VSL (first voltage line) configured to transmit the maintenance voltage VSUS (see FIG. 6C) may include a first maintenance voltage line VSLa, a second maintenance voltage line VSLb, a third maintenance voltage line VSLc, and a fourth maintenance voltage line VSLd. The first maintenance voltage line VSLa, the second maintenance voltage line VSLb, the third maintenance voltage line VSLc, and the fourth maintenance voltage line VSLd may extend along the first boundary E1, the second boundary E2, and the fourth boundary E4 of the main island portion 11 and be connected to each other.

In an embodiment, the first maintenance voltage line VSLa and the second maintenance voltage line VSLb, which connect main island portions 11 that are disposed adjacent to each other in the first direction (e.g., x direction and/or −x direction), and the third maintenance voltage line VSLc and the fourth maintenance voltage line VSLd, which connect main island portions 11 that are disposed adjacent to each other in the second direction (e.g., y direction and/or −y direction) may be connected to each other within the main island portion 11. The first maintenance voltage line VSLa, the second maintenance voltage line VSLb, the third maintenance voltage line VSLc, and the fourth maintenance voltage line VSLd may be provided as one body in the third conductive layer 1400. Accordingly, the maintenance voltage line VSL may have a mesh structure in the display area DA (see FIG. 1) of the display device 1 (see FIG. 1).

In an embodiment, the first maintenance voltage line VSLa may be connected to the eighth conductive pattern 1302 of the second conductive layer 1300 through a contact hole. The eighth conductive pattern 1302 may be connected to the 12th conductive pattern 1401 of the third conductive layer 1400, and the 12th conductive pattern 1401 may be connected to the seventh conductive pattern 1301 of the second conductive layer 1300. The seventh conductive pattern 1301 may be connected to the first semiconductor pattern 1101 and the second semiconductor pattern 1102 of the semiconductor layer 1100 through the 17th conductive patterns 1406. The third maintenance voltage line VSLc may be connected to the third semiconductor pattern 1103 of the semiconductor layer 1100 and the seventh conductive pattern 1301 of the second conductive layer 1300 through contact holes.

In an embodiment, the first initialization voltage line VIL1 (see FIG. 6C) configured to transmit the first initialization voltage Vint (see FIG. 6C) may include a 1st-1 initialization voltage line VIL1a and a 1st-2 initialization voltage line VIL1b, which connect main island portions that are disposed adjacent to each other in the first direction (e.g., x direction and/or −x direction). The 1st-1 initialization voltage line VIL1a may extend in a direction substantially parallel to the first boundary E1 in the first connection area CA1 and may extend from the first connection area CA1 to the third circuit area PCA3 across the first circuit area PCA1 and the second circuit area CA2. The 1st-1 initialization voltage line VIL1a may be connected to the first semiconductor pattern 1101, the second semiconductor pattern 1102, and the third semiconductor pattern 1103 of the semiconductor layer 1100 through contact holes. The 1st-1 initialization voltage line VIL1a and the 1st-2 initialization voltage line VIL1b may be connected to each other within the main island portion 11 through the eleventh conductive pattern 1305 of the second conductive layer 1300. For example, the eleventh conductive pattern 1305 may overlap the third maintenance voltage line VSLc in a plan view. The 1st-1 initialization voltage line VIL1a and the 1st-2 initialization voltage line VIL1b may be respectively connected to both ends of the eleventh conductive pattern 1305 and electrically connected to each other without contacting the third maintenance voltage line VSLc.

In an embodiment, the second initialization voltage line VIL2 (see FIG. 6C) configured to transmit the second initialization voltage Vaint (see FIG. 6C) may include a 2nd-1 initialization voltage line VIL2a and a 2nd-2 initialization voltage line VIL2b, which connect main island portions that are disposed adjacent to each other in the first direction (e.g., x direction and/or -x direction). The 2nd-1 initialization voltage line VIL2a may extend from the first connection area CA1 to the third circuit area PCA3 across the first circuit area PCA1 and the second circuit area PCA2. The 2nd-2 initialization voltage line VIL2b may extend from the second connection area CA2 along the second boundary E2. The 2nd-1 initialization voltage line VIL2a may be connected to each of the first semiconductor pattern 1101, the second semiconductor pattern 1102, and the third semiconductor pattern 1103 through contact holes. The 2nd-1 initialization voltage line VIL2a and the 2nd-2 initialization voltage line VIL2b may be connected to each other within the main island portion 11 through the tenth conductive pattern 1304 of the second conductive layer 1300. For example, the tenth conductive pattern 1304 may overlap the third maintenance voltage line VSLc in a plan view. The 2nd-1 initialization voltage line VIL2a and the 2nd-2 initialization voltage line VIL2b may be respectively connected to both ends of the tenth conductive pattern 1304 and electrically connected to each other without contacting the third maintenance voltage line VSLc.

In an embodiment, the first scan line SL1 (see FIG. 6C) configured to transmit the first scan signal GW (see FIG. 6C) may include a 1st-1 scan line SL1a and a 1st-2 scan line SL1b, which connect main island portions that are disposed adjacent to each other in the first direction (e.g., x direction and/or -x direction). The 1st-1 scan line SL1a may extend in a direction that is substantially parallel to the first boundary E1 in the first connection area CA1. The 1st-2 scan line SL1b may be arranged in the second connection area CA2, and the 1st-1 scan line SL1a and the 1st-2 scan line SL1b may be connected to each other through the fifth conductive pattern 1205 of the first conductive layer 1200.

Figure 8D:
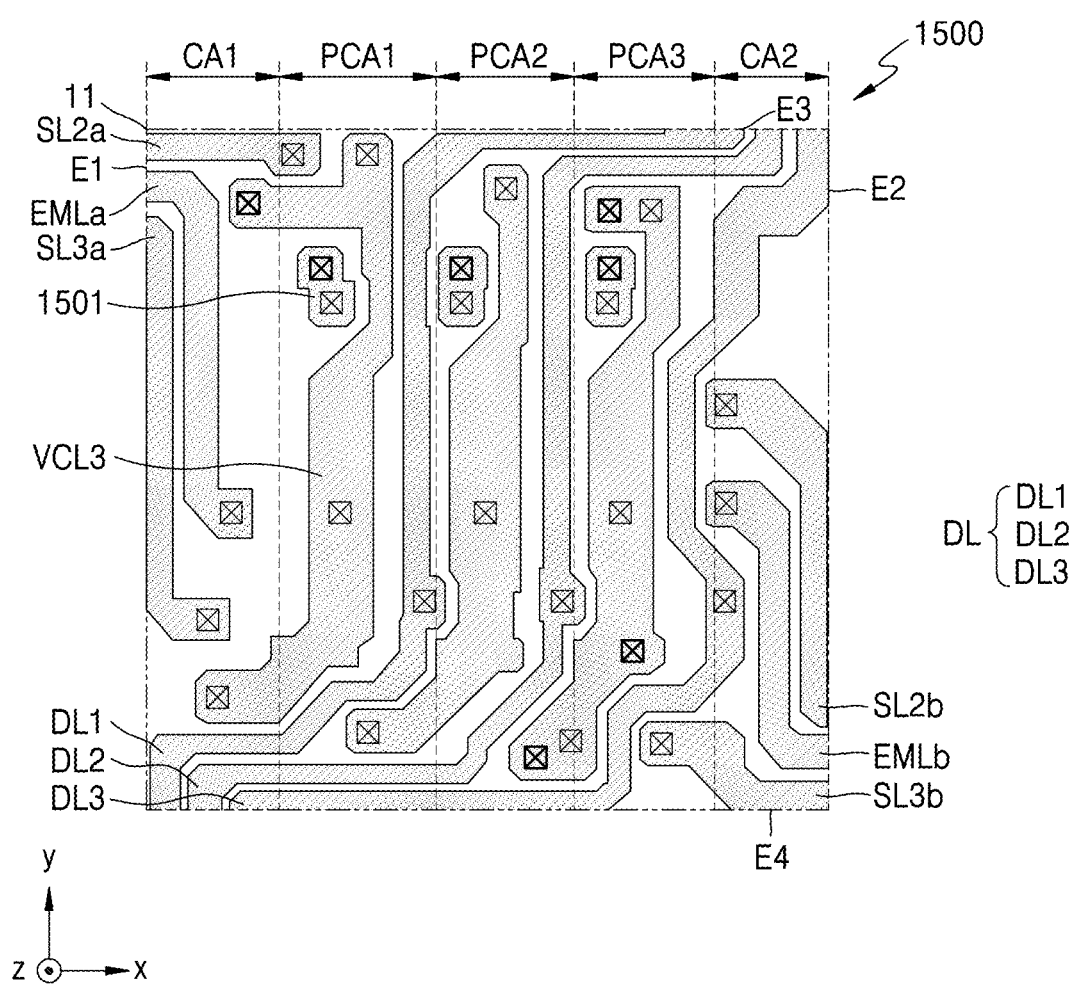
FIG. 8D is a layer-by-layer layout diagram schematically showing an island portion of a display device, according to an embodiment.

In an embodiment and referring to FIG. 8D, the fourth conductive layer 1500 may include a 26th conductive pattern 1501 and third voltage connection lines VCL3. In addition, the fourth conductive layer 1500 may further include wiring lines WL (see FIG. 5) extending from the main island portion 11 to the main bridge portions. For example, the fourth conductive layer 1500 may include signal lines extending from the main island portion 11 to the first bridge portion or the second bridge portion and data lines DL extending from the main island portion 11 to the third bridge portion and the fourth bridge portion. The fourth conductive layer 1500 may be disposed on the third conductive layer 1400, and one or more organic insulating layers (e.g., a first organic insulating layer may be disposed between the third conductive layer 1400 and the fourth conductive layer 1500.

In an embodiment, the fourth conductive layer 1500 may include a stretchable conductive material. The fourth conductive layer 1500 may include a conductive material, such as Mo, Al, Cu, or Ti, and may be formed as a multilayer or single layer including the aforementioned material. For example, the fourth conductive layer 1500 may be formed as a multilayer of Ti/Al/Ti.

In an embodiment, the 26th conductive patterns 1501 may be arranged in the first circuit area PCA1, the second circuit area PCA2, and the third circuit area PCA3, respectively. Each of the 26th conductive patterns 1501 may be connected to the 16th conductive pattern 1405 of the third conductive layer 1400 and the 27th conductive pattern 1601 of the fifth conductive layer 1600 through contact holes. The 26th conductive pattern 1501 may connect the sixth transistor T6, the seventh transistor T7, the first electrode of the light-emitting element LED (see FIG. 6C), and the first electrode of the auxiliary capacitor Ca (see FIG. 6C) to each other.

In an embodiment, each of the third voltage connection lines VCL3 may be connected to the first pixel driving circuit, the second pixel driving circuit, or the third pixel driving circuit. The third voltage connection line VCL3 of the first pixel driving circuit may extend from the first circuit area PCA1 to the first connection area CA1, the third voltage connection line VCL3 of the second pixel driving circuit may extend from the second circuit area PCA2 to the first circuit area PCA1, and the third voltage connection line VCL3 of the third pixel driving circuit may extend from the third circuit area PCA3 to the second circuit area PCA2. Each of the third voltage connection lines VCL3 may be connected to the 18th conductive pattern 1407, the first voltage connection line VCL1, and the second voltage connection line VCL2 of the third conductive layer 1400 through contact holes.

In an embodiment, the third voltage connection line VCL3 of the first pixel driving circuit may be connected to a first driving voltage line VDDLa of the fifth conductive layer 1600 through a contact hole. The third voltage connection line VCL3 of the third pixel driving circuit may be connected to a second driving voltage line VDDLb, a third driving voltage line VDDLc, and a fourth driving voltage line VDDLd of the fifth conductive layer 1600 through contact holes. The first driving voltage line VDDLa to the fourth driving voltage line VDDLd may be connected to each other within the main island portion 11 through the first voltage connection line VCL1, the second voltage connection line VCL2, and the third voltage connection line VCL3. Accordingly, the driving voltage line VDDL including the first to fourth driving voltage lines VDDLa to VDDLd may have a mesh structure in the display area DA (see FIG. 1) of the display device.

In an embodiment and as described above, the fourth conductive layer 1500 may include signal lines extending from the main island portion 11 to the first bridge portion or the second bridge portion. The signal lines may include a 2nd-1 scan line SL2a, a first emission control line EMLa, and a 3rd-1 scan line SL3a, which extend from the main island portion 11 to the first bridge portion. In addition, the signal lines may include a 2nd-2 scan line SL2b, a second emission control line EMLb, and a 3rd-2 scan line SL3b, which extend from the main island portion 11 to the second bridge portion. The fourth conductive layer 1500 may include data lines DL extending from the third bridge portion to the fourth bridge portion across the main island portion 11.

In an embodiment, the second scan line SL2 (see FIG. 6C) configured to transmit the second scan signal GB (see FIG. 6C) may include a 2nd-1 scan line SL2a and a 2nd-2 scan line SL2b, which connect main island portions that are disposed adjacent to each other in the first direction (e.g., x direction and/or -x direction). The 2nd-1 scan line SL2a may extend from the first connection area CA1 to the first circuit area PCA1 along the third boundary E3, and the 2nd-2 scan line SL2b may extend from the second connection area CA2 along the second boundary E2. The 2nd-1 scan line SL2a and the 2nd-2 scan line SL2b may be connected to each other within the main island portion 11 through the 15th conductive pattern 1404 of the third conductive layer 1400, the third conductive pattern 1203 of the first conductive layer 1200, and the 23rd conductive pattern 1412 of the third conductive layer 1400.

In an embodiment, the emission control line EML (see FIG. 6C) configured to transmit the emission control signal EM (see FIG. 6C) may include a first emission control line EMLa and a second emission control line EMLb, which connect main island portions 11 that are disposed adjacent to each other in the first direction (e.g., x direction and/or −x direction). The first emission control line EMLa may extend in a direction substantially parallel to the first boundary E1 in the first connection area CA1, and the second emission control line EMLb may extend in a direction substantially parallel to the second boundary E2 in the second connection area CA2. The first emission control line EMLa and the second emission control line EMLb may be connected to each other within the main island portion 11 through the 13th conductive pattern 1402 of the third conductive layer 1400, the fourth conductive pattern 1204 of the first conductive layer 1200, and the 24th conductive pattern 1413 of the third conductive layer 1400.

In an embodiment, the third scan line SL3 (see FIG. 6C) configured to transmit the third scan signal GI (see FIG. 6C) may include a 3rd-1 scan line SL3a and a 3rd-2 scan line SL3b, which connect main island portions that are disposed adjacent to each other in the first direction (e.g., x direction and/or −x direction). The 3rd-1 scan line SL3a may extend from the first connection area CA1 along the first boundary E1, and the 3rd-2 scan line SL3b may extend from the second connection area CA2 to the third circuit area PCA3 along the fourth boundary E4. The 3rd-1 scan line SL3a and the 3rd-2 scan line SL3b may be connected to each other within the main island portion 11 through the 14th conductive pattern 1403 of the third conductive layer 1400, the sixth conductive pattern 1206 of the first conductive layer 1200, and the 25th conductive pattern 1414 of the third conductive layer 1400.

In an embodiment, the data lines DL may include a first data line DL1 connected to the first pixel driving circuit, a second data line DL2 connected to the second pixel driving circuit, and a third data line DL3 connected to the third pixel driving circuit.

In an embodiment, the first data line DL1, the second data line DL2, and the third data line DL3 may extend from the first connection area CA1 to the second connection area CA2 across the first circuit area PCA1, the second circuit area PCA2, and the third circuit area PCA3. The first data line DL1, the second data line DL2, and the third data line DL3 may extend from the third boundary E3 of the main island portion 11 to the fourth boundary E4 thereof. In this case, the first data line DL1 may cross the first circuit area PCA1 approximately in the second direction (e.g., y direction and/or −y direction), the second data line DL2 may cross the second circuit area PCA2 approximately in the second direction (e.g., y direction and/or −y direction), and the third data line DL3 may cross the third circuit area PCA3 approximately in the second direction (e.g., y direction and/or −y direction).

In an embodiment, each of the first data line DL1, the second data line DL2, and the third data line DL3 may be connected to the first semiconductor pattern 1101, the second semiconductor pattern 1102, or the third semiconductor pattern 1103 of the semiconductor layer 1100 through the 22nd conductive pattern 1411. Each of the first data line DL1, the second data line DL2, and the third data line DL3 may transmit a data signal Dm (see FIG. 6C) to the second transistor T2 of a corresponding pixel driving circuit.

Figure 8E:
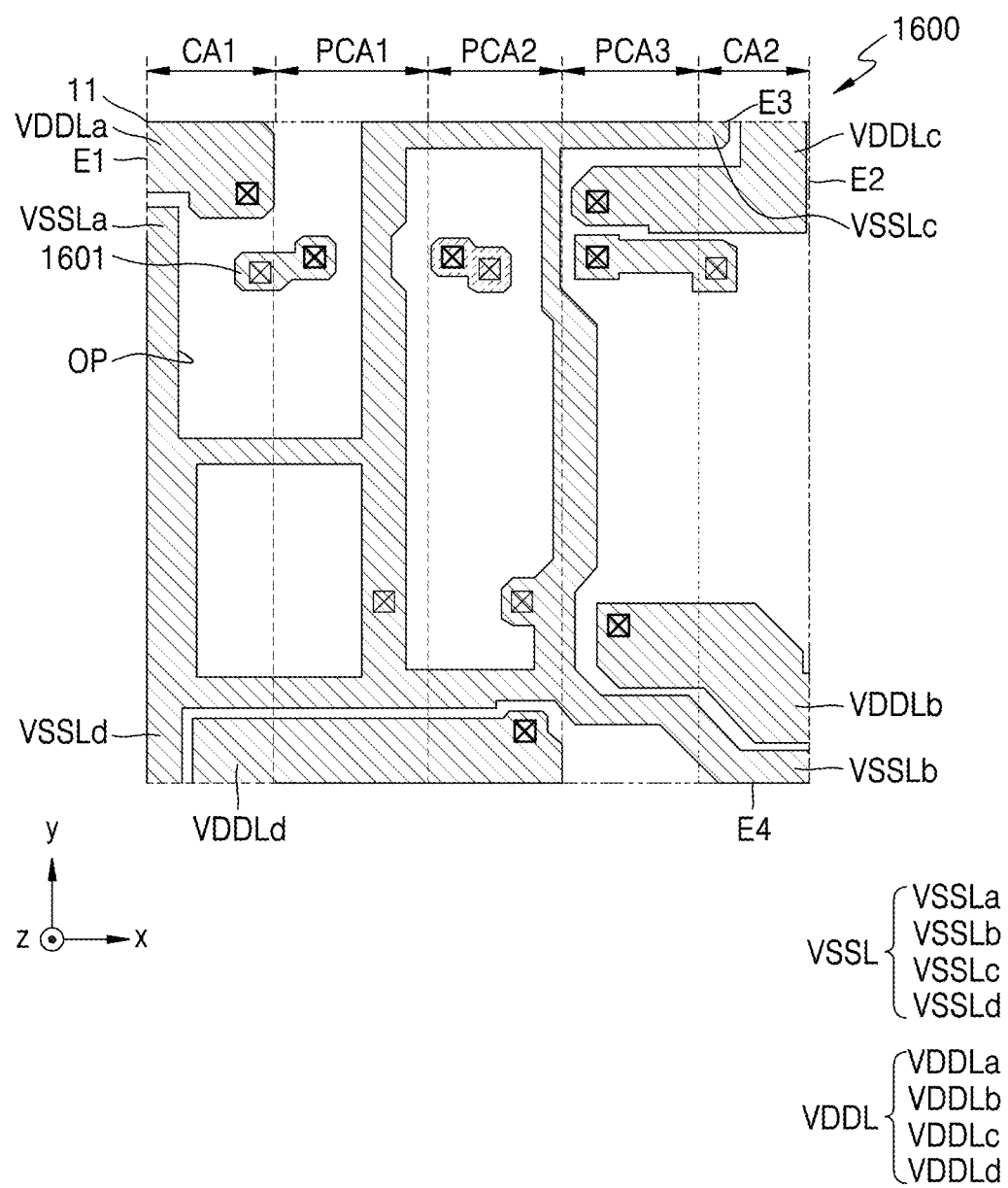
FIG. 8E is a layer-by-layer layout diagram schematically showing an island portion of a display device, according to an embodiment.

In an embodiment and referring to FIG. 8E, the fifth conductive layer 1600 may include the 27th conductive patterns 1601, and a common voltage line VSSL (second voltage line) and a driving voltage line VDDL (third voltage line), which extend from the main island portion 11 to main bridge portions. The fifth conductive layer 1600 may be disposed on the fourth conductive layer 1500, and one or more organic insulating layers (e.g., a second organic insulating layer) may be disposed between the fourth conductive layer 1500 and the fifth conductive layer 1600.

In an embodiment, the fifth conductive layer 1600 may include a stretchable conductive material. The fifth conductive layer 1600 may include a conductive material, such as Mo, Al, Cu, or Ti, and may be formed as a multilayer or single layer including the aforementioned material. For example, the fifth conductive layer 1600 may be formed as a multilayer including Ti/Al/Ti layers.

In an embodiment, the 27th conductive patterns 1601 may be arranged in the first circuit area PCA1, the second circuit area PCA2, and the third circuit area PCA3, respectively. The 27th conductive pattern 1601 of the first pixel driving circuit may extend from the first circuit area PCA1 to the first connection area CA1, and the 27th conductive pattern 1601 of the third pixel driving circuit may extend from the third circuit area PCA3 to the second connection area CA2. Each of the 27th conductive patterns 1601 may be connected to the 26th conductive pattern 1501 of the fourth conductive layer 1500 and the first electrode pad 241 of the sixth conductive layer 1700 through contact holes. The 27th conductive pattern 1601 may connect the first electrode pad 241 of the light-emitting element LED (see FIG. 6C) to the sixth transistor T6, the seventh transistor T7, and the first electrode of the auxiliary capacitor Ca (see FIG. 6C) through the 16th conductive pattern 1405 of the third conductive layer 1400 and the 26th conductive pattern 1501 of the fourth conductive layer 1500.

In an embodiment, the driving voltage line VDDL configured to transmit the driving power voltage VDD (see FIG. 6C) may include a first driving voltage line VDDLa extending from the main island portion 11 to the first bridge portion, a second driving voltage line VDDLb extending from the main island portion 11 to the second bridge portion, a third driving voltage line VDDLc extending from the main island portion 11 to the third bridge portion, and a fourth driving voltage line VDDLd extending from the main island portion 11 to the fourth bridge portion.

In an embodiment, the first driving voltage line VDDLa may be connected to the third voltage connection line VCL3 (see FIG. 8E) of the first pixel circuit driving portion through a contact hole. The second driving voltage line VDDLb, the third driving voltage line VDDLc, and the fourth driving voltage line VDDLd may each be connected to the third voltage connection line VCL3 of the third pixel circuit driving portion through a contact hole. The third voltage connection line VCL3 may be connected to the first voltage connection line VCL1 and the second voltage connection line VCL2 of the third conductive layer 1400 through contact holes.

In an embodiment, the first driving voltage line VDDLa and the second driving voltage line VDDLb, which connect main island portions 11 that are disposed adjacent to each other in the first direction (e.g., x direction and/or −x direction), and the third driving voltage line VDDLc and the fourth driving voltage line VDDLd, which connect main island portions 11 that are disposed adjacent to each other in the second direction (e.g., y direction and/or −y direction) may be connected to each other within the main island portion 11 through the first to third voltage connection lines VCL1, VCL2, and VCL3. The first to third voltage connection lines VCL1, VCL2, and VCL3 may be arranged in a different layer from the first driving voltage line VDDLa, the second driving voltage line VDDLb, the third driving voltage line VDDLc, and the fourth driving voltage line VDDLd.

In an embodiment, the common voltage line VSSL configured to transmit the common power voltage VSS (see FIG. 6C) may include a first common voltage line VSSLa extending from the main island portion 11 to the first bridge portion, a second common voltage line VSSLb extending from the main island portion 11 to the second bridge portion, a third common voltage line VSSLc extending from the main island portion 11 to the third bridge portion, and a fourth common voltage line VSSLd extending from the main island portion 11 to the fourth bridge portion.

In an embodiment, the first common voltage line VSSLa, the second common voltage line VSSLb, the third common voltage line VSSLc, and the fourth common voltage line VSSLd may extend in the first direction (e.g., x direction and/or −x direction) and the second direction (e.g., y direction and/or −y direction) within the main island portion 11 and be connected to each other. The first common voltage line VSSLa, the second common voltage line VSSLb, the third common voltage line VSSLc, and the fourth common voltage line VSSLd may be provided as one body. Openings OP may be defined between the first common voltage line VSSLa, the second common voltage line VSSLb, the third common voltage line VSSLc, and the fourth common voltage line VSSLd.

In an embodiment, the first common voltage line VSSLa and the second common voltage line VSSLb, which connect main island portions 11 that are disposed adjacent to each other in the first direction (e.g., x direction and/or −x direction), and the third common voltage line VSSLc and the fourth common voltage line VSSLd, which connect main island portions 11 that are disposed adjacent to each other in the second direction (e.g., y direction and/or −y direction) may be connected to each other within the main island portion 11. Accordingly, the common voltage line VSSL may have a mesh structure in the display area DA (see FIG. 1) of the display device 1 (see FIG. 1).

Figure 8F:
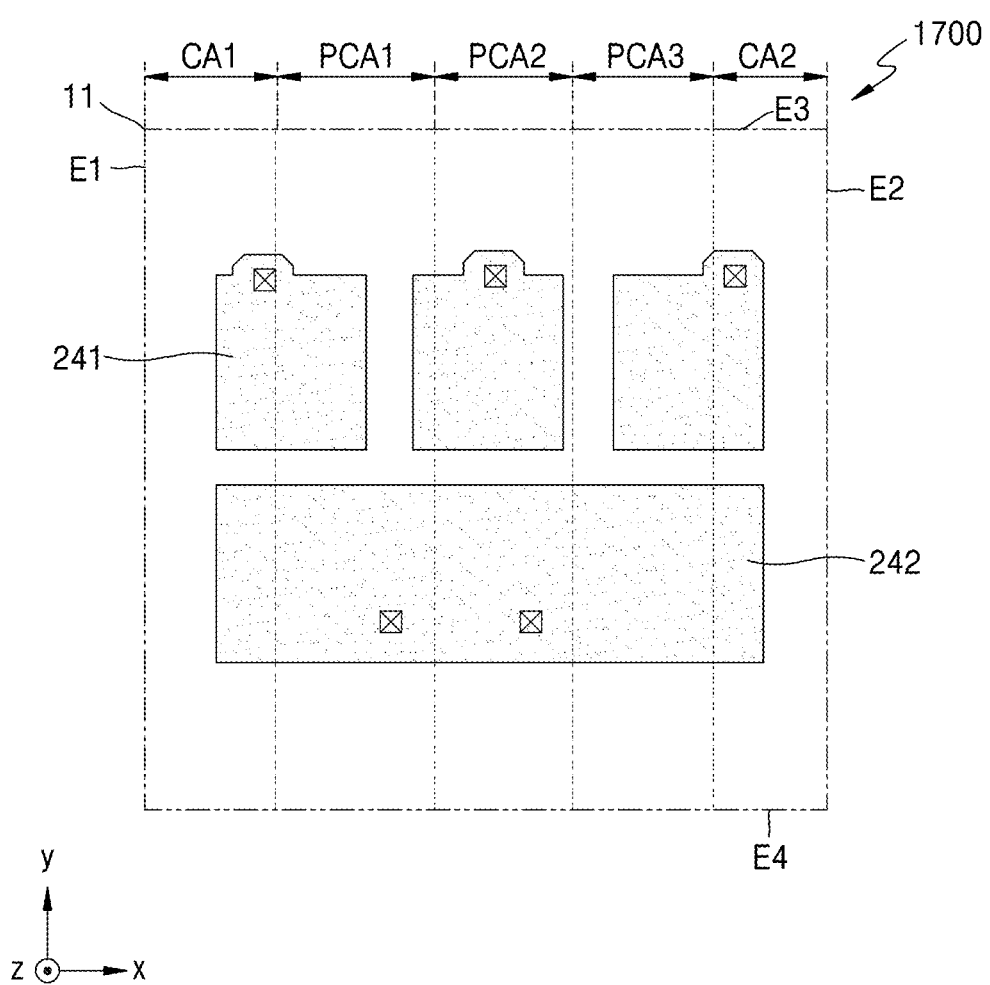
FIG. 8F is a layer-by-layer layout diagram schematically showing an island portion of a display device, according to an embodiment.

In an embodiment and referring to FIG. 8F, the sixth conductive layer 1700 may include first electrode pads 241 and a second electrode pad 242. The sixth conductive layer 1700 may be disposed on the fifth conductive layer 1600, and one or more organic insulating layers (e.g., a third organic insulating layer) may be disposed between the fifth conductive layer 1600 and the sixth conductive layer 1700. The sixth conductive layer 1700 may include a conductive material, such as Mo, Al, Cu, or Ti, and may be formed as a multilayer or single layer including the aforementioned material. In an embodiment, when the first electrode pads 241 and the second electrode pad 242 are connected to the electrodes of the light-emitting element LED (see FIG. 6C) by eutectic bonding, the sixth conductive layer 1700 may have a multi-layered structure including a Cu layer or may include a Cu alloy. In another embodiment, the sixth conductive layer 1700 may include a conductive organic material. For example, the sixth conductive layer 1700 may contain carbon black or may include an organic material containing carbon black. In another embodiment, the sixth conductive layer 1700 may include a conductive oxide, such as ITO, IZO, ZnO, In2O3, IGO, or AZO. In another embodiment, the sixth conductive layer 1700 may include a reflective layer including Ag, Mg, Al, Pt, Pd, Au, Ni, Nd, Ir, Cr, or a compound thereof. In another embodiment, the sixth conductive layer 1700 may further include a layer formed of ITO, IZO, ZnO, AZO, or $In_2O_3$ above/below the reflective layer described above. For example, the sixth conductive layer 1700 may include an ITO layer/Ag layer/ITO layer.

In an embodiment, the first electrode pads 241 may be connected to the first pixel driving circuit, the second pixel driving circuit, and the third pixel driving circuit, respectively. Each of the first electrode pads 241 may have an island shape. The first electrode pad 241 may be connected to the 27th conductive pattern 1601 of the fifth conductive layer 1600 through a contact hole. The first electrode pad 241 may connect the first electrode of the light-emitting element LED (see FIG. 6C) to the sixth transistor T6, the seventh transistor T7, and the first electrode of the auxiliary capacitor Ca (see FIG. 6C).

In an embodiment, the second electrode pad 242 may extend from the first connection area CA1 to the second connection area CA2 across the first circuit area PCA1, the second circuit area PCA2, and the third circuit area PCA3. The second electrode pad 242 may have an island shape in which the length in the first direction (e.g., x direction and/or −x direction) is greater than the length in the second direction (e.g., y direction and/or −y direction). The second electrode pad 242 may be provided in common in the light-emitting elements arranged in the main island portion 11. For example, the second electrode of each of the first light-emitting element, the second light-emitting element, and the third light-emitting element may be connected to the second electrode pad 242. The second electrode pad 242 may be connected to the common voltage line VSSL of the fifth conductive layer 1600 through contact holes.

In an embodiment and as shown in FIG. 8F, the light-emitting element includes an inorganic light-emitting diode 230 (see FIG. 7B), but in other embodiments, the light-emitting element may include an organic light-emitting diode 220 (see FIG. 7A). For example, the sixth conductive layer 1700 may include a first electrode 221 (see FIG. 7A) instead of the first electrode pad 241. In this case, the sixth conductive layer 1700 may include a conductive oxide, such as ITO, IZO, ZnO, $In_2O_3$, IGO, or AZO. In another embodiment, the sixth conductive layer 1700 may include a reflective layer including Ag, Mg, Al, Pt, Pd, Au, Ni, Nd, Ir, Cr, or a compound thereof. In another embodiment, the sixth conductive layer 1700 may further include a layer formed of ITO, IZO, ZnO, AZO, or $In_2O_3$ above/below the reflective layer described above.

Figure 9A:
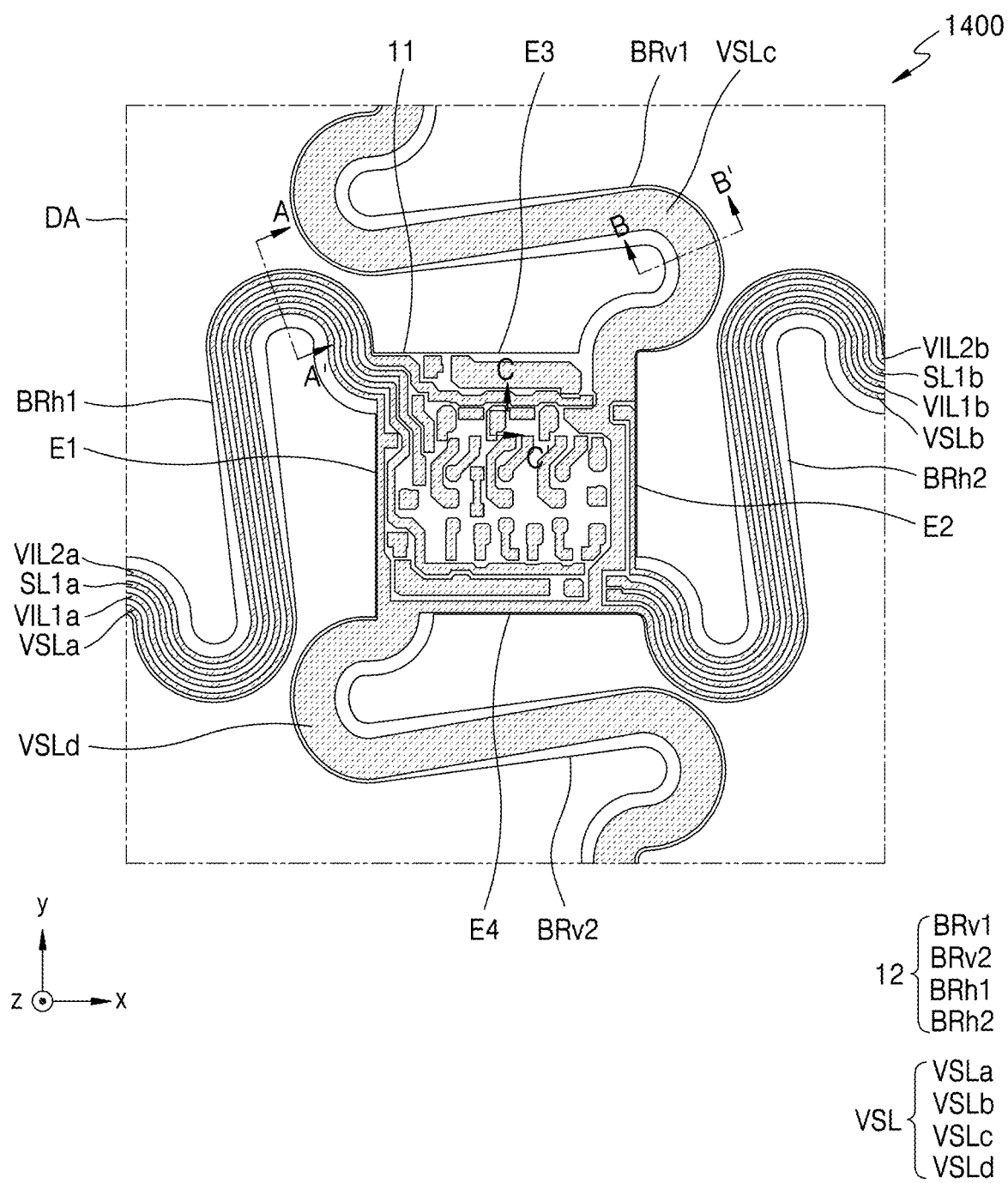
FIG. 9A is a layout diagram schematically showing a third conductive layer of a display device, according to an embodiment.
Figure 9B:
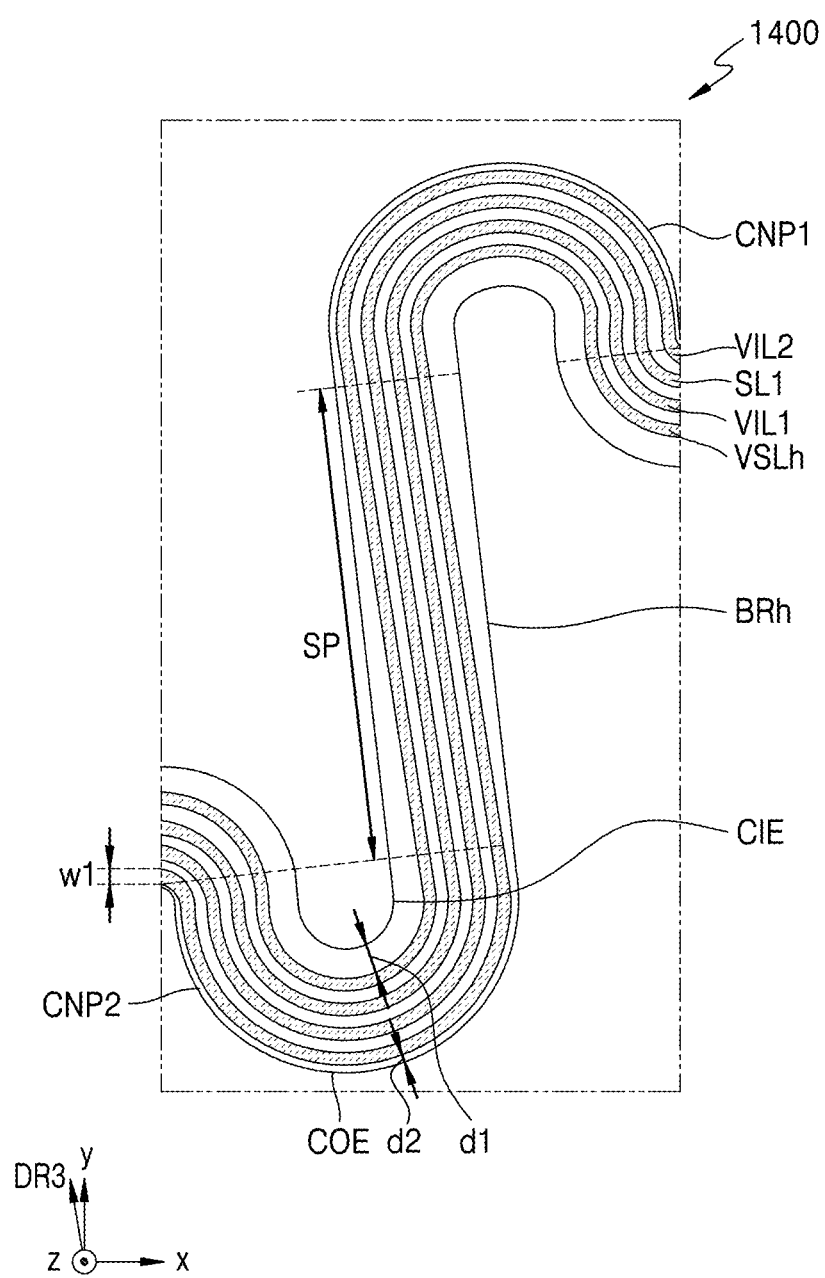
FIG. 9B is a layout diagram schematically showing a portion of a third conductive layer of a display device, according to an embodiment.
Figure 9C:
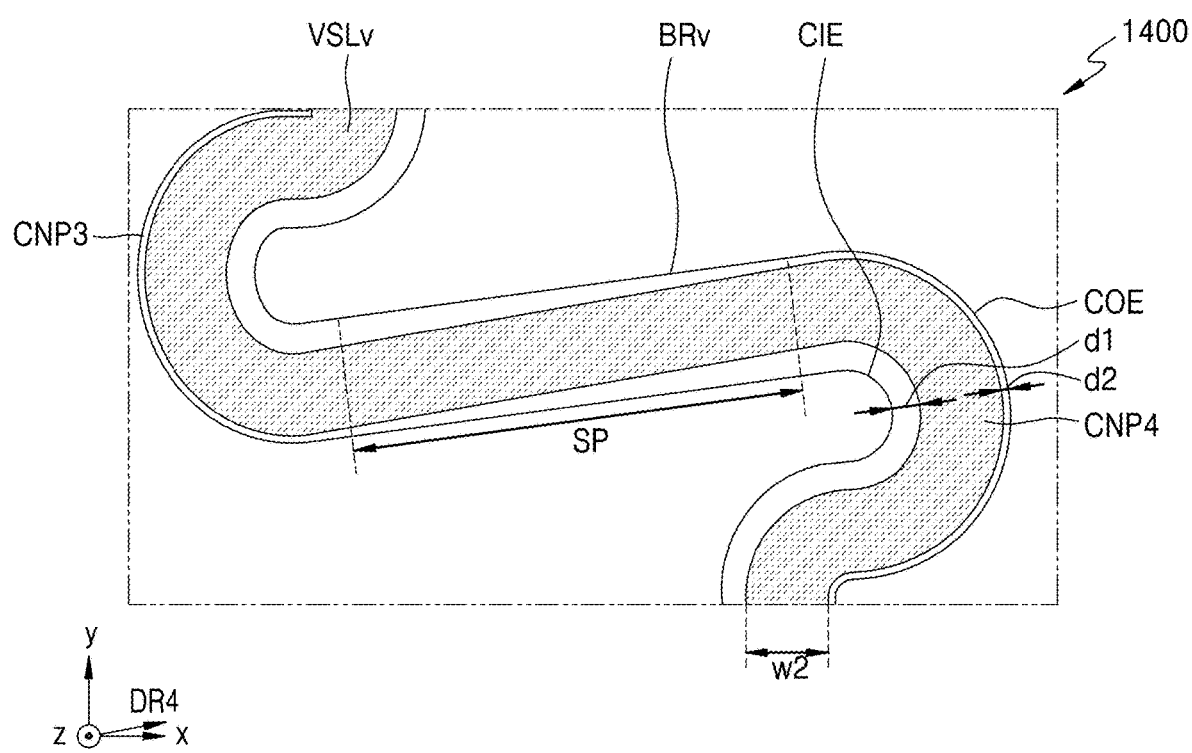
FIG. 9C is a layout diagram schematically showing a portion of a third conductive layer of a display device, according to an embodiment.

FIG. 9A is a layout diagram schematically showing a third conductive layer 1400 of a display device, according to an embodiment, and FIGS. 9B and 9C are layout diagrams schematically showing a portion of a third conductive layer 1400 of a display device, according to an embodiment.

In an embodiment and referring to FIGS. 9A to 9C, the display device may include, in a display area DA, a main island portion 11 and a plurality of main bridge portions 12 connected to the main island portion 11. The main bridge portion 12 may include horizontal bridge portions BRh extending from a main island portion 11 in a first direction (e.g., x direction and/or −x direction) and vertical bridge portions BRv extending from the main island portion 11 in a second direction (e.g., y direction and/or −y direction).

In an embodiment, the horizontal bridge portions BRh may include a first bridge portion BRh1 disposed at a first boundary E1 of the main island portion 11 and a second bridge portion BRh2 disposed at a second boundary E2 of the main island portion 11. The first bridge portion BRh1 may be disposed adjacent to a corner where the first boundary E1 and a third boundary E3 of the main island portion 11 meet. The second bridge portion BRh2 may be disposed adjacent to a corner where the second boundary E2 and a fourth boundary E4 of the main island portion 11 meet. The first bridge portion BRh1 and the second bridge portion BRh2 may each connect main island portions 11 that are adjacent to each other in the first direction (e.g., x direction and/or −x direction). Outside the first and second boundaries E1 and E2 of the main island portion 11, the first bridge portion BRh1 and the second bridge portion BRh2 may have the same shape.

In an embodiment, the third conductive layer 1400 may include a 1st-1 initialization voltage line VIL1a, a 2nd-1 initialization voltage line VIL2a, a 1st-1 scan line SL1a, and a first maintenance voltage line VSLa, which extend from the main island portion 11 to the first bridge portion BRh1, and a 1st-2 initialization voltage line VIL1b, a 2nd-2 initialization voltage line VIL2b, a 1st-2 scan line SL1b, and a second maintenance voltage line VSLb, which extend from the main island portion 11 to the second bridge portion BRh2.

In an embodiment, the 1st-1 initialization voltage line VIL1a and the 1st-2 initialization voltage line VIL1b may be connected to each other within the main island portion 11 through the eleventh conductive pattern 1305 (see FIG. 8B) of the second conductive layer 1300 (see FIG. 8B). The 1st-1 initialization voltage line VIL1a and the 1 st-2 initialization voltage line VIL1b may correspond to the first initialization voltage line VIL1 configured to transmit the first initialization voltage Vint (see FIG. 6C) to one terminal of the fourth transistor T4 (see FIG. 8A).

In an embodiment, the 2nd-1 initialization voltage line VIL2a and the 2nd-2 initialization voltage line VIL2b may be connected to each other within the main island portion 11 through the tenth conductive pattern 1304 (see FIG. 8B) of the second conductive layer 1300 (see FIG. 8B). The 2nd-1 initialization voltage line VIL2a and the 2nd-2 initialization voltage line VIL2b may correspond to the second initialization voltage line VIL2 configured to transmit the second initialization voltage Vaint (see FIG. 6C) to one terminal of the seventh transistor T7 (see FIG. 8A).

In an embodiment, the 1st-1 scan line SL1a and the 1st-2 scan line SL1b may be connected to each other within the main island portion 11 through the fifth conductive pattern 1205 (see FIG. 8A) of the first conductive layer 1200 (see FIG. 8A). The 1st-1 scan line SL1a and the 1st-2 scan line SL1b may correspond to the first scan line SL1 configured to transmit the first scan signal GW (see FIG. 6C) to the gate of the second transistor T2 (see FIG. 8A) and the gate of the third transistor T3 (see FIG. 8A).

In an embodiment, the first maintenance voltage line VSLa and the second maintenance voltage line VSLb may be horizontal maintenance voltage lines VSLh (1st-1 voltage line).

In an embodiment and as shown in FIG. 9B, the horizontal bridge portion BRh may include a first curved portion CNP1, a second curved portion CNP2, and a straight portion SP connecting the first curved portion CNP1 to the second curved portion CNP2. The straight portion SP of the horizontal bridge portion BRh may extend in a third direction DR3, which crosses the first direction (e.g., x direction and/or −x direction) and the second direction (e.g., y direction and/or −y direction).

In an embodiment, the third conductive layer 1400 may include the first initialization voltage line VIL1, the second initialization voltage line VIL2, and the first scan line SL1, which extend from the main island portions 11 to the horizontal bridge portion BRh. In addition, the third conductive layer 1400 may include a horizontal maintenance voltage line VSLh extending from the main island portions 11 to the horizontal bridge portion BRh. The horizontal maintenance voltage line VSLh may have a first width w1 in a direction perpendicular to an extension direction thereof.

In an embodiment, in the first curved portion CNP1 of the horizontal bridge portion BRh, the horizontal maintenance voltage line VSLh, the first initialization voltage line VIL1, the first scan line SL1, and the second initialization voltage line VIL2 may be sequentially arranged to be spaced apart from each other in a direction from a curved inner boundary CIE to a curved outer boundary COE. In the second curved portion CNP2 of the horizontal bridge portion BRh, the second initialization voltage line VIL2, the first scan line SL1, the first initialization voltage line VIL1, and the horizontal maintenance voltage line VSLh may be sequentially arranged to be spaced apart from each other in the direction from the curved inner boundary CIE to the curved outer boundary COE.

In an embodiment, a wiring line disposed closest to the curved inner boundary CIE may be arranged to be spaced apart from the curved inner boundary CIE by a first distance d1, and a wiring line disposed closest to the curved outer boundary COE may be arranged to be spaced apart from the curved outer boundary COE by a second distance d2. For example, as shown in FIG. 9B, in the second curved portion CNP2, the second initialization voltage line VIL2 may be apart from the curved inner boundary CIE by the first distance d1 and the horizontal maintenance voltage line VSLh may be apart from the curved outer boundary COE by the second distance d2. When the display device 1 (see FIG. 1) is stretched by an external force, the curved inner boundary CIE may be subject to greater stress than the curved outer boundary COE. Accordingly, the first distance d1 may be greater than the second distance d2.

In an embodiment, the vertical bridge portions BRv (see FIG. 9B) may include a third bridge portion BRv1 disposed at the third boundary E3 of the main island portion 11 and a fourth bridge portion BRv2 disposed at the fourth boundary E4 of the main island portion 11. The third bridge portion BRv1 may be disposed to be adjacent to a corner where the third boundary E3 and the second boundary E2 of the main island portion 11 meet. The fourth bridge portion BRv2 may be disposed to be adjacent to a corner where the first boundary E1 and the fourth boundary E4 of the main island portion 11 meet. The third bridge portion BRv1 and the fourth bridge portion BRv2 may each connect main island portions 11 that are disposed adjacent to each other in the second direction (e.g., y direction and/or −y direction). Outside the third and fourth boundaries E3 and E4 of the main island portion 11, the third bridge portion BRv1 and the fourth bridge portion BRv2 may have the same shape.

In an embodiment, the third conductive layer 1400 may include a third maintenance voltage line VSLc extending from the main island portion 11 to the third bridge portion BRv1 and a fourth maintenance voltage line VSLd extending from the main island portion 11 to the fourth bridge portion BRv2. The third maintenance voltage line VSLc and the fourth maintenance voltage line VSLd may be vertical maintenance voltage lines VSLv (1st-2 voltage line).

In an embodiment and as shown in FIG. 9C, the vertical bridge portion BRv may include a third curved portion CNP3, a fourth curved portion CNP4, and a straight portion SP connecting the third curved portion CNP3 to the fourth curved portion CNP4. The straight portion SP of the vertical bridge portion BRv may extend in a fourth direction DR4, which crosses the first direction (e.g., x direction and/or −x direction) and the second direction (e.g., y direction and/or −y direction).

In an embodiment, the third conductive layer 1400 may include only the vertical maintenance voltage line VSLv in the vertical bridge portion BRv. The vertical maintenance voltage line VSLv may be arranged to be spaced apart from the curved inner boundary CIE by a first distance d1 and may be arranged to be spaced apart from the curved outer boundary COE by a second distance d2. The first distance d1 may be greater than the second distance d2.

In an embodiment, the vertical maintenance voltage line VSLv may have a second width w2 in a direction perpendicular to an extension direction thereof. The second width w2 of the vertical maintenance voltage line VSLv may be greater than the first width w1 of the horizontal maintenance voltage line VSLh. The second width w2 of the vertical maintenance voltage line VSLv may have the greatest width from among the wiring lines WL included in the main bridge portions 12 (see FIG. 5).

In an embodiment, the ratio between the first width w1 of the horizontal maintenance voltage line VSLh and the second width w2 of the vertical maintenance voltage line VSLv may vary depending on the length of the display area DA (see FIG. 1) in the first direction (e.g., x direction and/or −x direction) and the length of the display area DA in the second direction (e.g., y direction and/or −y direction). For example, when the display area DA has a long shape in the second direction (e.g., y direction and/or −y direction), the stress on the vertical maintenance voltage line VSLv may be greater than the stress on the horizontal maintenance voltage line VSLh, and thus, the second width w2 of the vertical maintenance voltage line VSLv may be greater than the first width w1 of the horizontal maintenance voltage line VSLh.

In an embodiment, the first maintenance voltage line VSLa, the second maintenance voltage line VSLb, the third maintenance voltage line VSLc, and the fourth maintenance voltage line VSLd may extend along the first boundary E1, the second boundary E2, and the fourth boundary E4 of the main island portion 11 and be connected to each other. The first maintenance voltage line VSLa, the second maintenance voltage line VSLb, the third maintenance voltage line VSLc, and the fourth maintenance voltage line VSLd may be integrally provided as one body in the third conductive layer 1400, and the maintenance voltage line VSL may have a mesh structure for connecting main island portions 11 that are disposed adjacent to each other in the first direction (e.g., x direction and/or −x direction) and main island portions 11 that are disposed adjacent to each other in the second direction (e.g., y direction and/or −y direction).

Figure 10A:
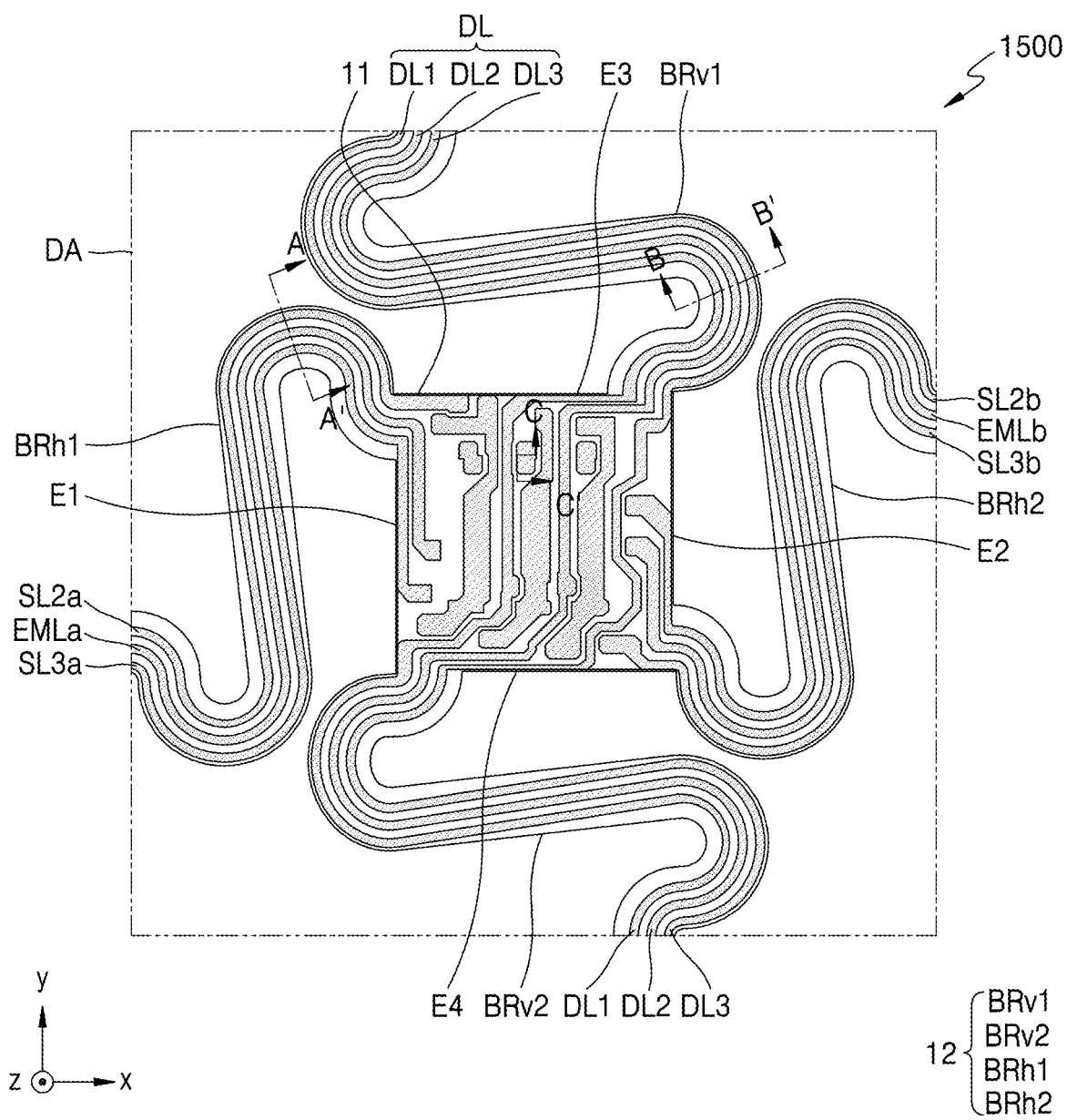
FIG. 10A is a layout diagram schematically showing a fourth conductive layer of a display device, according to an embodiment.
Figure 10B:
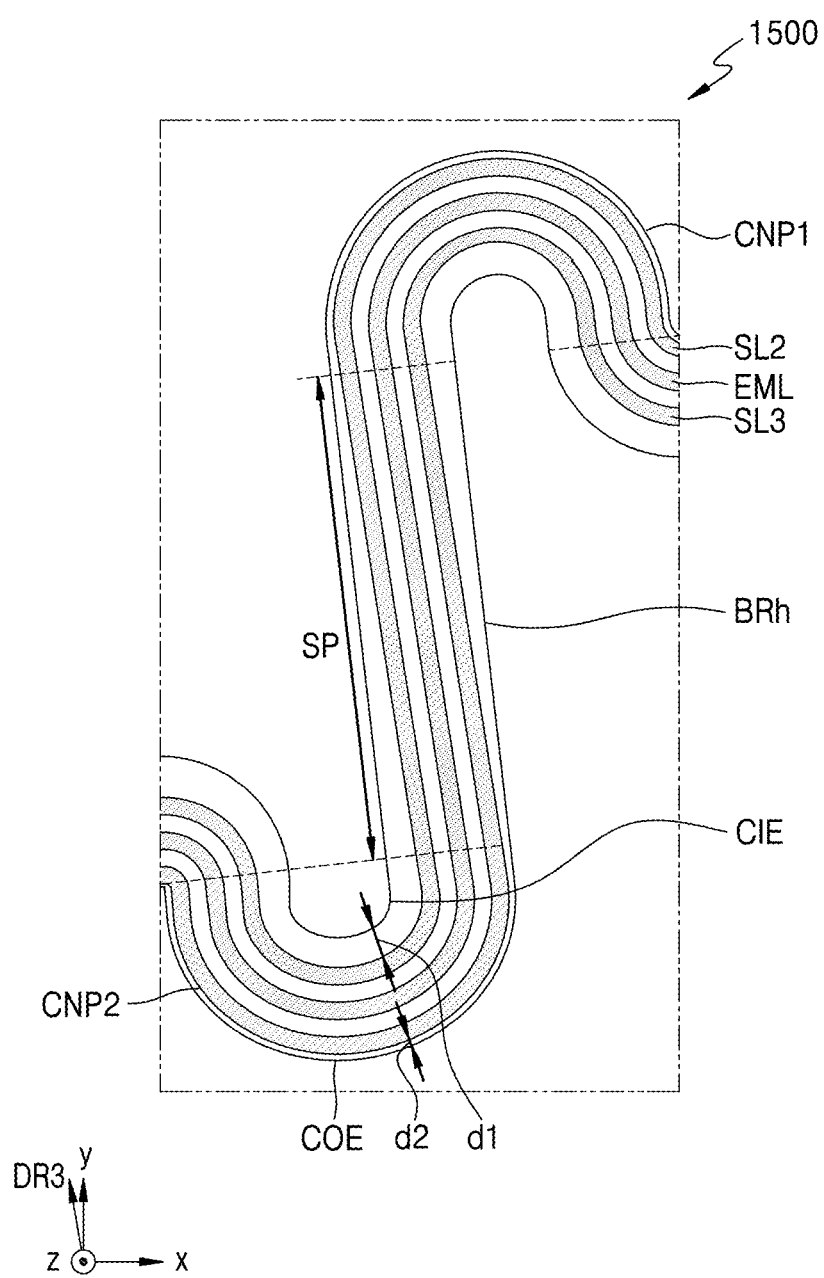
FIG. 10B is a layout diagram schematically showing a portion of a fourth conductive layer of a display device, according to an embodiment.
Figure 10C:
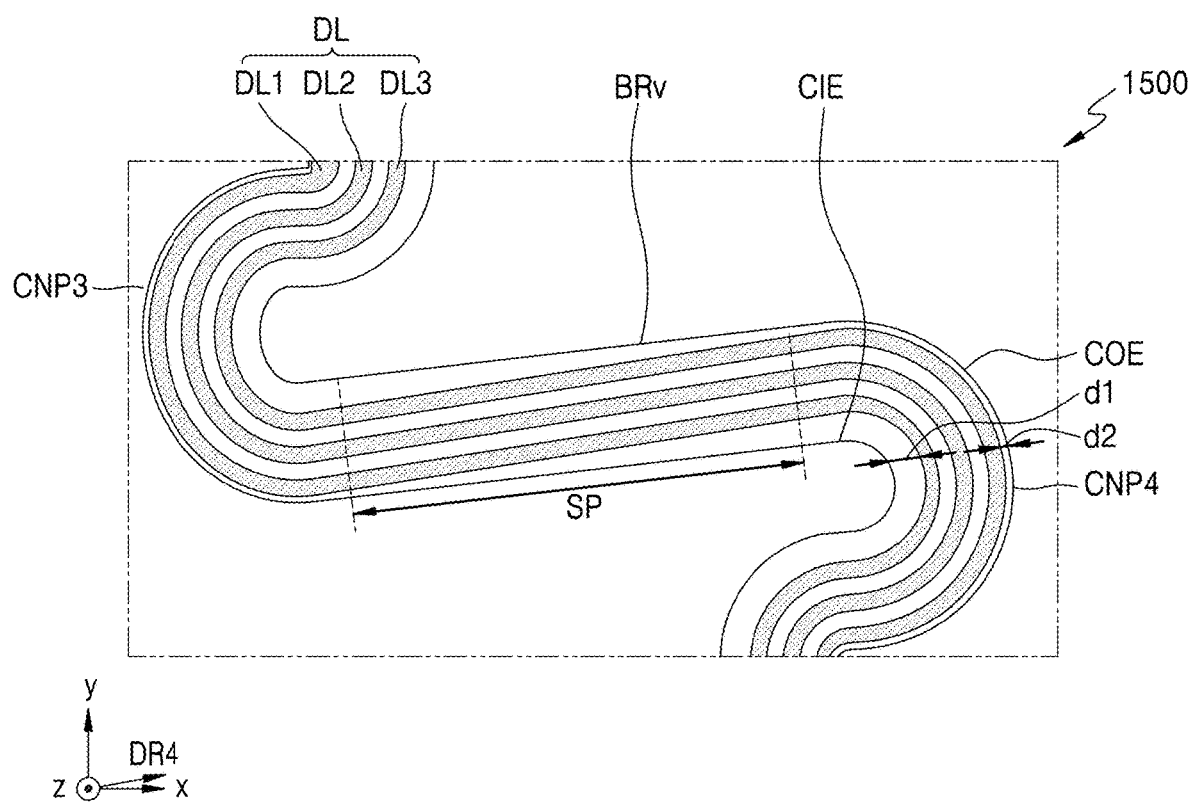
FIG. 10C is a layout diagram schematically showing a portion of a fourth conductive layer of a display device, according to an embodiment.

FIG. 10A is a layout diagram schematically showing a fourth conductive layer 1500 of a display device, according to an embodiment, and FIGS. 10B and 10C are layout diagrams schematically showing a portion of a fourth conductive layer 1500 of a display device, according to an embodiment.

In an embodiment and referring to FIGS. 10A to 10C, the display device may include, in a display area DA, a main island portion 11 and a plurality of main bridge portions 12 connected to the main island portion 11.

In an embodiment, the main bridge portion 12 may include horizontal bridge portions BRh and vertical bridge portions BRv. A first bridge portion BRh1 disposed at a first boundary E1 of the main island portion 11 and a second bridge portion BRh2 disposed at a second boundary E2 may be horizontal bridge portions BRh having the same shape outside the first and second boundaries E1 and E2 of the main island part 11.

In an embodiment, the fourth conductive layer 1500 may include a 2nd-1 scan line SL2a, a first emission control line EMLa, and a 3rd-1 scan line SL3a, which extend from the main island portion 11 to the first bridge portion BRh1, and may include a 2nd-2 scan line SL2b, a second emission control line EMLb, and a 3rd-2 scan line SL3b, which extend from the main island portion 11 to the second bridge portion BRh2.

In an embodiment, the 2nd-1 scan line SL2a and the 2nd-2 scan line SL2b may be connected to each other within the main island portion 11 through the 15th conductive pattern 1404 of the third conductive layer 1400, the 23rd conductive pattern 1412, and the third conductive pattern 1203 of the first conductive layer 1200. The 2nd-1 scan line SL2a and the 2nd-2 scan line SL2b may correspond to the second scan line SL2 configured to transmit the second scan signal GB (see FIG. 6C) to the gate of the seventh transistor T7 (see FIG. 8A) and the gate of the ninth transistor T9 (see FIG. 8A).

In an embodiment, the first emission control line EMLa and the second emission control line EMLb may be connected to each other within the main island portion 11 through the 13th conductive pattern 1402 of the third conductive layer 1400, the fourth conductive pattern 1204 of the first conductive layer 1200, and the 24th conductive pattern 1413 of the third conductive layer 1400. The first emission control line EMLa and the second emission control line EMLb may correspond to the emission control line EML configured to transmit the emission control signal EM (see FIG. 6C) to the gate of the fifth transistor T5 (see FIG. 8A), the gate of the sixth transistor T6 (see FIG. 8A), and the gate of the eighth transistor T8 (see FIG. 8A).

In an embodiment, the 3rd-1 scan line SL3a and the 3rd-2 scan line SL3b may be connected to each other within the main island portion 11 through the 14th conductive pattern 1403 of the third conductive layer 1400, the sixth conductive pattern 1206 of the first conductive layer 1200, and the 25th conductive pattern 1414 of the third conductive layer 1400. The 3rd-1 scan line SL3a and the 3rd-2 scan line SL3b may correspond to the third scan line SL3 configured to transmit the third scan signal GI (see FIG. 6C) to the gate of the fourth transistor T4 (see FIG. 8A).

In an embodiment and as shown in FIG. 10B, the fourth conductive layer 1500 may include signal lines extending from the main island portion 11 to the horizontal bridge portion BRh, for example, the second scan line SL2, the emission control line EML, and the third scan line SL3.

In an embodiment, in a first curved portion CNP1, the third scan line SL3, the emission control line EML, and the second scan line SL2 may be sequentially arranged to be spaced apart from each other in a direction from a curved inner boundary CIE to a curved outer boundary COE. In a second curved portion CNP2, the second scan line SL2, the emission control line EML, and the third scan line SL3 may be sequentially arranged to be spaced apart from each other in the direction from the curved inner boundary CIE to the curved outer boundary COE.

In an embodiment, a wiring line disposed closest to the curved inner boundary CIE may be arranged to be spaced apart from the curved inner boundary CIE by a first distance d1, and a wiring line disposed closest to the curved outer boundary COE may be arranged to be spaced apart from the curved outer boundary COE by a second distance d2. For example, in the second curved portion CNP2, the second scan line SL2 may be apart from the curved inner boundary CIE by the first distance d1, and the third scan line SL3 may be apart from the curved outer boundary COE by the second distance d2. The first distance d1 may be greater than the second distance d2.

In an embodiment, the third bridge portion BRv1 disposed at the third boundary E3 of the main island portion 11 and the fourth bridge portion BRv2 disposed at the fourth boundary E4 of the main island portion 11 may be vertical bridge portions BRv having the same shape outside the third and fourth boundaries E3 and E4 of the main island portion 11.

In an embodiment, the fourth conductive layer 1500 may include a first data line DL1, a second data line DL2, and a third data line DL3, which extend from the main island portion 11 to the third bridge portion BRv1 and the fourth bridge portion BRv2. The first data line DL1, the second data line DL2, and the third data line DL3 may extend from the third boundary E3 of the main island portion 11 to the fourth boundary E4 of the main island portion 11 to cross the main island portion 11. That is, the first data line DL1 arranged in the vertical bridge portion BRv may be provided integrally with the first data line DL1 to be arranged in the main island portion 11, the second data line DL2 arranged in the vertical bridge portion BRv may be provided integrally with the second data line DL2 to be arranged in the main island portion 11, and the third data line DL3 arranged in the vertical bridge portion BRv may be provided integrally with the third data line DL3 to be arranged in the main island portion 11.

In an embodiment, the first data line DL1, the second data line DL2, and the third data line DL3 may each be connected to the first semiconductor pattern 1101, second semiconductor pattern 1102, or third semiconductor pattern 1103 of the semiconductor layer 1100 through the 22nd conductive patterns 1411 (see FIG. 8C) of the third conductive layer 1400 (see FIG. 8C), and may be configured to transmit the data signal Dm (see FIG. 6C) to one terminal of the second transistor T2 (see FIG. 8A) of a corresponding pixel driving circuit.

In an embodiment and as shown in FIG. 10C, in the third curved portion CNP3, the third data line DL3, the second data line DL2, and the first data line DL1 may be sequentially arranged to be spaced apart from each other in a direction from a curved inner boundary CIE to a curved outer boundary COE. In the fourth curved portion CNP3, the first data line DL1, the second data line DL2, and the third data line DL3 may be sequentially arranged to be spaced apart from each other in the direction from the curved inner boundary CIE to the curved outer boundary COE.

In an embodiment, a wiring line disposed closest to the curved inner boundary CIE may be arranged to be spaced apart from the curved inner boundary CIE by a first distance d1, and a wiring line disposed closest to the curved outer boundary COE may be arranged to be spaced apart from the curved outer boundary COE by a second distance d2. For example, in the fourth curved portion CNP4, the first data line DL1 may be spaced apart from the curved inner boundary CIE by the first distance d1 and the third data line DL3 may be spaced apart from the curved outer boundary COE by the second distance d2. The first distance d1 may be greater than the second distance d2.

Figure 11A:
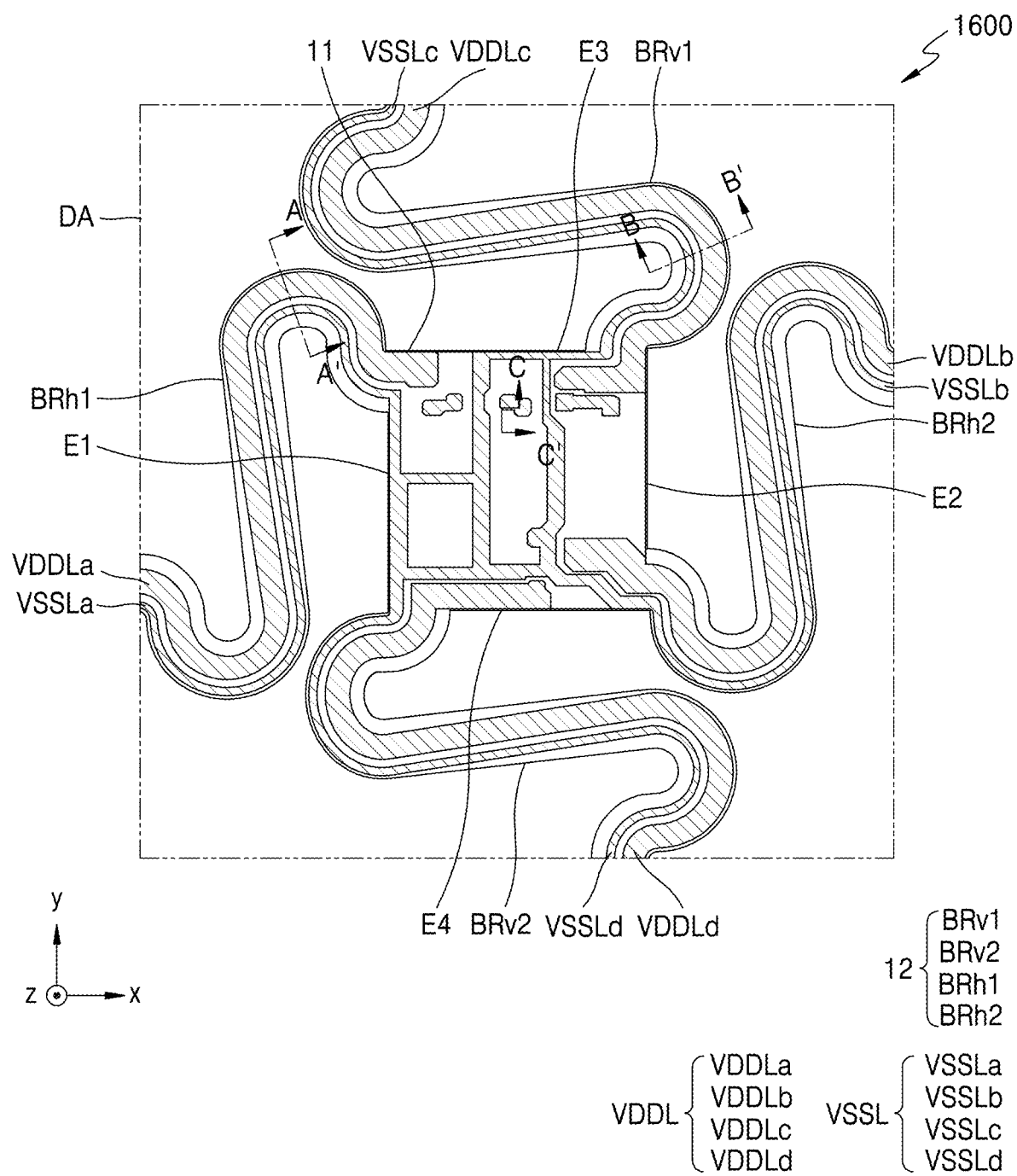
FIG. 11A is a layout diagram schematically showing a fifth conductive layer of a display device, according to an embodiment.
Figure 11B:
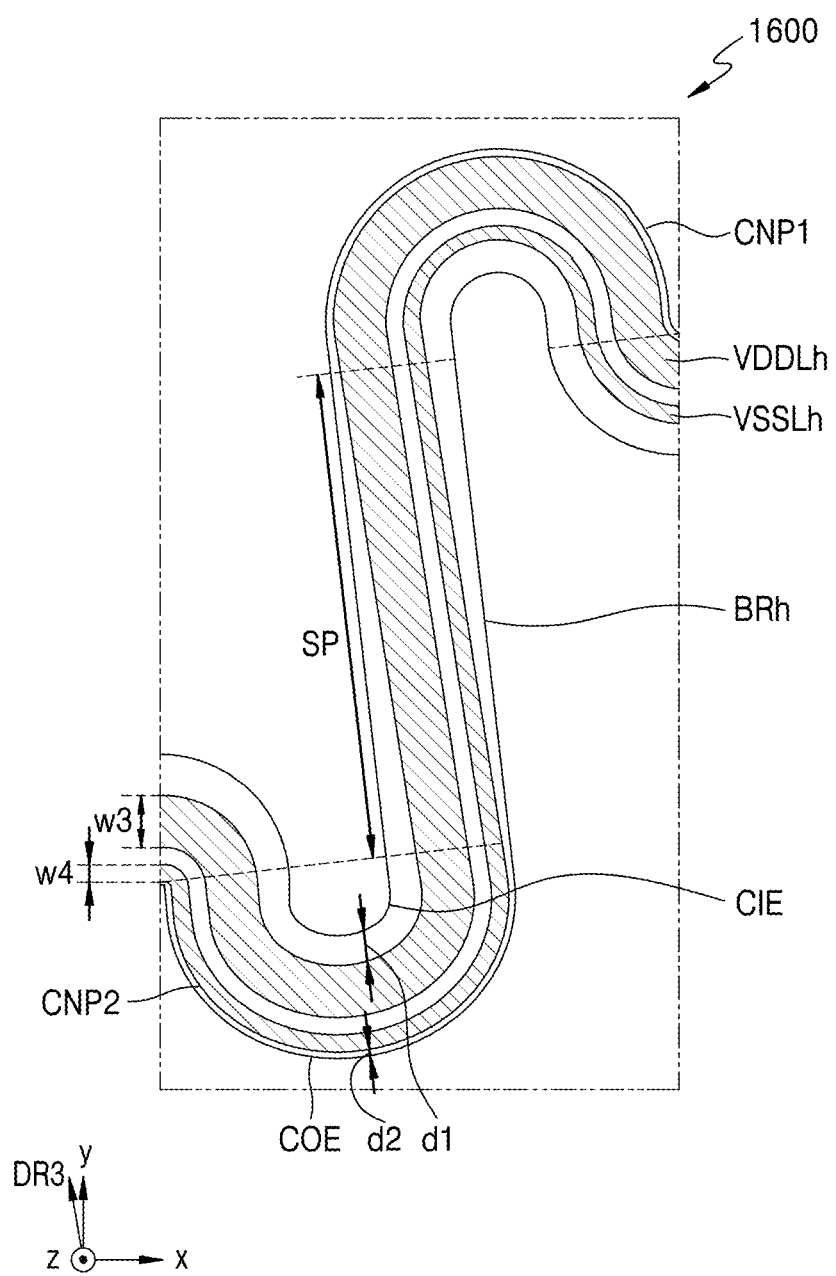
FIGS. 11B and 11C are layout diagrams schematically showing a portion of a fifth conductive layer of a display device, according to an embodiment.
Figure 11C:
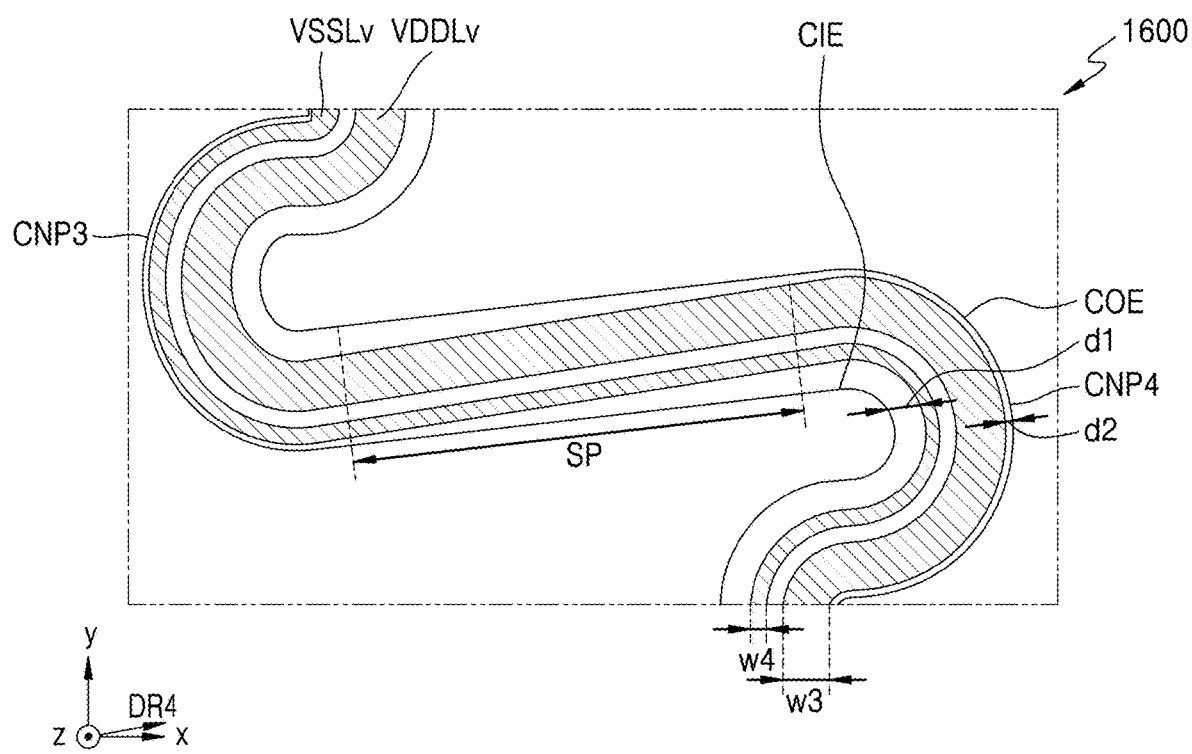

FIG. 11A is a layout diagram schematically showing a fifth conductive layer 1600 of a display device, according to an embodiment, and FIGS. 11B and 11C are layout diagrams schematically showing a portion of a fifth conductive layer 1600 of a display device, according to an embodiment.

In an embodiment and referring to FIGS. 11A to 11C, the display device may include, in a display area DA, a main island portion 11 and a plurality of main bridge portions 12 connected to the main island portion 11.

In an embodiment, the main bridge portion 12 may include a first bridge portion BRh1 disposed at a first boundary E1 of the main island portion 11, a second bridge portion BRh2 disposed at a second boundary E2 of the main island portion 11, a third bridge portion BRv1 disposed at a third boundary E3 of the main island portion 11, and a fourth bridge portion BRv2 disposed at a fourth boundary E4 of the main island portion 11. Outside the boundary of the main island portion 11, the first bridge portion BRh1 and the second bridge portion BRh2 may have the same shape and the third bridge portion BRv1 and the fourth bridge portion BRv2 may have the same shape.

In an embodiment, the first bridge portion BRh1 and the second bridge portion BRh2 may be horizontal bridge portions BRh connecting main island portions 11 that are disposed adjacent to each other in a first direction (e.g., x direction and/or −x direction), and the third bridge portion BRv1 and the fourth bridge portion BRv2 may be vertical bridge portions BRv connecting main island portions 11 that are disposed adjacent to in a second direction (e.g., y direction and/or −y direction).

In an embodiment, the fifth conductive layer 1600 may include a first driving voltage line VDDLa and a first common voltage line VSSLa, which extend from the main island portion 11 to the first bridge portion BRh1, a second driving voltage line VDDLb and a second common voltage line VSSLb, which extend from the main island portion 11 to the second bridge portion BRh2, a third driving voltage line VDDLc and a third common voltage line VSSLc, which extend from the main island portion 11 to the third bridge portion BRv1, and a fourth driving voltage line VDDLd and a fourth common voltage line VSSLd, which extend from the main island portion 11 to the fourth bridge portion BRv2.

In an embodiment, the first driving voltage line VDDLa and the second driving voltage line VDDLb may be horizontal driving voltage lines VDDLh (2nd-1 voltage line) connecting main island portions 11 that are disposed adjacent to each other in the first direction (e.g., x direction and/or −x direction). The third driving voltage line VDDLc and the fourth driving voltage line VDDLd may be vertical driving voltage lines VDDLv (2nd-2 voltage line) connecting main island portions 11 that are disposed adjacent to each other in the second direction (e.g., y direction and/or −y direction).

In an embodiment, the first common voltage line VSSLa and the second common voltage line VSSLb may be horizontal common voltage lines VSSLh (3rd-1st voltage line) connecting main island portions 11 that are disposed adjacent to each other in the first direction (e.g., x direction and/or −x direction). The third common voltage line VSSLc and the fourth common voltage line VSSLd may be vertical common voltage lines VSSLv (3rd-2 voltage line) connecting main islands portions 11 that are disposed adjacent to each other in the second direction (e.g., y direction and/or −y direction).

In an embodiment and as shown in FIGS. 11B and 11C, the horizontal bridge portion BRh may include a horizontal driving voltage line VDDLh and a horizontal common voltage line VSSLh, which extend from the main island portion 11 to the horizontal bridge portion BRh, and the vertical bridge portion BRv may include a vertical driving voltage line VDDLv and a vertical common voltage line VSSLv, which extend from the main island portion 11 to the vertical bridge portion BRv.

In an embodiment, in the first curved portion CNP1, the horizontal common voltage line VSSLh and the horizontal driving voltage line VDDLh may be arranged to be spaced apart from each other in a direction from a curved inner boundary CIE to a curved outer boundary COE, and in the second curved portion CNP2, the horizontal driving voltage line VDDLh and the horizontal common voltage line VSSLh may be arranged to be spaced apart from each other in the direction from the curved inner boundary CIE to the curved outer boundary COE.

In an embodiment, in the third curved portion CNP3, the vertical driving voltage line VDDLv and the vertical common voltage line VSSLv may be arranged to be spaced apart from each other in the direction from the curved inner boundary CIE to the curved outer boundary COE, and in the fourth curved portion CNP4, the vertical common voltage line VSSLv and the vertical driving voltage line VDDLv may be arranged to be spaced apart from each other in the direction from the curved inner boundary CIE to the curved outer boundary COE.

In an embodiment, a wiring line disposed closest to the curved inner boundary CIE may be arranged to be spaced apart from the curved inner boundary CIE by a first distance d1, and a wiring line disposed closest to the curved outer boundary COE may be arranged to be spaced apart from the curved outer boundary COE by a second distance d2. For example, in the second curved portion CNP2, the horizontal driving voltage line VDDLh may be spaced apart from the curved inner boundary CIE by the first distance d1 and the horizontal common voltage line VSSLh may be spaced apart from the curved outer boundary COE by the second distance d2. The first distance d1 may be greater than the second distance d2. Likewise, in the fourth curved portion CNP4, the vertical common voltage line VSSLv may be spaced apart from the curved inner boundary CIE by the first distance d1 and the vertical driving voltage line VDDLv may be spaced apart from the curved outer boundary COE by the second distance d2 that is less than the first distance d1.

In an embodiment, the horizontal driving voltage line VDDLh and the vertical driving voltage line VDDLv may have a third width w3 in a direction perpendicular to an extension direction thereof. The horizontal common voltage line VSSLh and the vertical common voltage line VSSLv may have a fourth width w4 in a direction perpendicular to an extension direction thereof. When a change in luminance uniformity due to the voltage drop in the driving voltage line VDDL is greater than a change in luminance uniformity due to the voltage drop in the common voltage line VSSL, the third width w3 may be greater than the fourth width w4. For example, the third width w3 may be about 1.2 times to about 2 times the fourth width w4. In an embodiment, the third width w3 may be about 1.5 times the fourth width w4.

In another embodiment, when a change in luminance uniformity due to the voltage drop in the common voltage line VSSL is greater than a change in luminance uniformity due to the voltage drop in the driving voltage line VDDL, the third width w3 may be less than or equal to the fourth width w4.

In an embodiment, the maintenance voltage line VSL (see FIG. 9A) may compensate for the voltage drop of the driving voltage line VDDL by transmitting the maintenance voltage VSUS (see FIG. 6C) to the second node N2 (see FIG. 6C) during an initialization period and a data writing period. Therefore, in order to maximize the width of the maintenance voltage line VSL (see FIG. 9A), the maintenance voltage line VSL (see FIG. 9A) may be included in a different layer (e.g., the third conductive layer 1400) from the common voltage line VSSL and the driving voltage line VDDL and may be configured as a single wiring line in the vertical bridge portion BRv. The second width w2 (see FIG. 9C) may be greater than the third width w3 and the fourth width w4. In an embodiment, the second width w2 (see FIG. 9C) may be about 1.2 times to about 2 times the fourth width w4.

In an embodiment, the driving voltage line VDDL may have a mesh structure for connecting main island portions 11 that are disposed adjacent to each other in the first direction (e.g., x direction and/or −x direction) and main island portions 11 that are disposed adjacent to each other in the second direction (e.g., y direction and/or −y direction).

In an embodiment, because the driving voltage line VDDL has to transmit the driving power voltage VDD (see FIG. 6C) to one terminal of the eighth transistor T8 (see FIG. 8A) located in the semiconductor layer 1100 (see FIG. 8A), a mesh structure may be formed using layers disposed between the fifth conductive layer 1600 and the semiconductor layer 1100. The connection portions of the mesh structure may be arranged in the main island portion 11. The first driving voltage line VDDLa, the second driving voltage line VDDLb, the third driving voltage line VDDLc, and the fourth driving voltage line VDDLd may be connected to each other, without contacting the common voltage line VSSL, through the first voltage connection line VCL1 (see FIG. 8C) and the second voltage connection line VCL2 (see FIG. 8C), which are arranged in the first conductive layer 1400 (see FIG. 8C), and the third voltage connection lines VCL3 (see FIG. 8D), which is arranged in the second conductive layer 1500 (see FIG. 8D).

In an embodiment, the common voltage line VSSL may have a mesh structure for connecting main island portions 11 that are disposed adjacent to each other in the first direction (e.g., x direction and/or −x direction) and main island portions 11 that are disposed adjacent to each other in the second direction (e.g., y direction and/or −y direction).

In an embodiment, because the common voltage line VSSL is connected only to the second electrode pad 242 (see FIG. 8F) of the sixth conductive layer 1700 (see FIG. 8F), the first common voltage line VSSLa, the second common voltage line VSSLb, the third common voltage line VSSLc, and the fourth common voltage line VSSLd may be arranged in the fifth conductive layer 1600, which is a conductive layer disposed closest to the sixth conductive layer 1700 (see FIG. 8F), and may extend within the main island portion 11 and be connected to each other.

In an embodiment, because the common voltage line VSSL has a mesh structure in the display area DA (see FIG. 1) and transmits the common power voltage VSS (see FIG. 6C) to each of the light-emitting elements through the second electrode pad 242 (see FIG. 8F), there is no need to arrange a common power voltage line for transmitting the common power voltage VSS to the non-display area NDA (see FIG. 1). Therefore, the display device, according to embodiments, may reduce dead space in which images are not displayed.

In an embodiment, when one electrode of the light-emitting element is connected to the driving voltage line VDDL, for example, when the light-emitting element has an inverted structure, the first driving voltage line VDDLa, the second driving voltage line VDDLb, the third driving voltage line VDDLc, and the fourth driving voltage line VDDLd may be connected to each other in the fifth conductive layer 1600 and provided as one body. In this case, the first common voltage line VSSLa, the second common voltage line VSSLb, the third common voltage line VSSLc, and the fourth common voltage line VSSLd may be connected to each other within the main island portion 11 through voltage connection lines arranged in a different layer from the first common voltage line VSSLa, the second common voltage line VSSLb, the third common voltage line VSSLc, and the fourth common voltage line VSSLd.

Figure 12A:
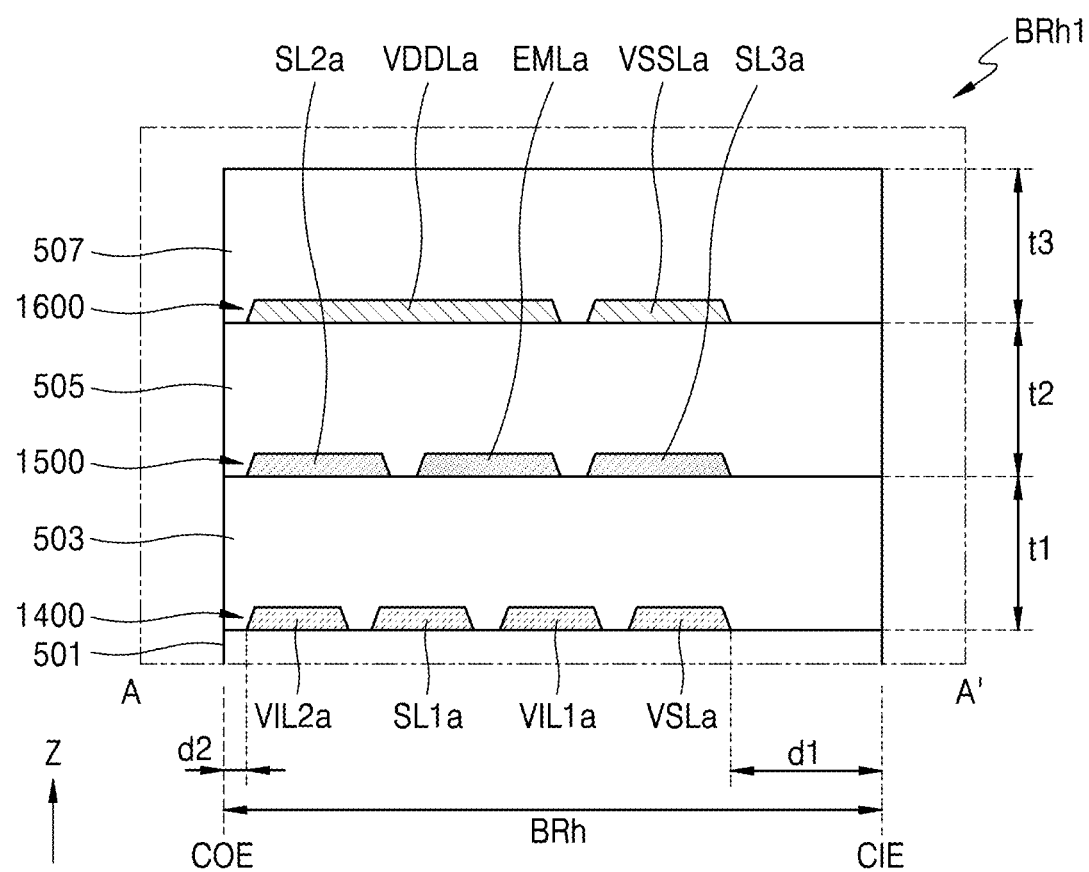
FIG. 12A is a cross-sectional view schematically showing a portion of a display device, according to an embodiment.
Figure 12B:
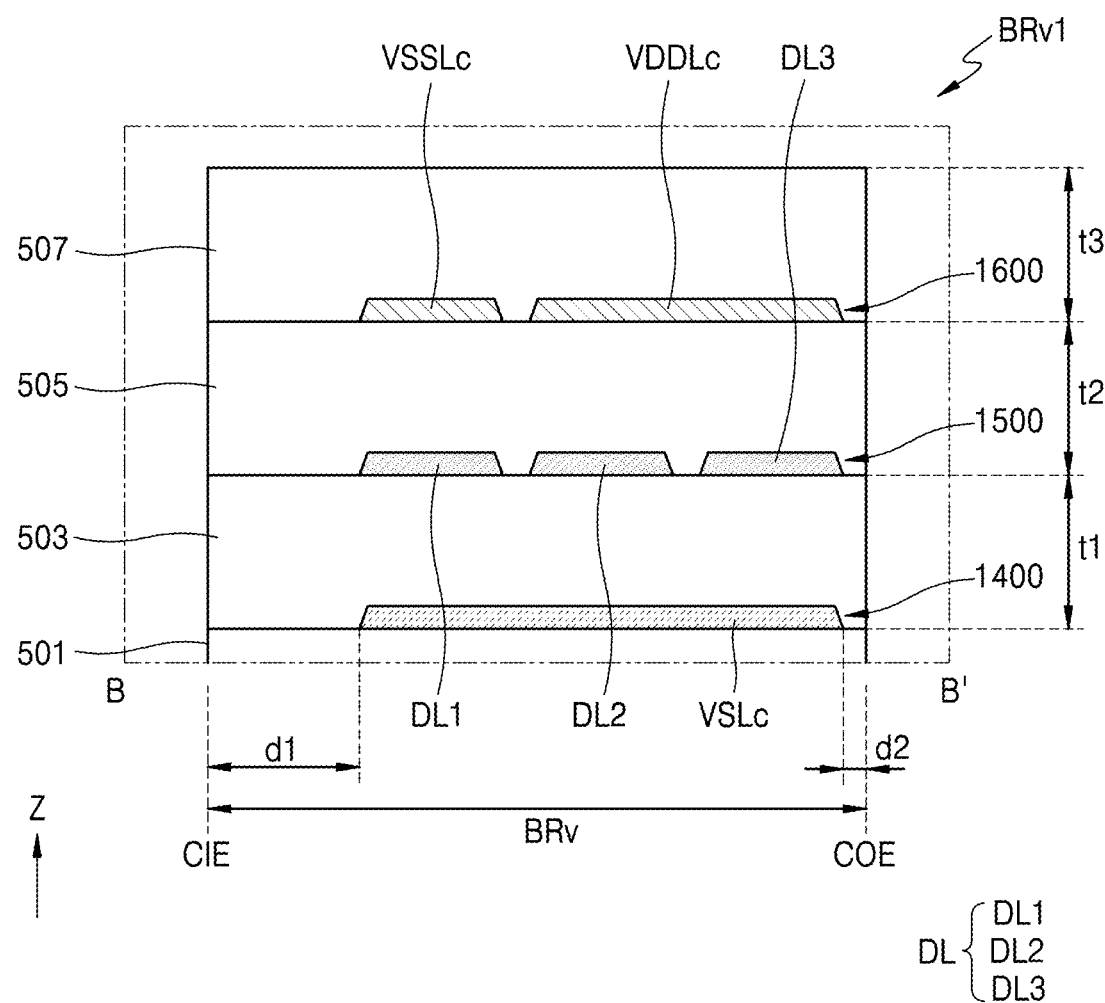
FIG. 12B is a cross-sectional view schematically showing a portion of a display device, according to an embodiment.
Figure 12C:
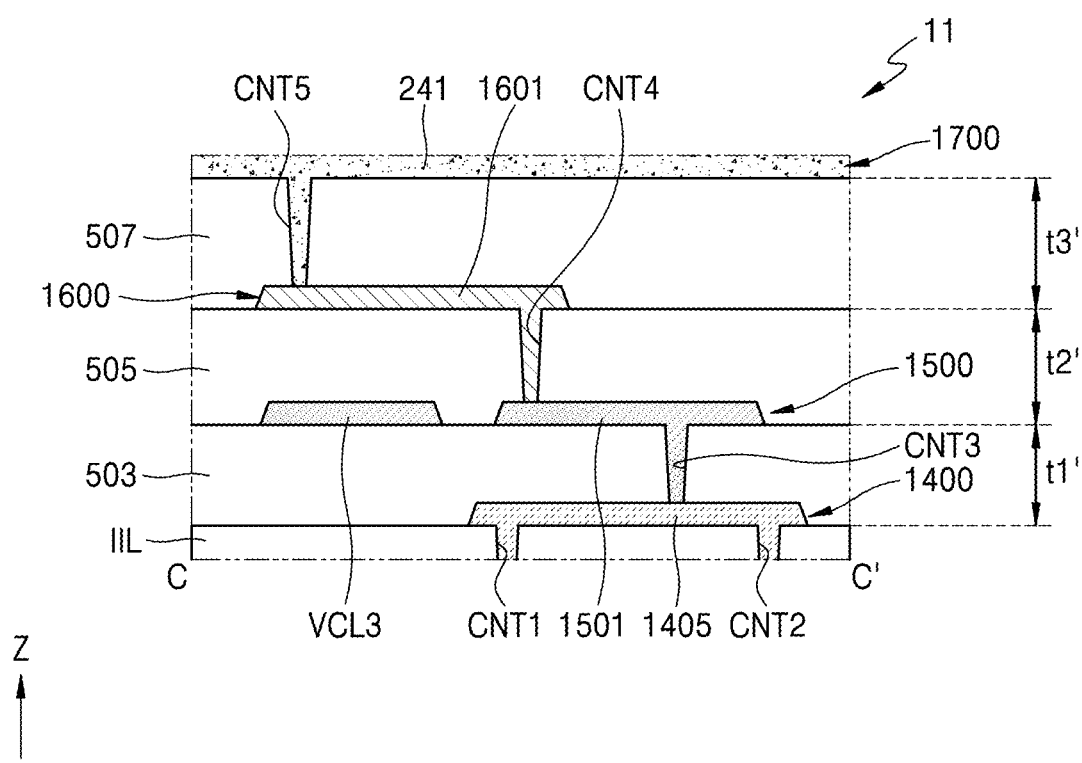
FIG. 12C is a cross-sectional view schematically showing a portion of a display device, according to an embodiment.

FIGS. 12A to 12C are cross-sectional views schematically showing a portion of a display device, according to an embodiment. FIG. 12A is a cross-sectional view of the display device taken along line A-A' in FIGS. 9A, 10A, and 11A, according to an embodiment, FIG. 12B is a cross-sectional view of the display device taken along line B-B' in FIGS. 9A, 10A, and 11A, according to an embodiment, and FIG. 12C is a cross-sectional view of the display device taken along line C-C' in FIGS. 9A, 10A, and 11A, according to an embodiment.

In an embodiment and referring to FIGS. 12A to 12C, a third conductive layer 1400, a fourth conductive layer 1500, and a fifth conductive layer 1600 may be arranged in each of the first bridge portion BRh1, the third bridge portion BRv1, and the main island portion 11.

In an embodiment, the third conductive layer 1400 may be disposed on a lower organic layer 501 or an interlayer insulating layer IIL. The lower organic layer 501 may be arranged in the main bridge portion 12 (see FIG. 9A) and may not overlap the main island portion 11. The interlayer insulating layer IIL may be arranged in the main island portion 11 and may not overlap the main bridge portion 12 (see FIG. 9A).

In an embodiment, the third conductive layer 1400 may include a 1st-1 initialization voltage line VIL1a, a 2nd-1 initialization voltage line VIL2a, a 1st-1 scan line SL1a, and a first maintenance voltage line VSLa, which are arranged in the first bridge portion BRh1, and may include a third maintenance voltage line VSLc arranged in the third bridge portion BRv1. The 1st-1 initialization voltage line VIL1a, the 2nd-1 initialization voltage line VIL2a, the 1st-1 scan line SL1a, the first maintenance voltage line VSLa, and the third maintenance voltage line VSLc may be disposed on the lower organic layer 501.

In an embodiment, the 1st-1 initialization voltage line VIL1a, the 2nd-1 initialization voltage line VIL2a, the 1st-1 scan line SL1a, and the first maintenance voltage line VSLa may be arranged to be apart from each other. The first maintenance voltage line VSLa, which is a wiring line disposed closest to a curved inner boundary CIE of the first bridge portion BRh1, may be arranged to be spaced apart from the curved inner boundary CIE by a first distance d1. The 2nd-1 initialization voltage line VIL2a, which is a wiring line closest to a curved outer boundary COE of the first bridge portion BRh1, may be arranged to be spaced apart from the curved outer boundary COE by a second distance d2. The first distance d1 may be greater than the second distance d2.

In an embodiment, the third maintenance voltage line VSLc may be arranged to be spaced apart from a curved inner boundary CIE of the third bridge portion BRv1 by a first distance d1 and be arranged to be spaced apart from a curved outer boundary COE of the third bridge portion BRv1 by a second distance d2. The first distance d1 may be greater than the second distance d2.

In an embodiment, the third conductive layer 1400 may include a 16th conductive pattern 1405 arranged in the main island portion 11. The 16th conductive pattern 1405 may be disposed on the interlayer insulating layer IIL. The 16th conductive pattern 1405 may be connected to the first conductive pattern 1201 (see FIG. 8A) of the first conductive layer 1200 (see FIG. 8A) through a first contact hole CNT1 passing through the interlayer insulating layer IIL and may be connected to the first semiconductor pattern 1101 (see FIG. 8A) of the semiconductor layer 1100 (see FIG. 8A) through a second contact hole CNT2.

In an embodiment, the third conductive layer 1400 may include an inorganic insulating material. For example, the interlayer insulating layer IIL may include silicon oxide, silicon nitride, and/or silicon oxynitride.

In an embodiment, the lower organic layer 501 may include an organic insulating material. The level of the top surface of the lower organic layer 501 may be substantially the same as or similar to the level of the top surface of the interlayer insulating layer IIL. Accordingly, a substantially flat base surface may be provided to the third conductive layer 1400 at the boundary between the main island portion 11 and the first bridge portion BRh1 or the third bridge portion BRv1.

In an embodiment, a first organic insulating layer 503 may be disposed on the third conductive layer 1400. The first organic insulating layer 503 may include an organic insulating material. The first organic insulating layer 503 may have a first thickness t1 in a thickness direction (e.g., z direction and/or −z direction) in the first bridge portion BRh1 and the third bridge portion BRv1. The first organic insulating layer 503 may have a second thickness t1', which is less than the first thickness t1, in the thickness direction (e.g., z direction and/or −z direction) in the main island portion 11. The first organic insulating layer 503 may be formed using a halftone mask or slit mask so that the thickness of the first organic insulating layer 503 in the first bridge portion BRh1 and the third bridge portion BRv1 is greater than the thickness of the first organic insulating layer 503 in the main island portion 11.

In an embodiment, the fourth conductive layer 1500 may be disposed on the first organic insulating layer 503. The fourth conductive layer 1500 may include a 2nd-1 scan line SL2a, a first emission control line EMLa, and a 3rd-1 scan line SL3a, which are arranged in the first bridge portion BRh1, and may include a first data line DL1, a second data line DL2, and a third data line DL3, which are arranged in the third bridge portion BRv1.

In an embodiment, the fourth conductive layer 1500 may include a third voltage connection line VCL3 and a 26th conductive pattern 1501, which are arranged in the main island portion 11. The 26th conductive pattern 1501 may be connected to the 16th conductive pattern 1405 through a third contact hole CNT3 passing through the first organic insulating layer 503.

In an embodiment, a second organic insulating layer 505 may be disposed on the fourth conductive layer 1500. The second organic insulating layer 505 may include an organic insulating material. The second organic insulating layer 505 may have a third thickness t2 in the thickness direction (e.g., z direction and/or −z direction) in the first bridge portion BRh1 and the third bridge portion BRv1. The second organic insulating layer 505 may have a fourth thickness t2', which is less than the third thickness t2, in the thickness direction (e.g., z direction and/or −z direction) in the main island portion 11. The second organic insulating layer 505 may be formed using a halftone mask or slit mask so that the thickness of the second organic insulating layer 505 in the first bridge portion BRh1 and the third bridge portion BRv1 is greater than the thickness of the second organic insulating layer 505 in the main island portion 11.

In an embodiment, the fifth conductive layer 1600 may be disposed on the second organic insulating layer 505. The fifth conductive layer 1600 may include a first driving voltage line VDDLa and a first common voltage line VSSLa, which are arranged in the first bridge portion BRh1, and may include a third common voltage line VSSLc and a third driving voltage line VDDLc, which are arranged in the third bridge portion BRv1.

In an embodiment, the fifth conductive layer 1600 may include a 27th conductive pattern 1601 arranged in the main island portion 11. The 27th conductive pattern 1601 may be connected to the 26th conductive pattern 1501 through a fourth contact hole CNT4 passing through the second organic insulating layer 505.

In an embodiment, the data lines DL may overlap the third maintenance voltage line VSLc, in a plan view, with the first organic insulating layer 503 therebetween. Accordingly, capacitance may be generated between the data lines DL and the third maintenance voltage line VSLc. The capacitance may decrease as the distance between the data lines DL and the third maintenance voltage line VSLc in the thickness direction increases. Accordingly, in order to reduce the load on the data lines DL, the first organic insulating layer 503 may be formed to be thick in the main bridge portions.

In an embodiment, because the third contact hole CNT3 passing through the first organic insulating layer 503 is arranged in the main island portion 11, when the first organic insulating layer 503 is too thick, patterning defects in the third contact hole CNT3 may occur. Accordingly, the first thickness t1 of the first organic insulating layer 503 in the main bridge portions may be greater than the second thickness t1' of the first organic insulating layer 503 in the main island portion 11.

In an embodiment, the distance between the data lines DL and the third maintenance voltage line VSLc in the thickness direction (e.g., z direction and/or −z direction) in the third bridge portion BRv1 may be greater than the distance between the data lines DL and the maintenance voltage line VSL in the thickness direction (e.g., z direction and/or −z direction) in the main island portion 11.

In an embodiment, the data lines DL may overlap the third common voltage line VSSLc and the third driving voltage line VDDLc, in a plan view, with the second organic insulating layer 505 therebetween. In order to reduce capacitance between the data lines DL and the third common and driving voltage lines VSSLc and VDDLc, the second organic insulating layer 505 may be formed to be thick in the main bridge portions.

In an embodiment, because the fourth contact hole CNT4 passing through the second organic insulating layer 505 is arranged in the main island portion 11, the third thickness t2 of the second organic insulating layer 505 in the main bridge portions may be greater than the fourth thickness t2' of the second organic insulating layer 505 in the main island portion 11.

In an embodiment, the distance between the data lines DL and the third common voltage line VSSLc in the thickness direction (e.g., z direction and/or −z direction) in the third bridge portion BRv1 may be greater than the distance between the data lines DL and the common voltage line VSSL in the thickness direction (e.g., z direction and/or −z direction) in the main island portion 11.

In an embodiment, the first thickness t1 of the first organic insulating layer 503 may be about 1.5 times the second thickness t1' of the first organic insulating layer 503. The third thickness t2 of the second organic insulating layer 505 may be about 1.5 times the fourth thickness t2' of the second organic insulating layer 505. For example, the first thickness t1 of the first organic insulating layer 503 and the third thickness t2 of the second organic insulating layer 505 may be about 1.5 μm to about 2.5 μm, and the second thickness t1' of the first organic insulating layer 503 and the fourth thickness t2' of the second organic insulating layer 505 may be about 0.95 μm to about 1.5 μm. In this case, the capacitance between the data lines DL and wiring lines overlapping the data lines DL in a plan view may be reduced by about 30%.

In an embodiment, a third organic insulating layer 507 may be disposed on the fifth conductive layer 1600 to cover the first driving voltage line VDDLa, the first common voltage line VSSLa, the third driving voltage line VDDLc, the third common voltage line VSSLc, and the 27th conductive pattern 1601. The third organic insulating layer 507 may include an organic insulating material.

In an embodiment, the third organic insulating layer 507 may have a fifth thickness t3 in the thickness direction (e.g., z direction and/or −z direction) in the first bridge portion BRh1 and the third bridge portion BRv1. The third organic insulating layer 507 may have a sixth thickness t3', which is less than the fifth thickness t3, in the thickness direction (e.g., z direction and/or −z direction) in the main island portion 11.

In another embodiment, the thickness of the third organic insulating layer 507 in the first bridge portion BRh1 and the third bridge portion BRv1 may be substantially equal to or less than the thickness of the third organic insulating layer 507 in the main island portion 11.

In an embodiment, the sixth conductive layer 1700 may be disposed on the third organic insulating layer 507. The sixth conductive layer 1700 may be disposed to overlap only the main island portion 11. The sixth conductive layer 1700 may include a first electrode pad 241 that is electrically connected to a first electrode of a light-emitting element. The first electrode pad 241 may be connected to the 27th conductive pattern 1601 through a fifth contact hole CNT5 passing through the third organic insulating layer 507.

The display device 1, according to the embodiments described above, may be used in various electronic devices capable of providing images. In this case, the electronic devices refer to devices that use electricity and may provide a certain image.

FIGS. 13A to 13G are perspective views schematically showing embodiments of an electronic device including a display device, according to an embodiment.

Figure 13A:
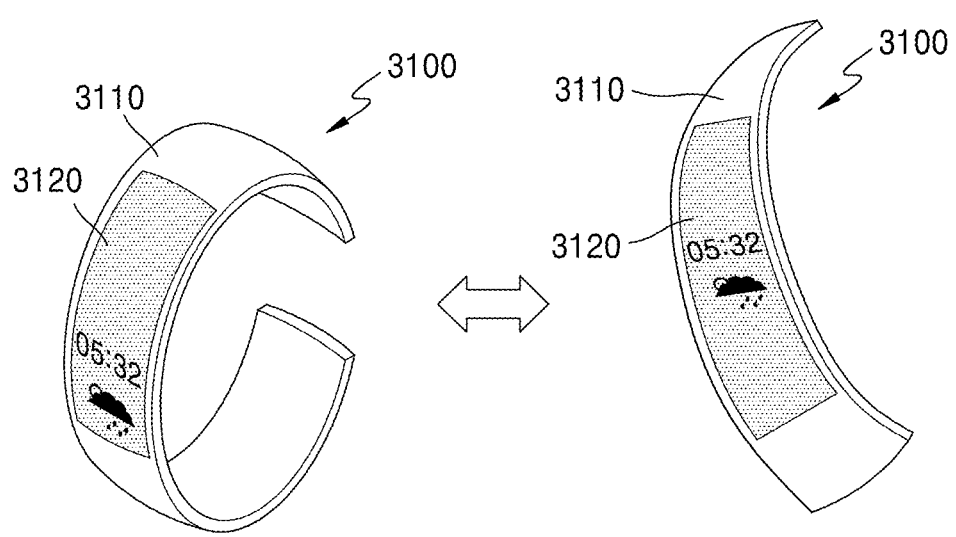
FIG. 13A is a perspective view schematically showing an electronic device including a display device, according to an embodiment.

In an embodiment and referring to FIG. 13A, the display device may be used in a wearable electronic device 3100 that may be worn on a portion of a user's body. The wearable electronic device 3100 may include a body portion 3110 and a display portion 3120 provided on the body portion 3110. The display device according to an embodiment may be used as the display portion 3120 of the wearable electronic device 3100. As shown in FIG. 13A, the wearable electronic device 3100 may be deformable. In an embodiment, the wearable electronic device 3100 may be used as a smart watch or a smartphone depending on a user's choice.

Figure 13B:
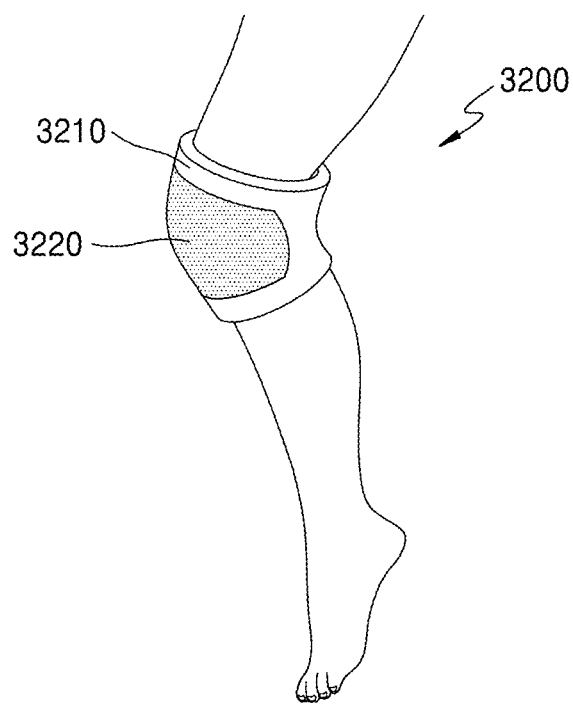
FIG. 13B is a perspective view schematically showing an electronic device including a display device, according to an embodiment.

In an embodiment, FIG. 13B shows a medical electronic device 3200. In an embodiment, the medical electronic device 3200 may include a body portion 3210 and a light-emitting portion 3220. The display device according to an embodiment may be used as the light-emitting portion 3220 of the medical electronic device 3200. The light-emitting portion 3220 may emit light (e.g., infrared light or visible light) of a certain wavelength band to a patient's body. In an embodiment, the body portion 3210 may include a stretchable fiber material and may have a structure in which the body portion 3210 may be worn on a user's body.

Figure 13C:
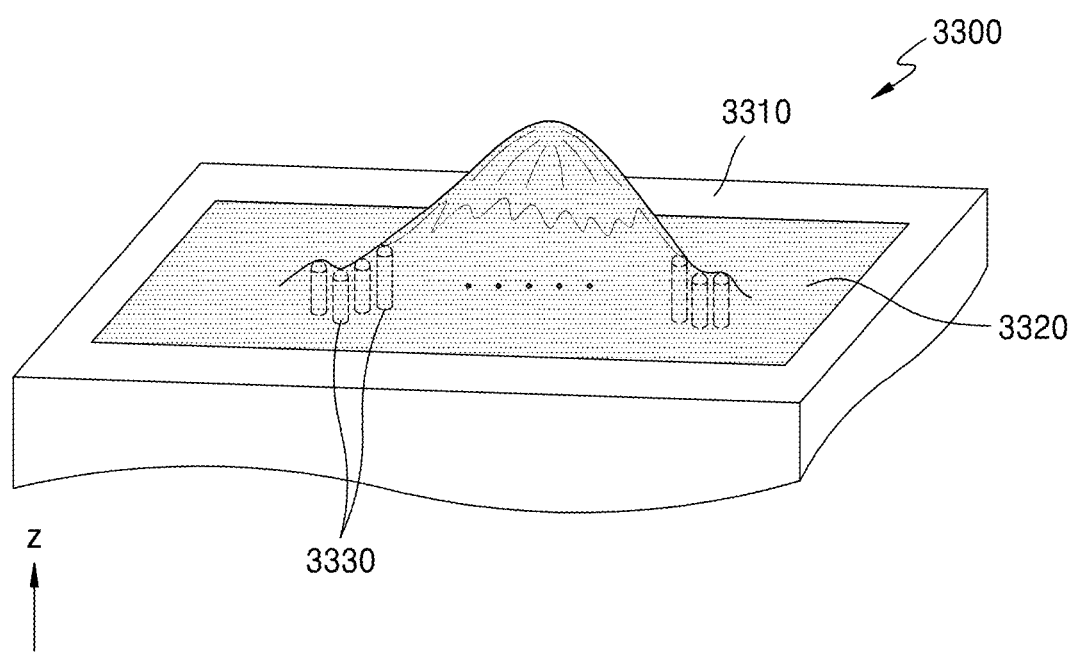
FIG. 13C is a perspective view schematically showing an electronic device including a display device, according to an embodiment.

In an embodiment, FIG. 13C shows an educational electronic device 3300. In an embodiment, the educational electronic device 3300 may include a display portion 3320 provided within a frame 3310. The display portion 3320 may use a display device according to an embodiment. The display portion 3320 may provide images, such as an ocean with waves, a snow-covered mountain, or a volcano with flowing lava, and in this case, the display portion 3320 may be stretched in a height direction (e.g., z direction) to reflect the height of waves, mountains, or volcanoes. In some embodiments, a portion of the display portion 3320 may show the movement of lava in three dimensions by sequentially changing the height in a direction in which the lava flows. The educational electronic device 3300 may include a plurality of pins (or stroke portions) 3330 disposed on the back of the display portion 3320 so that the display portion 3320 is stretched in the height direction. As the pins 3330 move in a third direction (e.g., z direction or −z direction), the image displayed on the display portion 3320 may be implemented to have a three-dimensional height. FIG. 13C illustrates the educational electronic device 3300, but its use is not limited as long as it provides certain image information.

Although the electronic device shown in FIGS. 13A to 13C is described in an embodiment as an electronic device whose shape may be variable, the invention is not limited thereto. As in embodiments to be described below, the display device, according to embodiments, may be used in an electronic device in which a part (e.g., a screen) capable of displaying an image is fixed.

Figure 13D:
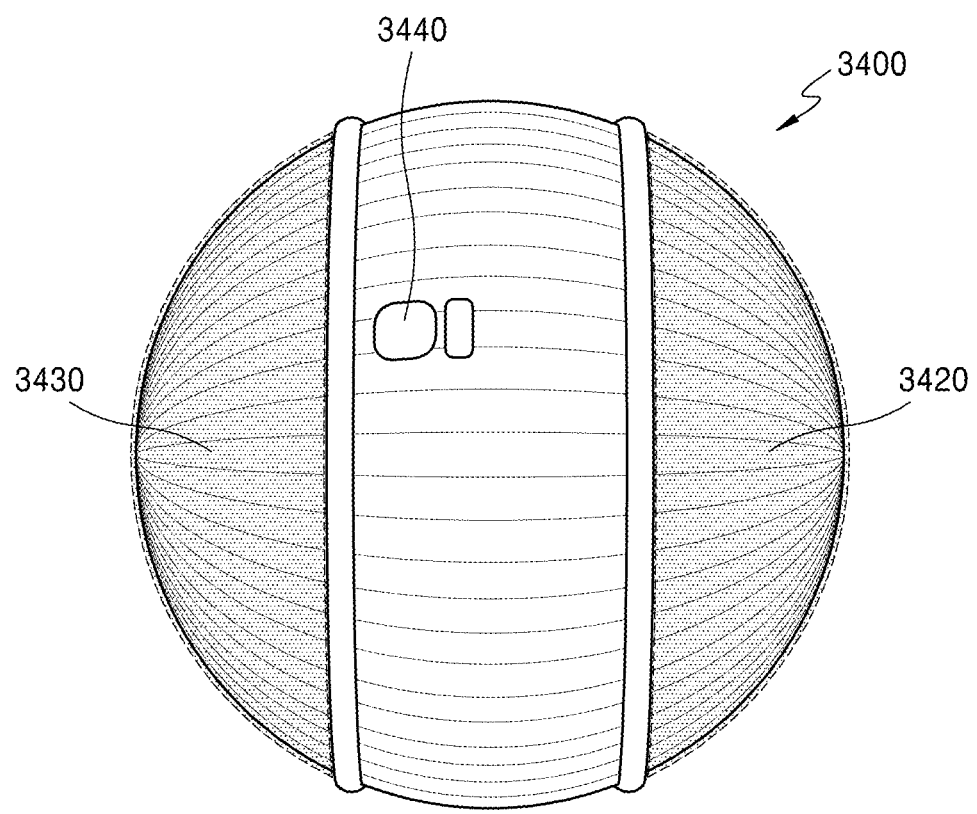
FIG. 13D is a perspective view schematically showing an electronic device including a display device, according to an embodiment.

FIG. 13D shows a robot 3400 as another electronic device, according to an embodiment. The robot 3400 may recognize movement or objects by using a camera portion 3440 and may display a certain image to a user through display portions 3420 and 3430. In some embodiments, the display device may be stretched in various directions as described above and thus may be assembled into a body frame having a hemispherical shape, and thus, the robot 3400 may include the display portions 3420 and 3430 having hemispherical shapes.

Figure 13E:
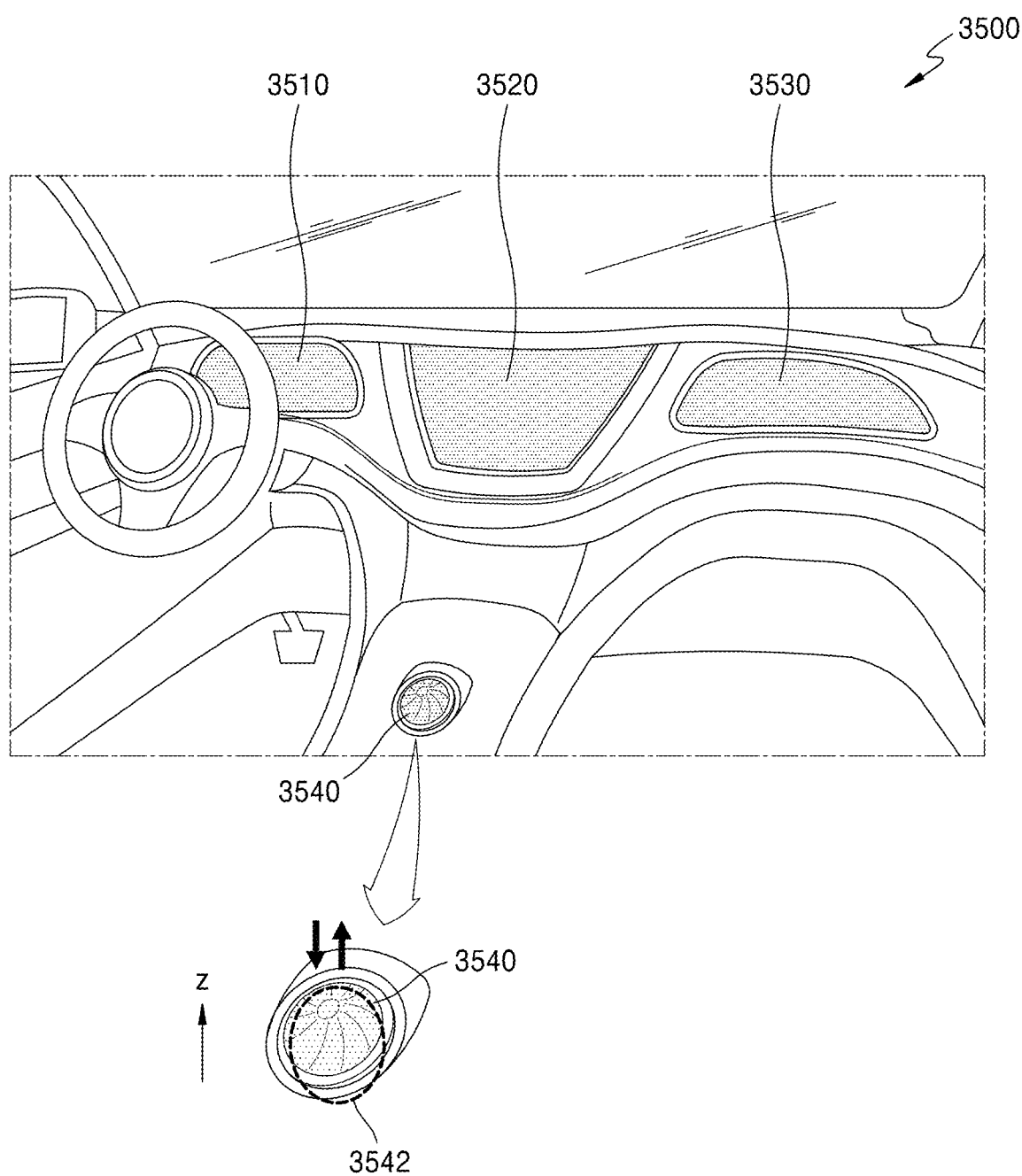
FIG. 13E is a perspective view schematically showing an electronic device including a display device, according to an embodiment.

FIG. 13E shows a vehicle display device 3500 as another electronic device, according to an embodiment. The vehicle display device 3500 may include a cluster 3510, a center information display (CID) 3520, and/or a passenger seat display. Because the display device, according to an embodiment, may be stretched in various directions, the display device may be used in the cluster 3510, the CID 3520, and/or a co-driver display (i.e., the passenger seat display) regardless of the shape of a vehicle's internal frame.

In an embodiment, although FIG. 13E shows the cluster 3510, the CID 3520, and/or the co-driver display being separated, the invention is not limited thereto. In another embodiment, two or more selected from the cluster 3510, the CID 3520, and the co-driver display may be integrally connected.

In some embodiments, the vehicle display device 3500 may include a button 3540 that may display a certain image. Referring to the enlarged view of FIG. 13E, the button 3540 having a hemispherical shape may include an object 3542 that provides the feeling of using the button 3540 while moving in a z direction or −z direction, and a display device disposed on the object 3542. In some embodiments, when the object 3542 has a three-dimensionally rounded surface, the display device may also have a three-dimensionally rounded surface.

Figure 13F:
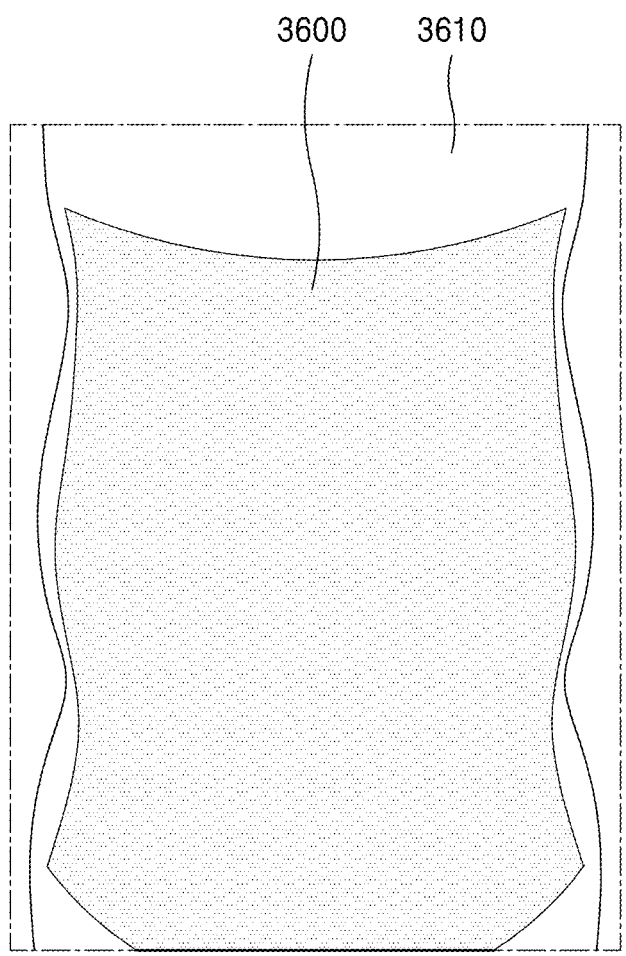
FIG. 13F is a perspective view schematically showing an electronic device including a display device, according to an embodiment.

FIG. 13F shows that the electronic device, according to an embodiment, is an electronic device 3600 for advertising or exhibition. In some embodiments, the electronic device 3600 for advertising or exhibition may be installed on a fixed structure 3610, such as a wall or pillar. When the structure 3610 includes an uneven surface as shown in FIG. 13F, the electronic device 3600 for advertising or exhibition may also be arranged along the uneven surface of the structure 3610. In some embodiments, the electronic device 3600 for advertising or exhibition may be installed on the structure 3610 by using a heat-shrink film or the like.

Figure 13G:
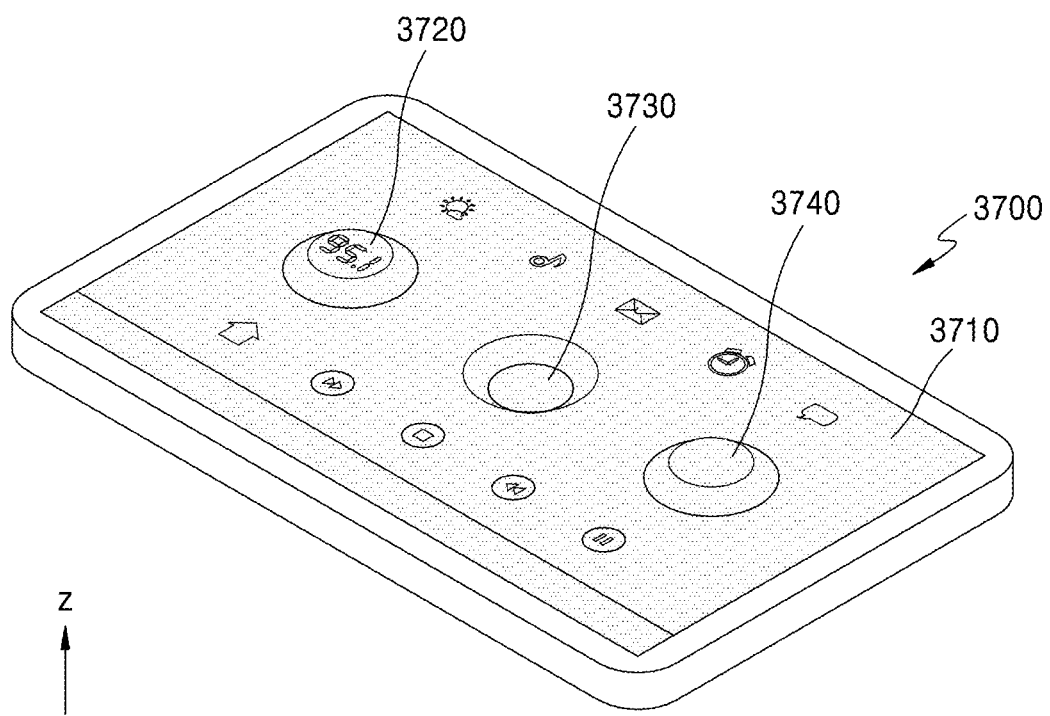
FIG. 13G is a perspective view schematically showing an electronic device including a display device, according to an embodiment.

FIG. 13G shows that the electronic device, according to an embodiment, is a controller 3700. The controller 3700 may include image-type buttons. For example, the controller 3700 may include first to third button areas 3720, 3730, and 3740 in which a portion of a display portion 3710 protrudes in a z direction or protrudes in a −z direction (or is dented in the z direction). In some embodiments, the first and third button areas 3720 and 3740 may protrude in the z direction, and the second button area 3730 may protrude in the −z direction (or be dented in the z direction).

According to an embodiment, a display device, which may prevent damage due to concentration of stress and may expand and contract in various directions, may be provided. The aforementioned effects are exemplary, and the scope of the invention is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the invention. Accordingly, the scope of the various embodiments of the invention should be interpreted to include, in addition to the embodiments disclosed herein, all alterations or modifications derived from the technical ideas of the various embodiments of the invention. Moreover, the embodiments or parts of the embodiments may be combined in whole or in part without departing from the scope of the invention.

What is claimed is:

1. A display device comprising:
  a substrate including an island portion, a first bridge portion extending from the island portion in a first direction, and a second bridge portion extending from the island portion in a second direction crossing the first direction;
  a first conductive layer disposed on the substrate and including a first voltage line extending from the island portion to the first bridge portion and the second bridge portion;
  a second conductive layer disposed on the first conductive layer and including signal lines extending from the island portion to the first bridge portion and a data line extending from the island portion to the second bridge portion; and
  a third conductive layer disposed on the second conductive layer and including a second voltage line and a third voltage line, wherein the second voltage line extends from the island portion to the first bridge portion and wherein the third voltage line extends from the island portion to the second bridge portion.

2. The display device of claim 1, wherein the first voltage line includes a 1st-1 voltage line extending from the island portion to the first bridge portion and a 1st-2 voltage line extending from the island portion to the second bridge portion, wherein the first conductive layer further includes an initialization voltage line extending from the island portion to the first bridge portion.

3. The display device of claim 2, further comprising:
a semiconductor layer disposed on the substrate;
a fourth conductive layer disposed on the semiconductor layer; and
a fifth conductive layer disposed between the fourth conductive layer and the first conductive layer and including a connection electrode,
wherein the connection electrode overlaps the 1st-2 voltage line in a plan view, and wherein the initialization voltage line is electrically connected to the connection electrode.

4. The display device of claim 3, wherein the first conductive layer further includes a first scan line extending from the island portion to the first bridge portion, and
wherein the fourth conductive layer includes a first gate line electrically connected to the first scan line.

5. The display device of claim 2, wherein the 1st-1 voltage line has a first width directed in a direction perpendicular to an extension direction of the 1st-1 voltage line, and the 1st-2 voltage line has a second width, which is greater than the first width, in a direction perpendicular to an extension direction of the 1st-2 voltage line.

6. The display device of claim 1, wherein the signal lines include a second scan line, a third scan line, and an emission control line, which are arranged to be disposed apart from each other on the first bridge portion.

7. The display device of claim 6, further comprising:
a semiconductor layer disposed on the substrate; and
a fourth conductive layer disposed between the semiconductor layer and the first conductive layer and including a second gate line, a third gate line, and a fourth gate line,
wherein the second scan line is electrically connected to the second gate line, the third scan line is electrically connected to the third gate line, and the emission control line is electrically connected to the fourth gate line.

8. The display device of claim 1, wherein the island portion has a first boundary and a second boundary, which extend in the second direction, and a third boundary and a fourth boundary, which extend in the first direction and which connect the first boundary to the second boundary,
wherein the data line extends from the third boundary to the fourth boundary.

9. The display device of claim 1, wherein the second voltage line includes a 2nd-1 voltage line extending from the island portion to the first bridge portion and a 2nd-2 voltage line extending from the island portion to the second bridge portion, and wherein the third voltage line includes a 3rd-1 voltage line extending from the island portion to the first bridge portion and a 3rd-2 voltage line extending from the island portion to the second bridge portion.

10. The display device of claim 9, wherein the 3rd-1 voltage line and the 3rd-2 voltage line are connected to each other on the island portion.

11. The display device of claim 9, wherein the 2nd-1 voltage line and the 2nd-2 voltage line each have a third width directed in a direction perpendicular to a respective extension directions thereof, and wherein the 3rd-1 voltage line and the 3rd-2 voltage line each have a fourth width, which is less than the third width, directed in a direction perpendicular to a respective extension directions thereof.

12. The display device of claim 1, further comprising a sixth conductive layer disposed on the third conductive layer and including a first electrode pad electrically connected to a first electrode of a light-emitting element and a second electrode pad electrically connected to a second electrode of the light-emitting element,
wherein the third voltage line is electrically connected to the second electrode pad.

13. The display device of claim 1, wherein the first bridge portion and the second bridge portion each have two curved portions and a straight portion connecting the curved portions to each other, and
wherein each of the curved portions has an inner boundary and an outer boundary, which have different radii, and wherein a first distance between the inner boundary and a wiring line disposed closest to the inner boundary is greater than a second distance between the outer boundary and a wiring line disposed closest to the outer boundary.

14. The display device of claim 1, further comprising a pixel driving circuit disposed on the island portion and a light-emitting element electrically connected to the pixel driving circuit,
wherein the pixel driving circuit includes:
a driving transistor having a gate, and a first terminal and a second terminal electrically connected to a first node;
a data write transistor electrically connected to the first node and the data line;
a first compensation transistor electrically connected to the gate of the driving transistor and the second terminal of the driving transistor;
a first emission control transistor electrically connected to the first node and a second node;
a second emission control transistor electrically connected to a first electrode of the light-emitting element and the second terminal of the driving transistor;
a first initialization transistor electrically connected to a first initialization voltage line and the gate of the driving transistor;
a second initialization transistor electrically connected to a second initialization voltage line and the first electrode of the light-emitting element;
a third emission control transistor electrically connected to the second node and the second voltage line;
a second compensation transistor electrically connected to the second node and the first voltage line;
a storage capacitor electrically connected to the second node and the gate of the driving transistor; and
an auxiliary capacitor electrically connected to the first voltage line and the first electrode of the light-emitting element.

15. The display device of claim 14, wherein a second electrode of the light-emitting element is electrically connected to the third voltage line.

16. A display device comprising:
a substrate including an island portion, a first bridge portion extending from the island portion in a first direction, and a second bridge portion extending from the island portion in a second direction crossing the first direction;
a first conductive layer disposed on the substrate and including first wiring lines extending from the island portion to the first bridge portion and the second bridge portion;
a second conductive layer disposed on the first conductive layer and including second wiring lines extending from the island portion to the first bridge portion and the second bridge portion; and a first insulating layer disposed between the first conductive layer and the second conductive layer,
wherein the first insulating layer has a first thickness at the first bridge portion and the second bridge portion and has a second thickness, which is smaller than the first thickness, at the island portion.

17. The display device of claim 16, wherein the first wiring lines include a first voltage line extending from the island portion to the first bridge portion and a second voltage line extending from the island portion to the second bridge portion, and wherein the second wiring lines include a data line extending from the island portion to the second bridge portion,
wherein a distance in a thickness direction between the first voltage line and the data line in the second bridge portion is greater than a distance in the thickness direction between the first voltage line and the data line in the island portion.

18. The display device of claim 16, wherein the first insulating layer includes an organic insulating material.

19. The display device of claim 16, further comprising an organic layer disposed between the first insulating layer and the substrate,
wherein the organic layer does not overlap the island portion.

20. The display device of claim 16, further comprising:
a third conductive layer disposed on the second conductive layer and including third wiring lines extending from the island portion to the first bridge portion and the second bridge portion; and
a second insulating layer disposed between the second conductive layer and the third conductive layer,
wherein the second insulating layer has a third thickness at the first bridge portion and the second bridge portion and has a fourth thickness, which is smaller than the third thickness, at the island portion.

21. The display device of claim 20, wherein the second wiring lines include a data line extending from the island portion to the second bridge portion, and the third wiring lines include a third voltage line extending from the island portion to the second bridge portion,
wherein a distance in a thickness direction between the third voltage line and the data line in the second bridge portion is greater than a distance in the thickness direction between the third voltage line and the data line in the island portion.

22. The display device of claim 20, wherein the second insulating layer includes an organic insulating material.

* * * * *